US007459352B2

(12) United States Patent  
Yamazaki et al.

(10) Patent No.: US 7,459,352 B2
(45) Date of Patent: Dec. 2, 2008

(54) SEMICONDUCTOR DEVICE, AND MANUFACTURING METHOD THEREOF

(75) Inventors: Shunpei Yamazaki, Tokyo (JP); Jun Koyama, Kanagawa (JP); Hideaki Kuwabara, Kanagawa (JP); Saishi Fujikawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 59 days.

(21) Appl. No.: 11/181,923

(22) Filed: Jul. 15, 2005

(65) Prior Publication Data

US 2005/0263771 A1 Dec. 1, 2005

Related U.S. Application Data

(62) Division of application No. 10/011,813, filed on Dec. 11, 2001, now Pat. No. 6,953,951.

(30) Foreign Application Priority Data

| Dec. 11, 2000 | (JP) | ............................ 2000-376722 |
| Dec. 21, 2000 | (JP) | ............................ 2000-389093 |
| Dec. 28, 2000 | (JP) | ............................ 2000-400280 |

(51) Int. Cl.
*H01L 21/84* (2006.01)

(52) U.S. Cl. .................. 438/149; 438/48; 438/128; 438/151; 257/291; 257/292; 257/E21.104; 257/E21.121; 257/E21.372

(58) Field of Classification Search ................. 438/149, 438/48, 128, 151, 291, 292; 257/291, 292, 257/E21.104, E21.121, E21.372

See application file for complete search history.

(56) References Cited

U.S. PATENT DOCUMENTS

| 4,033,833 A | 7/1977 | Bestel et al. |
| 5,157,470 A | 10/1992 | Matsuzaki et al. |

(Continued)

FOREIGN PATENT DOCUMENTS

EP 0 372 356 6/1990

(Continued)

OTHER PUBLICATIONS

Austrian Patent Office Search Report and Written Opinion for Singapore Patent Application No. 200107527-4, Oct. 25, 2003, 7 pages.

(Continued)

*Primary Examiner*—W. David Coleman
*Assistant Examiner*—Su C Kim
(74) *Attorney, Agent, or Firm*—Fish & Richardson P.C.

(57) ABSTRACT

In a display device such as a liquid crystal display device, a large-sized display screen is realized under low power consumption. A surface of a source wiring line of a pixel portion employed in an active matrix type liquid crystal display device is processed by way of a plating process operation so as to lower a resistance value of this source wiring line. The source wiring line of the pixel portion is manufactured at a step different from a step for manufacturing a source wiring line of a drive circuit portion. Further, electrodes of a terminal portion are processed by a plating process operation so as to reduce a resistance value thereof.

26 Claims, 36 Drawing Sheets

U.S. PATENT DOCUMENTS

| | | | |
|---|---|---|---|
| 5,218,221 | A | 6/1993 | Okumura |
| 5,342,806 | A | 8/1994 | Asahina |
| 5,498,573 | A | 3/1996 | Whetten |
| 5,536,950 | A | 7/1996 | Liu et al. |
| 5,539,551 | A | 7/1996 | Nomoto et al. |
| 5,576,858 | A | 11/1996 | Ukai et al. |
| 5,643,826 | A | 7/1997 | Ohtani et al. |
| 5,650,636 | A | 7/1997 | Takemura et al. |
| 5,681,402 | A | 10/1997 | Ichinose et al. |
| 5,712,495 | A | 1/1998 | Suzawa |
| 5,726,461 | A | 3/1998 | Shimada et al. |
| 5,756,147 | A | 5/1998 | Wu et al. |
| 5,777,701 | A | 7/1998 | Zhang |
| 5,815,226 | A | 9/1998 | Yamazaki et al. |
| 5,851,918 | A | 12/1998 | Song et al. |
| 5,856,689 | A | 1/1999 | Suzawa |
| 5,861,324 | A | 1/1999 | Ichinose et al. |
| 5,889,291 | A | 3/1999 | Koyama et al. |
| 5,892,562 | A | 4/1999 | Yamazaki et al. |
| 5,923,962 | A | 7/1999 | Ohtani et al. |
| 5,929,948 | A | 7/1999 | Ohori et al. |
| 5,952,675 | A | 9/1999 | Katoh |
| 5,977,562 | A | 11/1999 | Hirakata et al. |
| 5,990,998 | A | 11/1999 | Park et al. |
| 5,990,999 | A | 11/1999 | Yeo |
| 5,995,177 | A | 11/1999 | Fujikawa et al. |
| 5,998,841 | A | 12/1999 | Suzawa |
| 6,015,724 | A | 1/2000 | Yamazaki |
| 6,023,075 | A | 2/2000 | Yamazaki |
| 6,031,290 | A | 2/2000 | Miyazaki et al. |
| 6,069,370 | A | 5/2000 | Hayama et al. |
| 6,104,461 | A | 8/2000 | Zhang et al. |
| 6,114,715 | A | 9/2000 | Hamada |
| 6,118,506 | A | 9/2000 | Yamazaki et al. |
| 6,137,218 | A | 10/2000 | Kaneko et al. |
| 6,140,158 | A | 10/2000 | Rhee et al. |
| 6,175,395 | B1 | 1/2001 | Yamazaki et al. |
| 6,208,395 | B1 | 3/2001 | Kanoh et al. |
| 6,228,684 | B1 | 5/2001 | Maruyama |
| 6,248,634 | B1 | 6/2001 | Hayama et al. |
| 6,274,887 | B1 | 8/2001 | Yamazaki et al. |
| 6,277,679 | B1 | 8/2001 | Ohtani |
| 6,278,131 | B1 | 8/2001 | Yamazaki et al. |
| 6,281,552 | B1 | 8/2001 | Kawasaki et al. |
| 6,303,963 | B1 | 10/2001 | Ohtani et al. |
| 6,306,694 | B1 | 10/2001 | Yamazaki et al. |
| 6,319,741 | B1 | 11/2001 | Izumi et al. |
| 6,323,515 | B1 | 11/2001 | Yamazaki et al. |
| 6,339,243 | B1 | 1/2002 | Kwon et al. |
| 6,359,320 | B1 | 3/2002 | Yamazaki et al. |
| 6,362,493 | B1 | 3/2002 | Hayama et al. |
| 6,384,818 | B1 | 5/2002 | Yamazaki et al. |
| 6,388,726 | B1 | 5/2002 | Kim et al. |
| 6,392,255 | B1 | 5/2002 | Shibata et al. |
| 6,399,988 | B1 | 6/2002 | Yamazaki |
| 6,407,780 | B1 | 6/2002 | Sung |
| 6,413,845 | B1 | 7/2002 | Izumi et al. |
| 6,420,988 | B1 | 7/2002 | Azami et al. |
| 6,429,601 | B1 | 8/2002 | Friend et al. |
| 6,461,899 | B1 | 10/2002 | Kitakado et al. |
| 6,469,317 | B1 | 10/2002 | Yamazaki et al. |
| 6,472,594 | B1 | 10/2002 | Ichinose et al. |
| 6,489,222 | B2 | 12/2002 | Yoshimoto |
| 6,493,048 | B1 | 12/2002 | Baek et al. |
| 6,500,701 | B2 | 12/2002 | Higashi et al. |
| 6,501,098 | B2 | 12/2002 | Yamazaki |
| 6,509,616 | B2 * | 1/2003 | Yamazaki .................. 257/390 |
| 6,518,962 | B2 | 2/2003 | Kimura et al. |
| 6,524,877 | B1 | 2/2003 | Nakazawa et al. |
| 6,555,420 | B1 | 4/2003 | Yamazaki |
| 6,606,045 | B2 | 8/2003 | Azami et al. |
| 6,614,076 | B2 | 9/2003 | Kawasaki et al. |
| 6,650,379 | B2 | 11/2003 | Baek et al. |
| 6,737,304 | B2 | 5/2004 | Yamazaki et al. |
| 6,737,306 | B2 * | 5/2004 | Yamazaki et al. .......... 438/155 |
| 6,750,835 | B2 | 6/2004 | Azami |
| 6,762,431 | B2 | 7/2004 | Maruyama |
| 6,762,802 | B2 | 7/2004 | Ono et al. |
| 6,768,521 | B2 | 7/2004 | Baek et al. |
| 6,784,037 | B2 | 8/2004 | Yamazaki et al. |
| 6,809,382 | B2 | 10/2004 | Kawasaki et al. |
| 6,853,004 | B2 | 2/2005 | Ohtani |
| 6,933,533 | B2 | 8/2005 | Yamazaki et al. |
| 6,952,020 | B1 | 10/2005 | Yamazaki et al. |
| 6,977,394 | B2 | 12/2005 | Yamazaki et al. |
| 7,023,021 | B2 | 4/2006 | Yamazaki et al. |
| 7,064,020 | B2 | 6/2006 | Yamazaki |
| 7,071,487 | B2 | 7/2006 | Maruyama |
| 7,123,227 | B2 | 10/2006 | Azami |
| 7,132,687 | B2 | 11/2006 | Kawasaki et al. |
| 7,139,045 | B2 | 11/2006 | Baek et al. |
| 7,253,441 | B2 | 8/2007 | Ohtani |
| 2001/0009283 | A1 | 7/2001 | Arao et al. |
| 2001/0010370 | A1 | 8/2001 | Kimura et al. |
| 2001/0019374 | A1 | 9/2001 | Izumi et al. |
| 2001/0025959 | A1 | 10/2001 | Yamazaki et al. |
| 2001/0030322 | A1 * | 10/2001 | Yamazaki et al. ............. 257/59 |
| 2001/0040648 | A1 | 11/2001 | Ono et al. |
| 2002/0008797 | A1 | 1/2002 | Yamazaki et al. |
| 2002/0044230 | A1 | 4/2002 | Yamazaki et al. |
| 2002/0070382 | A1 | 6/2002 | Yamazaki et al. |
| 2002/0079503 | A1 | 6/2002 | Yamazaki et al. |
| 2002/0110941 | A1 | 8/2002 | Yamazaki et al. |
| 2002/0127833 | A1 | 9/2002 | Izumi et al. |
| 2002/0158288 | A1 | 10/2002 | Yamazaki et al. |
| 2002/0163457 | A1 | 11/2002 | Azami et al. |
| 2002/0180721 | A1 | 12/2002 | Kimura et al. |
| 2003/0038037 | A1 | 2/2003 | Colgan et al. |
| 2003/0038901 | A1 | 2/2003 | Baek et al. |
| 2003/0053006 | A1 | 3/2003 | Baek et al. |
| 2003/0063081 | A1 | 4/2003 | Kimura et al. |
| 2003/0132436 | A1 | 7/2003 | Yamazaki |
| 2004/0197971 | A1 | 10/2004 | Yamazaki et al. |
| 2004/0217357 | A1 | 11/2004 | Zhang et al. |
| 2004/0232421 | A1 | 11/2004 | Ono et al. |
| 2004/0241895 | A1 | 12/2004 | Baek et al. |
| 2005/0007507 | A1 | 1/2005 | Ono et al. |
| 2005/0040403 | A1 | 2/2005 | Suzawa et al. |
| 2005/0200301 | A1 | 9/2005 | Yamazaki et al. |
| 2006/0081846 | A1 | 4/2006 | Yamazaki et al. |
| 2006/0202201 | A1 | 9/2006 | Maruyama |
| 2006/0208258 | A1 | 9/2006 | Yamazaki |

FOREIGN PATENT DOCUMENTS

| | | |
|---|---|---|
| EP | 0 710 990 | 5/1996 |
| EP | 0 810 669 | 12/1997 |
| EP | 0 923 067 | 6/1999 |
| EP | 0 984 492 | 3/2000 |
| EP | 0 989 614 | 3/2000 |
| EP | 1 001 467 | 5/2000 |
| EP | 1 005 094 | 5/2000 |
| EP | 1 006 664 | 6/2000 |
| EP | 1 017 094 | 7/2000 |
| EP | 1 020 920 | 7/2000 |
| EP | 1 028 469 | 8/2000 |
| EP | 1 058 310 | 12/2000 |
| EP | 1 058 484 | 12/2000 |
| EP | 1 394 862 | 3/2004 |
| GB | 2 312 092 | 10/1997 |
| JP | 1-289919 | 11/1989 |
| JP | 02-008821 | 1/1990 |
| JP | 2-223924 | 9/1990 |
| JP | 03-212619 | 9/1991 |

| | | |
|---|---|---|
| JP | 4-232923 | 8/1992 |
| JP | 06-148685 | 5/1994 |
| JP | 6-202148 | 7/1994 |
| JP | 07-110495 | 4/1995 |
| JP | 07-130652 | 5/1995 |
| JP | 07-140475 | 6/1995 |
| JP | 07-297405 | 11/1995 |
| JP | 7-297408 | 11/1995 |
| JP | 2513739 | 7/1996 |
| JP | 08-274336 | 10/1996 |
| JP | 08-330602 | 12/1996 |
| JP | 09-026602 | 1/1997 |
| JP | 09-045930 | 2/1997 |
| JP | 09-106887 | 4/1997 |
| JP | 10-048640 | 2/1998 |
| JP | 10-090711 | 4/1998 |
| JP | 10-104595 | 4/1998 |
| JP | 10-189252 | 7/1998 |
| JP | 10-270363 | 10/1998 |
| JP | 11-024095 | 1/1999 |
| JP | 11-097698 | 4/1999 |
| JP | 11-097701 | 4/1999 |
| JP | 2000-131719 | 5/2000 |
| JP | 2000-131720 | 5/2000 |
| JP | 2000-223715 | 8/2000 |
| JP | 2000-223716 | 8/2000 |
| JP | 2000-314900 | 11/2000 |
| JP | 2000-321594 | 11/2000 |
| JP | 2000-323715 | 11/2000 |
| JP | 2000-332256 | 11/2000 |
| JP | 2000-340801 | 12/2000 |
| JP | 2000-353810 | 12/2000 |
| JP | 2001-094238 | 4/2001 |
| JP | 2001-313397 | 11/2001 |
| JP | 2002009296 | 1/2002 |
| JP | 2002-198537 | 7/2002 |
| JP | 2002222954 | 8/2002 |
| KR | 146253 | 9/1998 |
| KR | 2000-0022732 | 4/2000 |
| WO | WO 99/42983 | 8/1999 |

OTHER PUBLICATIONS

Singapore International Search Report (Application No. 200107482-2), Jul. 6, 2004, 10 pages.

Stanley Wolf; "Contact-Hole and Via Filling with Selective Electroless Metal Deposition"; *Silicon Processing for the VLSI Era—vol. II*; pp. 256-257; 1990.

Yamazaki et al., Office Action for U.S. Appl. No. 10/022,262, Mar. 12, 2004, 11 pages.

Austrian Patent Office Search Report and Written Opinion for Singapore Patent Application No. 200107527-4, Oct. 25, 2003, 7 pages.

Singapore International Search Report (Application No. 200107482-2), Jul. 6, 2004, 10 pages.

Stanley Wolf; "Contact-Hole and Via Filling with Selective Electroless Metal Deposition"; *Silicon Processing for the VLSI Era—vol. II*; pp. 256-257; 1990.

Yamazaki et al., Office Action for U.S. Appl. No. 10/022,262, Mar. 12, 2004, 11 pages.

Australian Search Report and Written Opinion (Application No. 200400836-3) dated Oct. 12, 2006, 10 pages.

Australian Search Report and Written Opinion (Application No. 200400945-2) dated Oct. 12, 2006, 8 pages.

Australian Search Report and Written Opinion (Application No. 200400807-4), dated Jan. 2, 2007, 7 pages.

Baldo et al.; "Highly efficient phosphorescent emission from organic electroluminescent devices"; *Nature*, vol. 395; pp. 151-154; Sep. 10, 1998.

Baldo et al.; "Very high-efficiency green organic light-emitting devices based on electrophosphorescence"; *Applied Physics Letters*, vol. 75, No. 1; pp. 4-6; Jul. 5, 1999.

Tsutsui et al., "Electroluminescence in Organic Thin Films", *Photochemical Process In Organized Molecular Systems*, 1991.1., pp. 437-450.

Tsutsui et al.; "High Quantum Efficiency in Organic Light-Emitting Devices with Iridium-Complex as a Triplet Emissive Center"; *Japan Journal of Applied Physics*; vol. 38, Part 12B; pp. L1502-L1504; Dec. 15, 1999.

Tsutsui et al.; "High Quantum Efficiency in Organic Light-Emitting Devices with Iridium-Complex as a Triplet Emissive Center"; *Japan Journal of Applied Physics*; vol. 38, Part 2, No. 12B; pp. L1502-L1504; Dec. 15, 1999.

Search Report for Singapore Application No. 200502824-6, dated Oct. 26, 2007, 8 pages.

Office Action for Korean Application No. 10-2001-0078043, dated Nov. 20, 2007, with full English translation, 11 pages.

Official Action issued in KR 2001-0078043 dated May 23, 2008, with English translation.

* cited by examiner

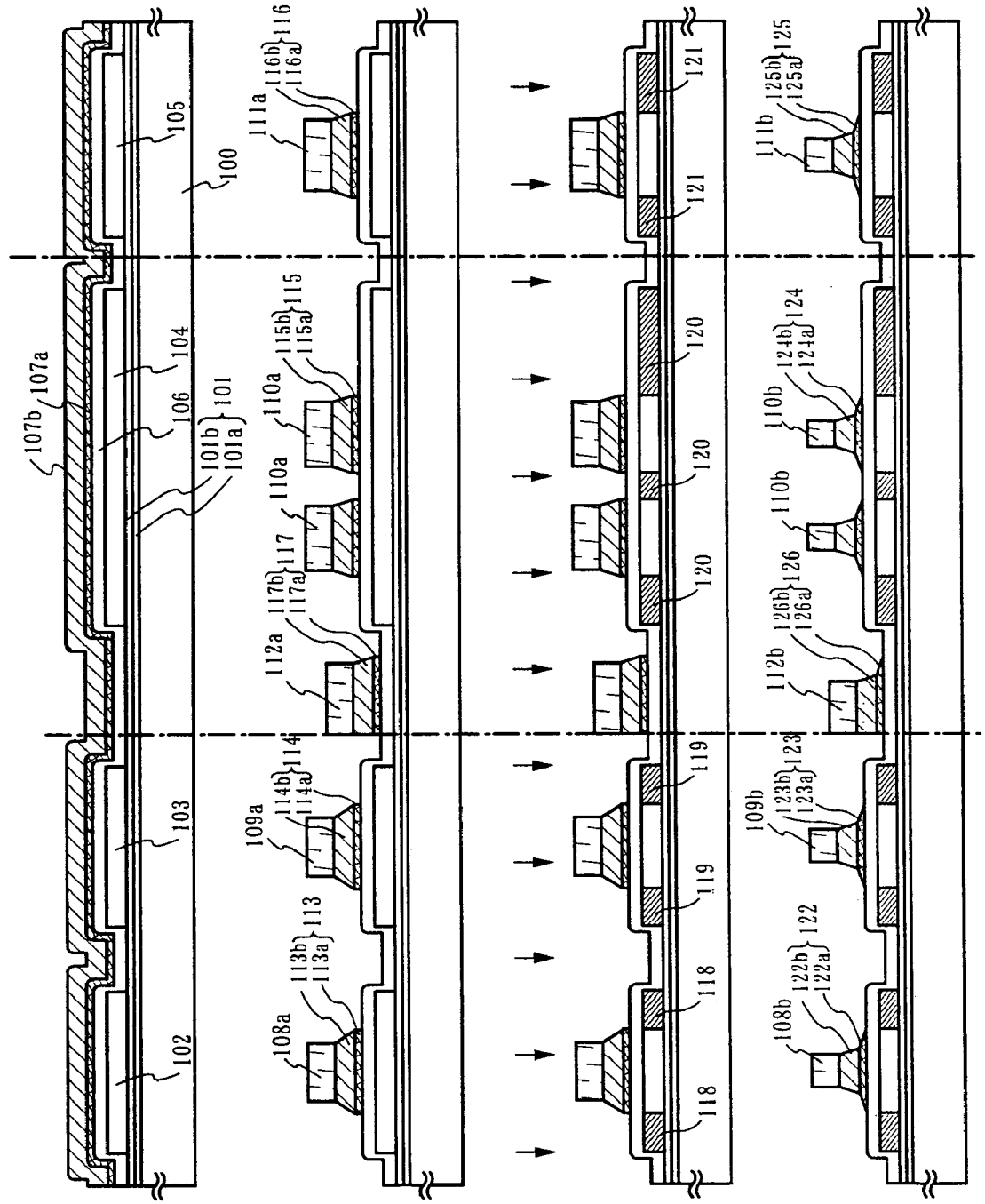

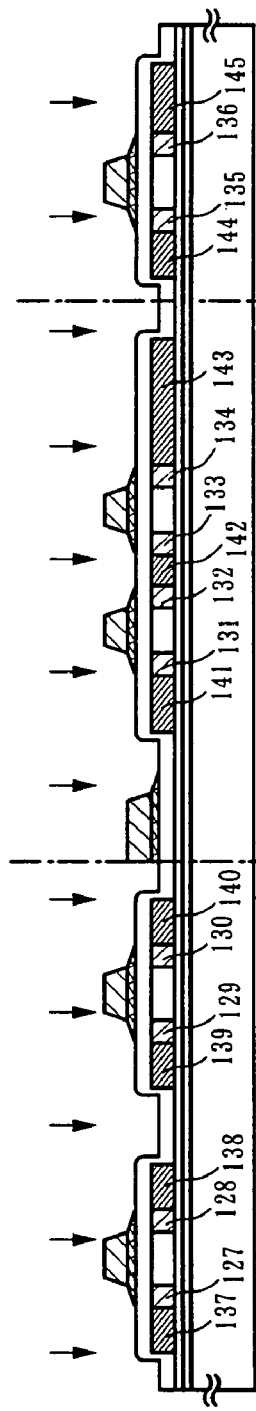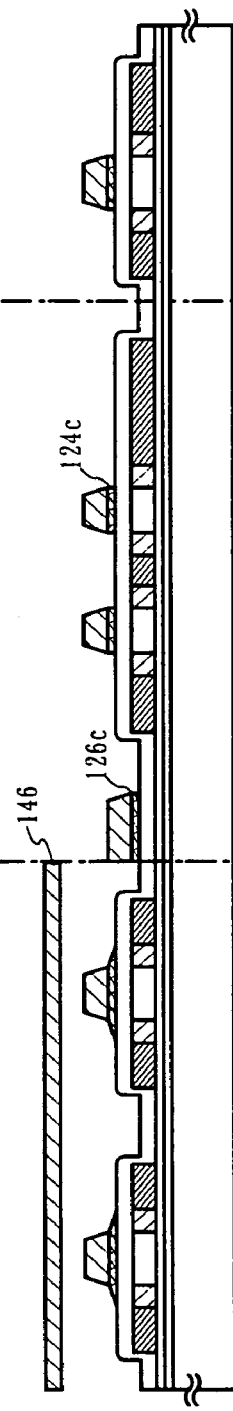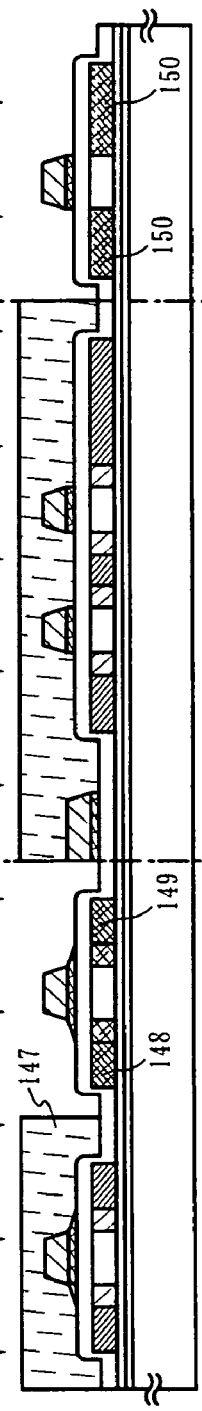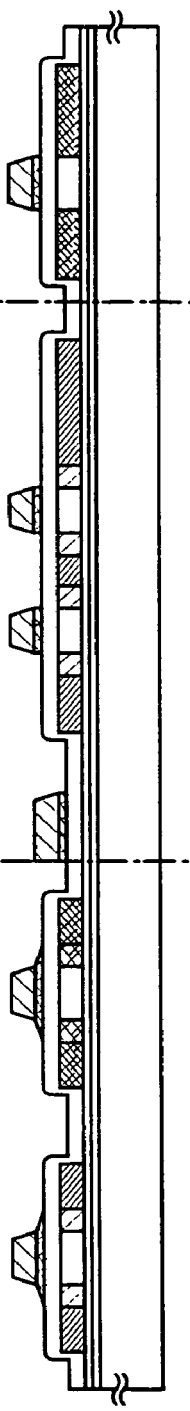
FIG. 2A
FIG. 2B
FIG. 2C
FIG. 2D

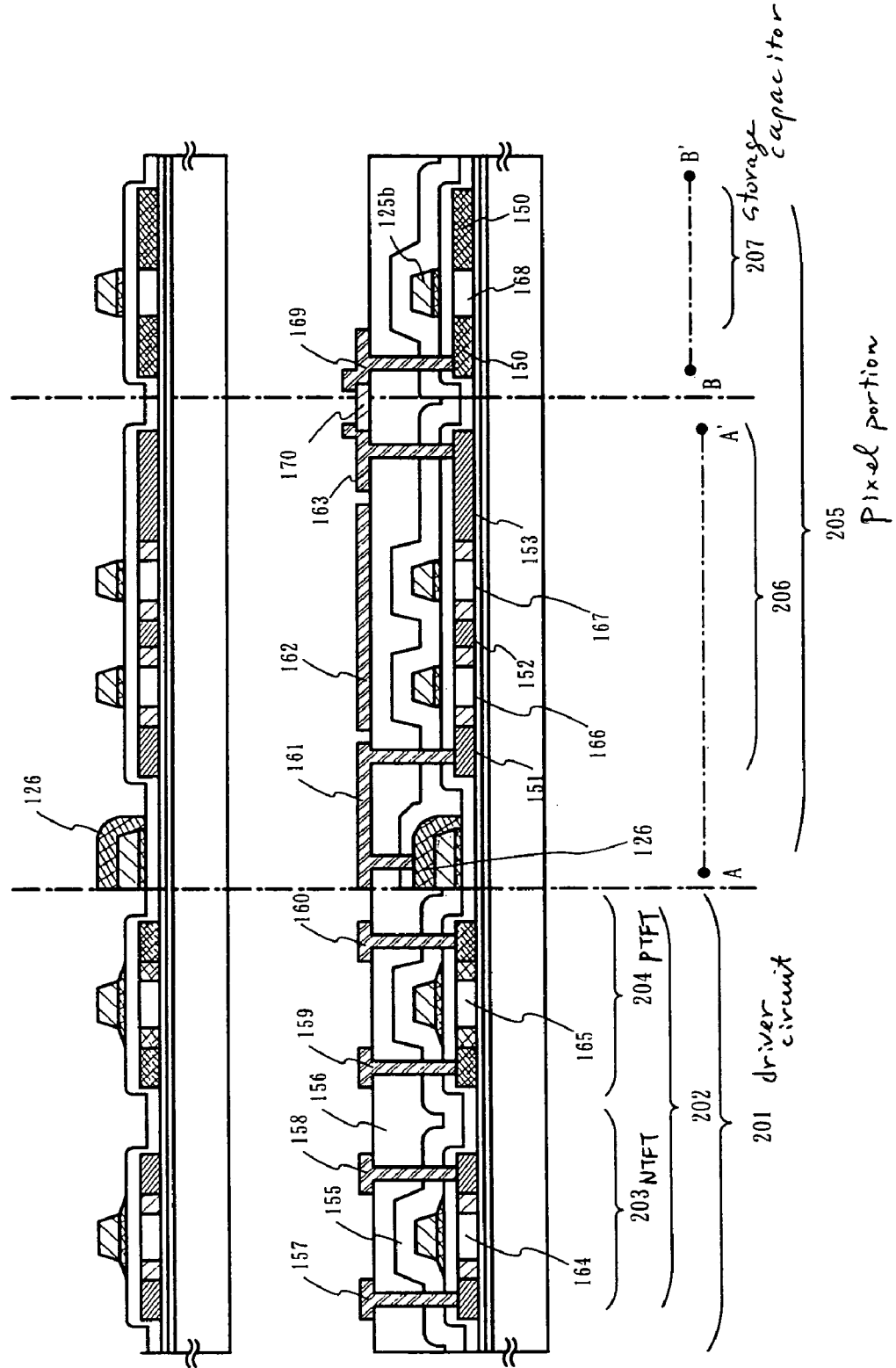

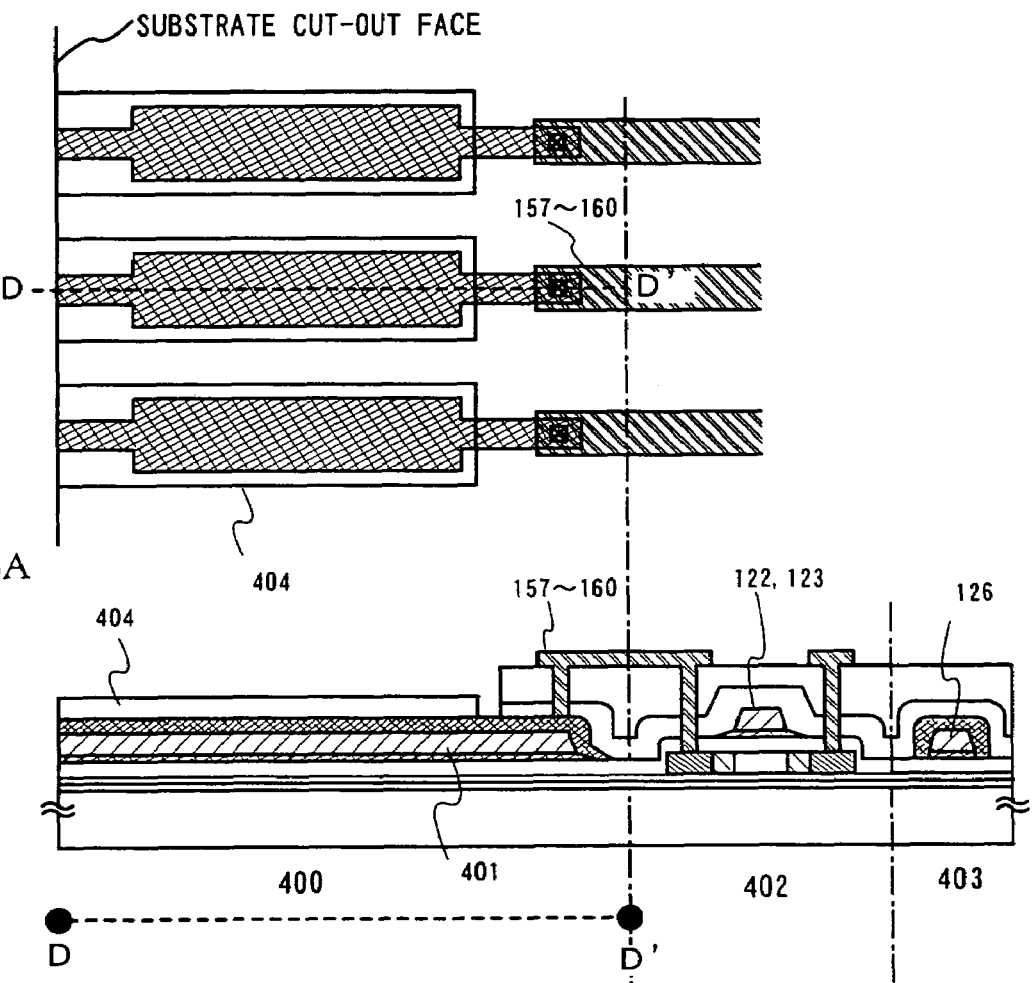
FIG. 8A
FIG. 8B
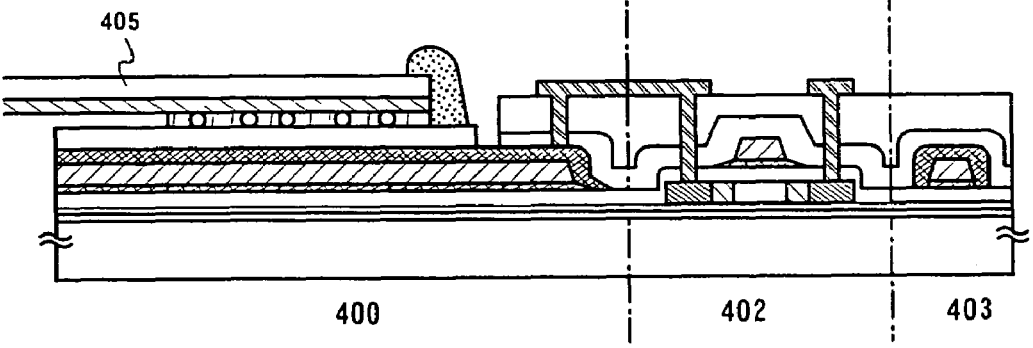
FIG. 8C

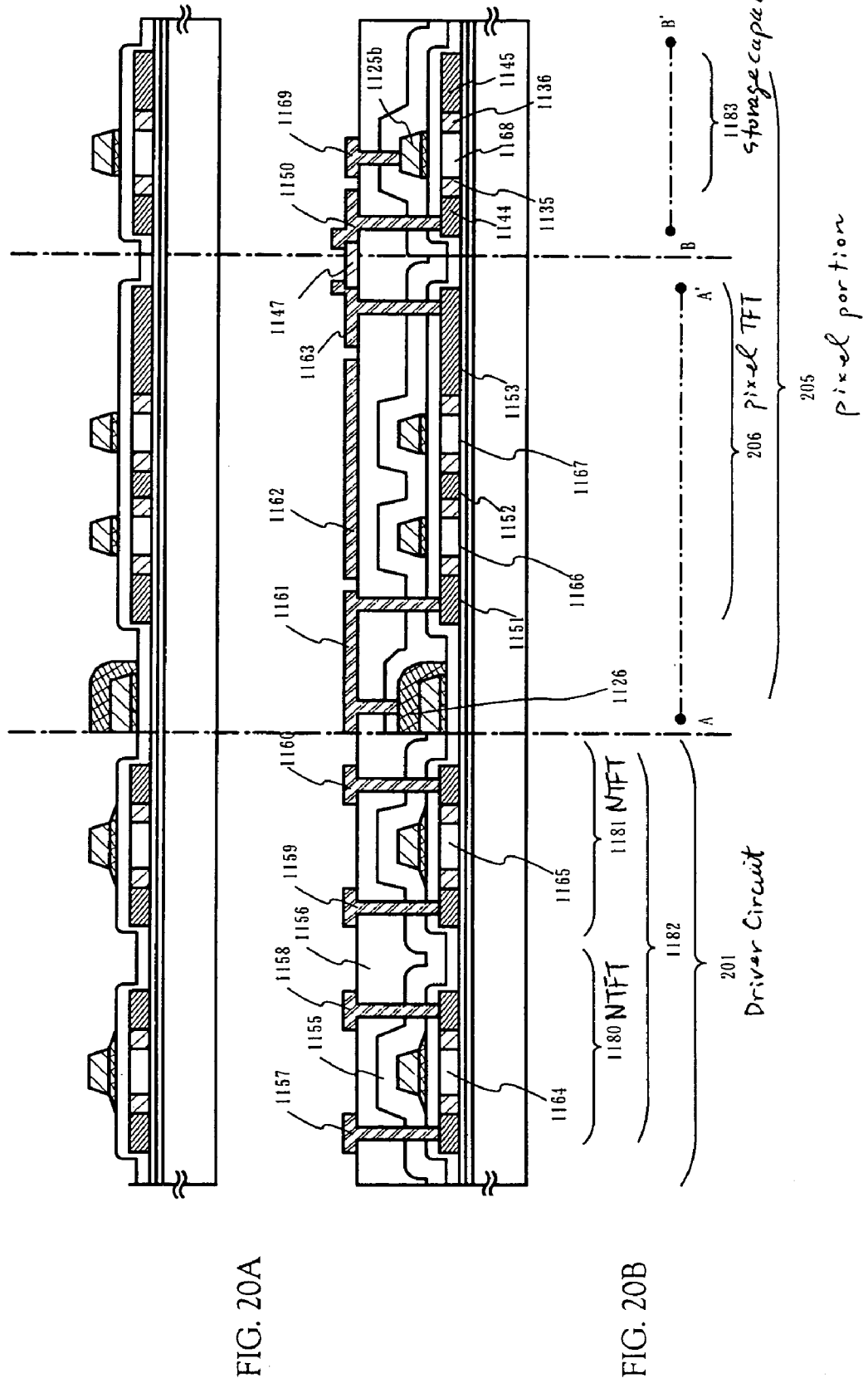

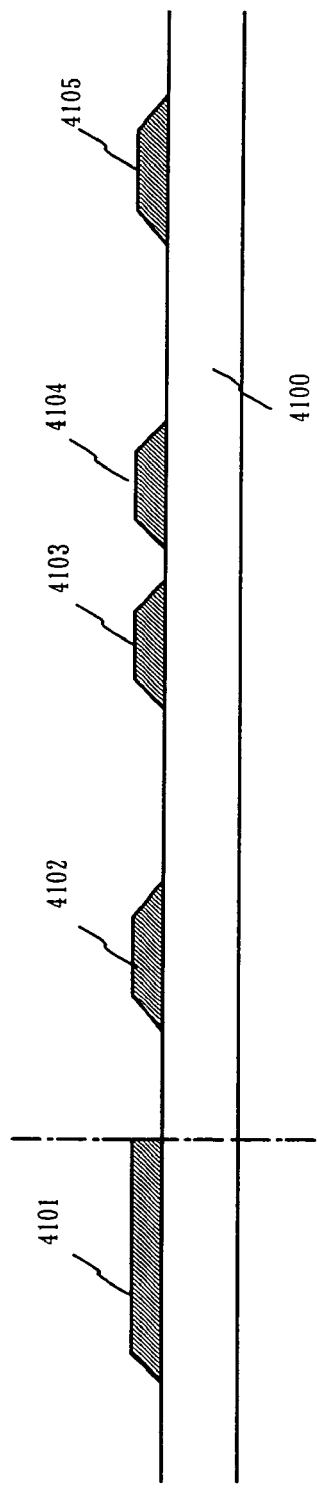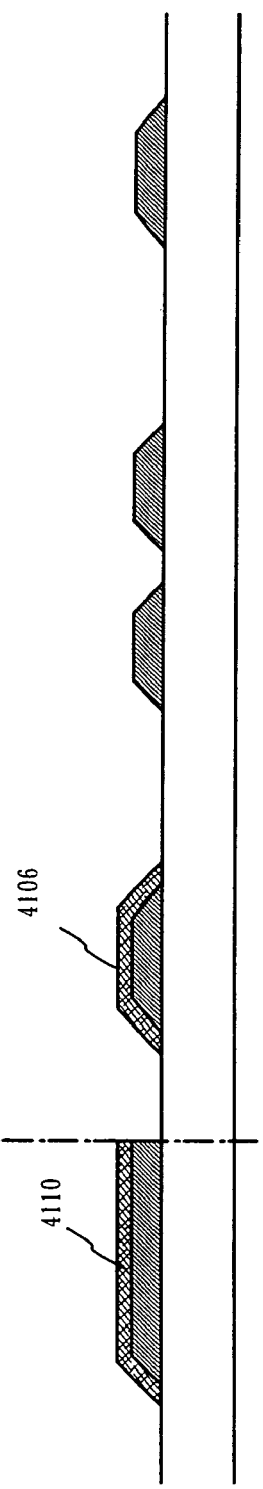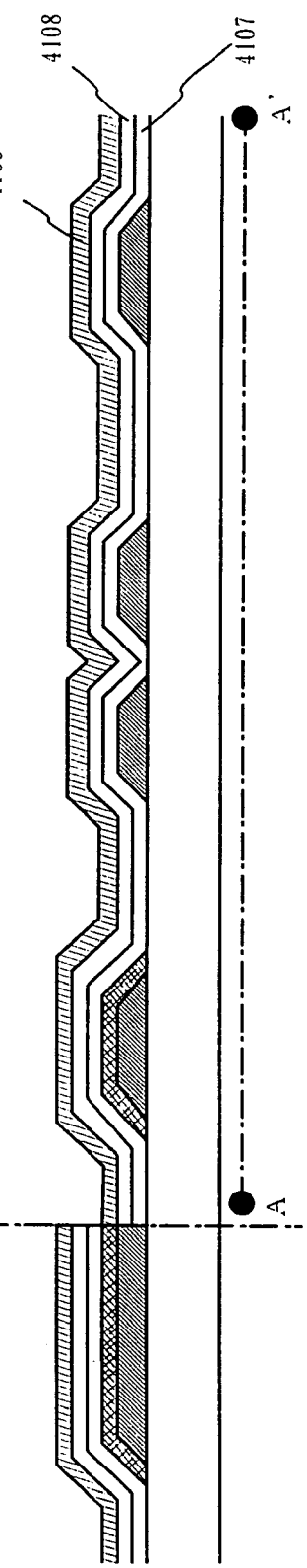
FIG. 28A
FIG. 28B
FIG. 28C

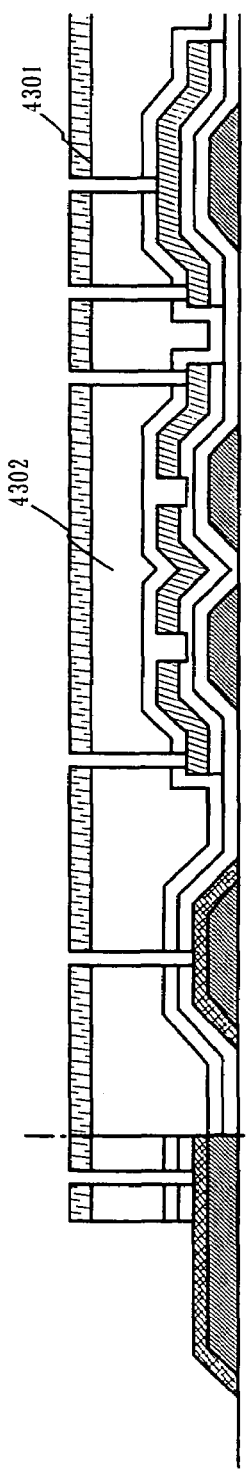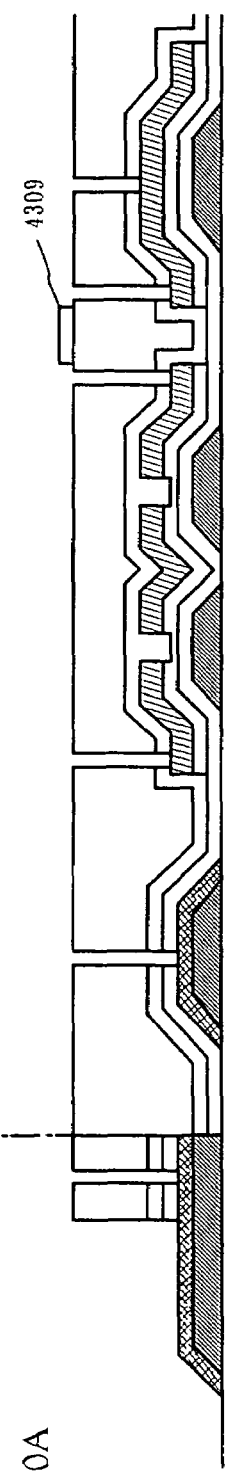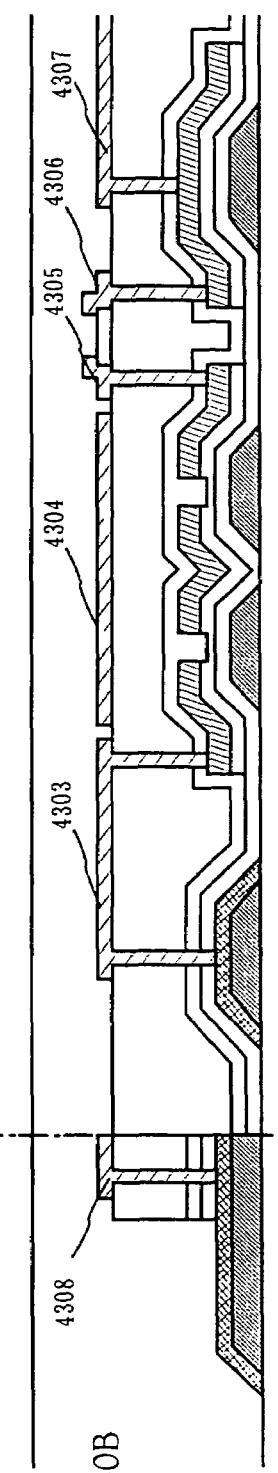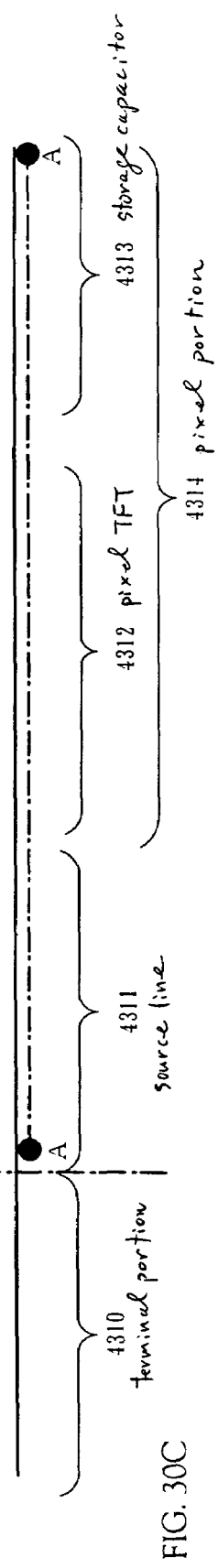

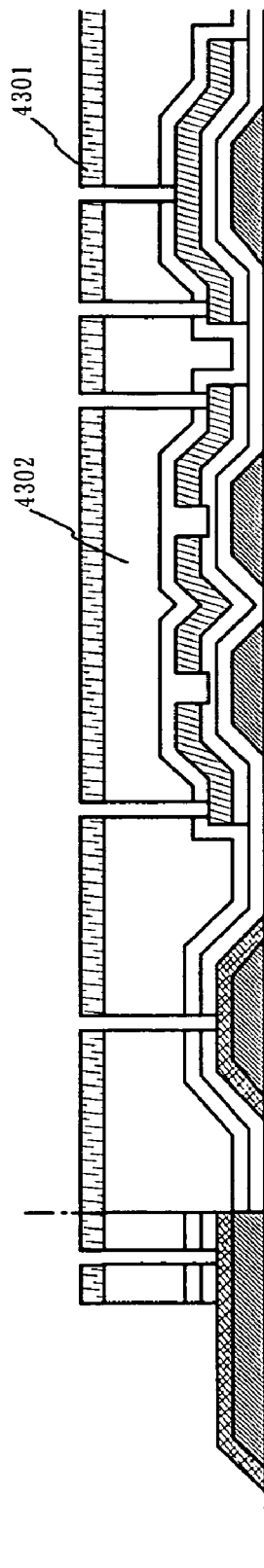
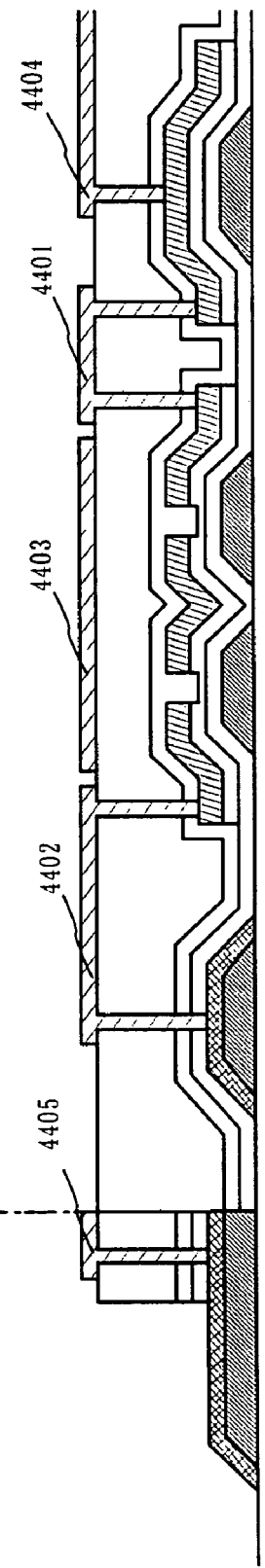
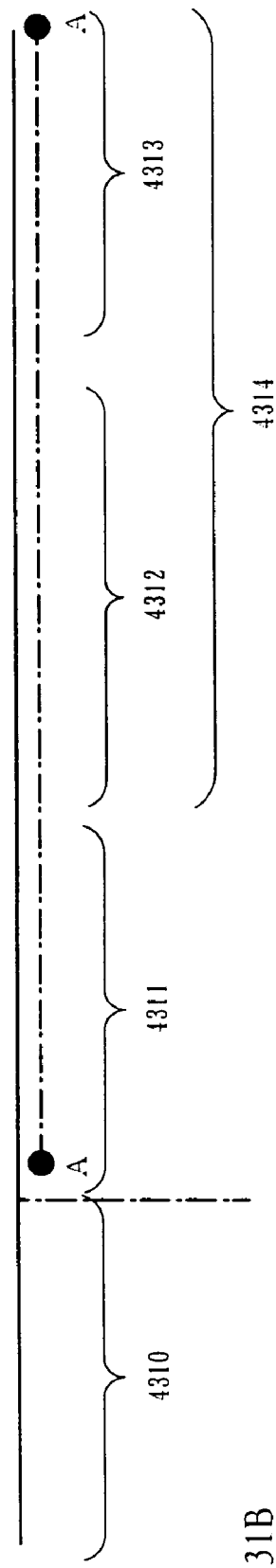
FIG. 31A
FIG. 31B

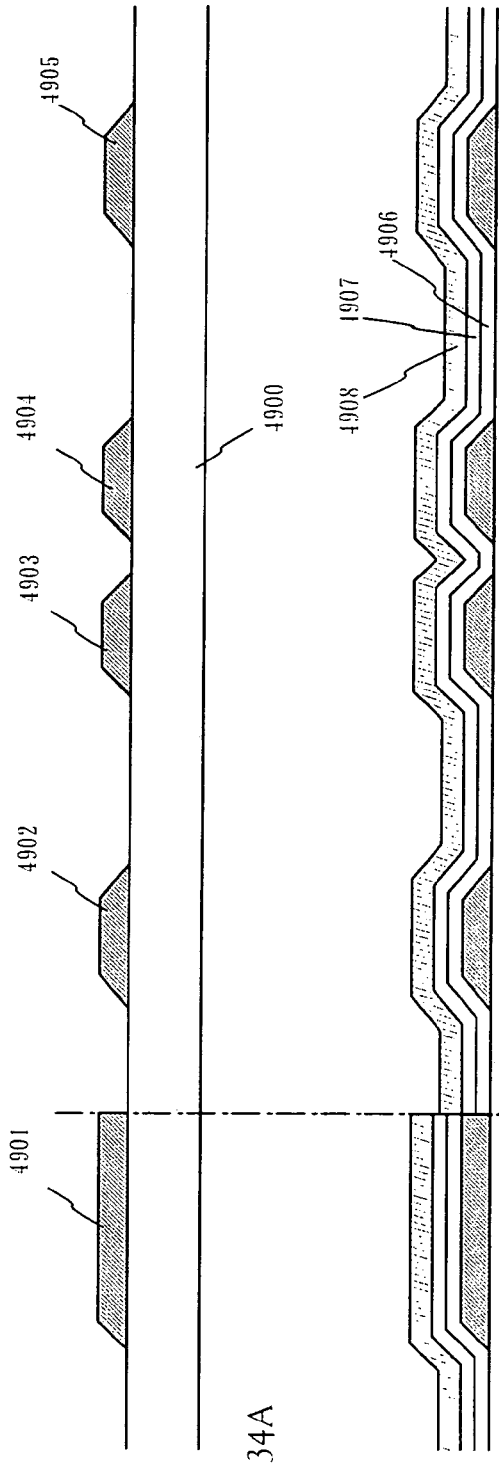
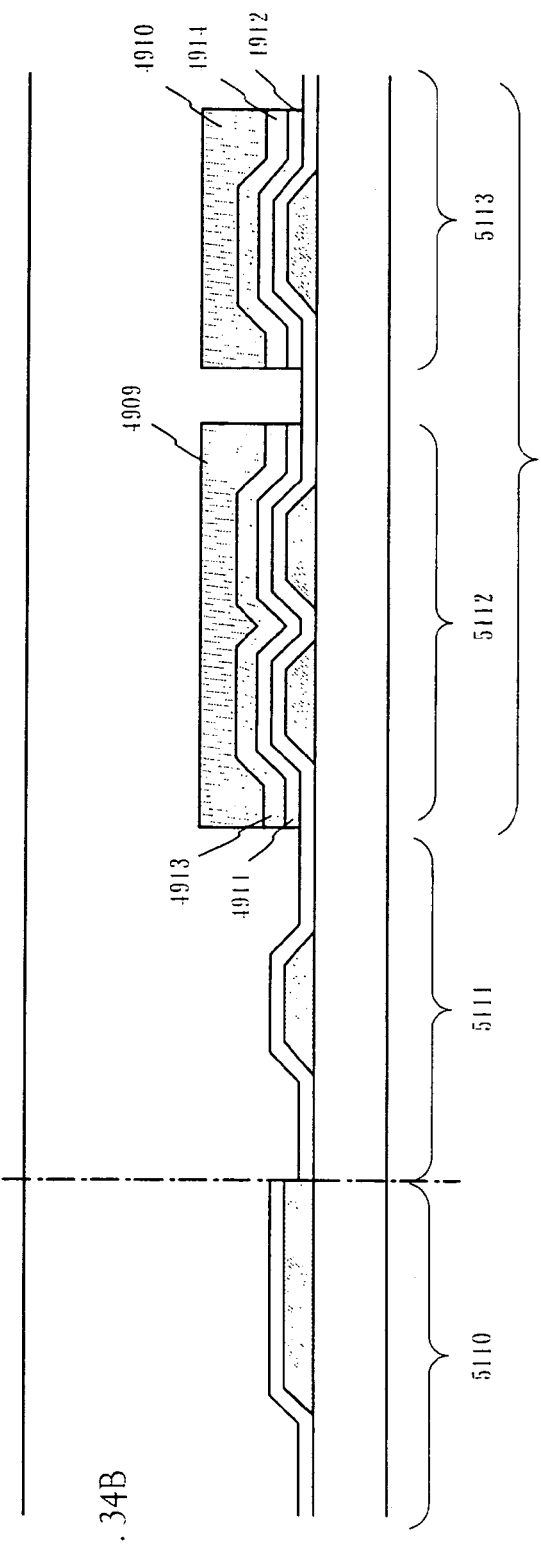
FIG. 34A
FIG. 34B
FIG. 34C

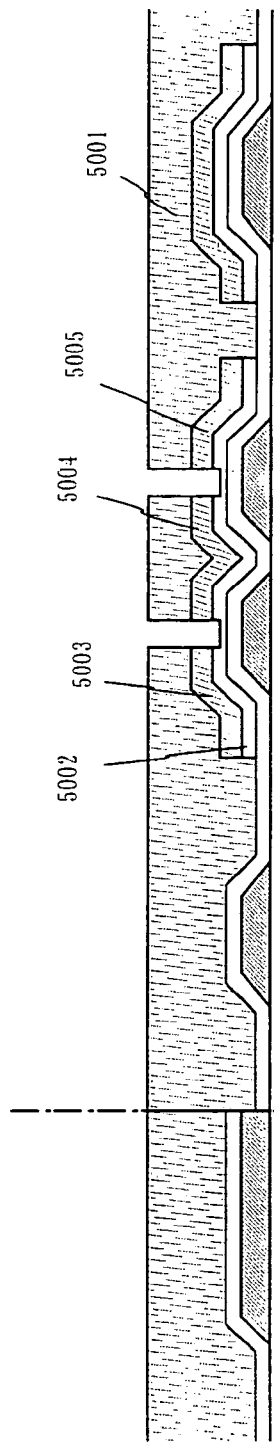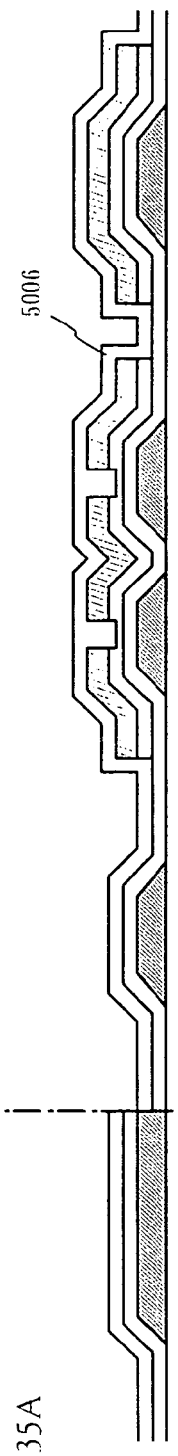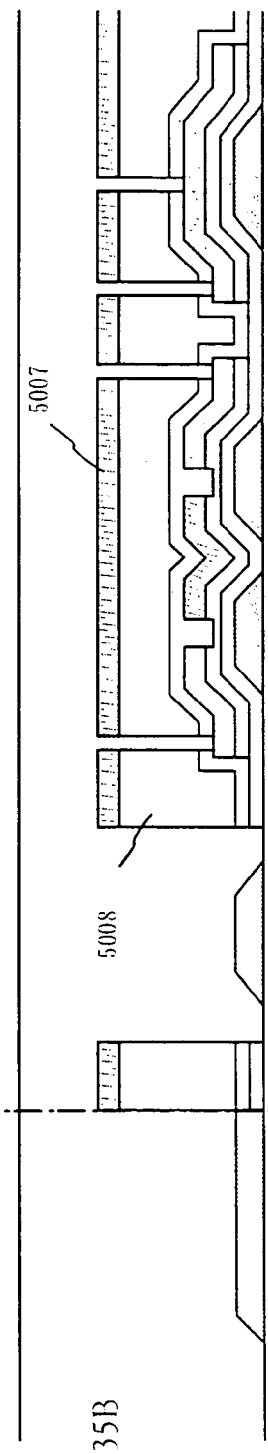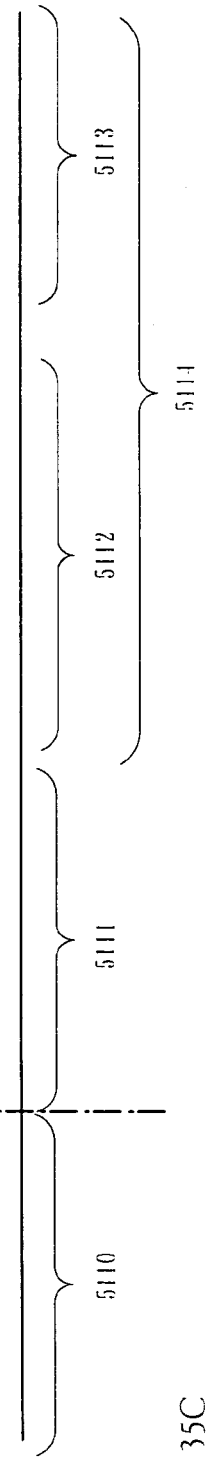
FIG. 35A
FIG. 35B
FIG. 35C

SEMICONDUCTOR DEVICE, AND MANUFACTURING METHOD THEREOF

CROSS-REFERENCE TO RELATED APPLICATIONS

This application is a divisional application of U.S. application Ser. No. 10/011,813, filed Dec. 11, 2001, now U.S. Pat. No. 6,953,951, which claims the benefit of foreign priority applications filed in Japan as Serial No. 2000-376722 on Dec. 11, 2000, as Serial No. 2000-389093 on Dec. 21, 2000, and as Serial No. 2000-400280 on Dec. 28, 2000. This application claims priority to each of these prior applications, and the disclosures of the prior applications are considered part of (and are incorporated by reference in) the disclosure of this application.

BACKGROUND OF THE INVENTION

1. Field of the Invention

The present invention generally relates to a semiconductor device including a circuit constituted by thin-film transistors (referred to as a "TFT" hereinafter), and a manufacturing method thereof. More specifically, the present invention is directed to such an apparatus typically known as a liquid crystal display apparatus (namely, liquid crystal module is mounted) or the like, and also to an electronic appliance which mounts thereon such a liquid crystal display or the like as a component, and is further directed to a manufacturing method thereof.

It should be understood that a term "semiconductor device" implies all of such apparatus, or devices operable by using semiconductor characteristics, and thus, all of electrooptical apparatus, semiconductor devices, and electronic appliances correspond to semiconductor devices in the specification of the present invention.

2. Description of Related Art

Very recently, a specific attention has been paid to such a technique capable of constituting a thin-film transistor (TFT), while employing a semiconductor thin film (thickness thereof being several nm to several hundreds nm) which is formed on a substrate having an insulating surface. Thin-film transistors are widely utilized in various electronic devices such as ICs and electrooptical apparatus. In particular, there are strong demands to rapidly develop these thin-film transistors as switching elements of image display apparatus.

Conventionally, liquid crystal display devices are known as image display apparatus. Since high precision images can be obtained, large numbers of active matrix type liquid crystal display devices are usually employed, as compared with passive type liquid crystal display devices. In an active matrix type liquid crystal display device, since pixel electrodes arranged in a matrix form are driven, a display pattern is formed on a display screen. More specifically, since a voltage is applied between a selected pixel electrode and a counter electrode corresponding to this selected pixel electrode, liquid crystal layers arranged between the selected pixel electrode and the counter electrode are optically modulated, so that this optical modulation may be recognized as a display pattern by a viewer.

While such active matrix type liquid crystal display devices are widely used in various fields, strong demands are requested for enlarging display screen sizes, and for realizing high precision, high aperture efficiencies, and high reliability. At the same time, improvements in productivity and also low cost are strongly required.

SUMMARY OF THE INVENTION

In accordance with one aspect of the present invention, it becomes possible to provide a semiconductor device capable of realizing low power consumption, even while a display screen is enlarged, and also to provide a method of manufacturing such a semiconductor device.

In accordance with one aspect of the invention, a display device such as a liquid crystal display device is featured by that a surface of a source wiring line of a pixel portion is processed by way of a plating process operation so as to lower a resistance value of this source wiring line. The source wiring line of the pixel portion may be manufactured at a step different from a step for manufacturing a source wiring line of a drive circuit portion. Further, electrodes of a terminal portion of this display device may be processed by a plating process operation so as to reduce a resistance value thereof.

In the display device according to one aspect of the present invention, while a wiring line before being plated is formed by using the same material as that of a gate electrode, a surface of this wiring line may be preferably processed by a plating process operation so as to form the source wiring line. As a material film which is processed by a plating process operation, it is preferable to employ such a material film having a lower resistance value than that of the gate electrode. As a result, the source wiring line of the pixel portion may become such a wiring line having a low resistance value, because of the plating process operation.

A semiconductor device having the below-mentioned structure is disclosed in the specification of the present invention: That is, the semiconductor device equipped with a TFT containing a semiconductor layer formed on an insulating surface, an insulating film formed on the semiconductor layer, and a gate electrode formed on the insulating film, comprising:

a pixel portion equipped with a first n-channel type TFT having a source wiring tine, the surface of which is covered by a material film having a lower resistance value (or resistivity) than that of the gate electrode, while surrounding the wiring line made of the same material as that of the gate electrode;

a drive circuit equipped with a circuit constructed of both a second n-channel type TFT and a p-channel type TFT; and a terminal portion, the surface of which is covered by a material film having a lower resistance value (or a resistivity) than that of the gate electrode, while surrounding the wiring line made of the same material as that of the gate electrode.

In the above-described semiconductor device structure, the above-described material film having the low resistance value contains at least one material mainly containing Cu, Al, Au, Ag, or an alloy of these elements.

Also, a semiconductor device, according to another aspect of the present invention, is featured by such a semiconductor device equipped with a TFT containing a semiconductor layer formed on an insulating surface, an insulating film formed on the semiconductor layer, and a gate electrode formed on the insulating film, comprising:

a pixel portion equipped with a first n-channel type TFT having a source wiring line which is processed by a plating process operation;

a drive circuit equipped with a circuit constructed of both a second n-channel type TFT and a p-channel type TFT; and a terminal portion which is processed by a plating process operation.

In the above-described semiconductor device structure, both a surface of the terminal portion and a surface of the source wiring line of the pixel portion are covered by a thin film made of a material which mainly contains Cu, Al, Au, Ag, or an alloy of these elements.

Also, in the above-explained semiconductor device structure, both the terminal portion and the source wiring line of the pixel portion are separately, or simultaneously processed by the plating process operation. The plating-processed source wiring line corresponds to such a plating-processed wiring line which is made of the same material as that of the gate electrode. Also, the plating-processed source line is formed by way of a printing process operation, and further, corresponds to such a wiring line having a lower resistance value than that of the gate electrode.

Also, in the above-explained semiconductor device structure, a CMOS circuit may be constituted by employing the second n-channel type TFT and the p-channel type TFT.

Also, in the above-described semiconductor device structure, the first n-channel type TFT has a gate electrode, and a channel forming region which is overlapped with the gate electrode, while a width of the channel forming region is identical to a width of the gate electrode. Alternatively, in the above-described semiconductor device structure, the first n-channel type TFT has a gate electrode having a taper portion, a channel forming region which is overlapped with the gate electrode, and an impurity region which is partially overlapped with the gate electrode. In this case, this first n-channel type TFT may be preferably made of a triple gate structure having three channel-forming regions.

Also, in the above-explained semiconductor device structure, the n-channel type TFT of the drive circuit includes a gate electrode having a taper portion, a channel forming region which is overlapped with the gate electrode, and an impurity region which is partially overlapped with the gate electrode.

Also, in the above-explained semiconductor device structure, impurity concentration in an impurity region of the n-channel type TFT is defined within at least a range of $1\times10^{17}$ to $1\times10^{18}/cm^3$, and a region having a concentration gradient is contained. A distance from the channel forming region is increased, and also, impurity concentration is increased.

Furthermore, in order to obtain the above-described semiconductor device structures, a semiconductor device manufacturing method, according to another aspect of the present invention, is featured by such a method for manufacturing a semiconductor device provided with a drive circuit, a pixel portion, and a terminal portion on an insulating surface, comprising:

a step for forming a semiconductor layer on the insulating surface;

a step for forming a first insulating film on said semiconductor layer;

a step for forming a first gate electrode, a source wiring line of the pixel portion, and an electrode of the terminal portion on the first insulating film;

a step for adding an impurity element capable of applying an n-type into the semiconductor layer, while the first gate electrode is used as a mask, so as to form an n type first impurity region;

a step for etching the first gate electrode so as to form a taper portion;

a step for adding an impurity element capable of applying an n-type through the taper portion of the first gate electrode into the semiconductor layer so as to form an n type second impurity region;

a step for adding an impurity element capable of applying a p-type through the taper portion of the first gate electrode into the semiconductor layer so as to form a p type impurity region;

a step for performing a plating process operation with respect to both a surface of the source wiring line of the pixel portion and a surface of the terminal portion;

a step for forming a second insulating film which covers both the source wiring line of the pixel portion and the terminal portion; and a step for forming both a gate wiring line and a source wiring line of the drive circuit on the second insulating film.

Also, a semiconductor device manufacturing method, according to another aspect of the present invention, is featured by such a method for manufacturing a semiconductor device provided with a drive circuit, a pixel portion, and a terminal portion on an insulating surface, comprising:

a step for forming a semiconductor layer on the insulating surface;

a step for forming a first insulating film on said semiconductor layer;

a step for forming a first gate electrode, a source wiring line of the pixel portion, and an electrode of the terminal portion on the first insulating film;

a step for adding an impurity element capable of applying an n-type into the semiconductor layer, while the first gate electrode is used as a mask, so as to form an n type first impurity region;

a step for etching the first gate electrode so as to form a taper portion;

a step for adding an impurity element capable of applying an n-type through the taper portion of the first gate electrode into the semiconductor layer so as to form an n type second impurity region;

a step for adding an impurity element capable of applying a p-type through the taper portion of the first gate electrode into the semiconductor layer so as to form a p type impurity region;

a step for executing a plating process operation with respect to a surface of the source wiring line of the pixel portion;

a step for performing a plating process operation with respect to a surface of the terminal portion;

a step for forming a second insulating film which covers both the source wiring line of the pixel portion and the terminal portion; and a step for forming both a gate wiring line and a source wiring line of the drive circuit on the second insulating film.

In the above-described semiconductor device structure, both the above-described source wiring line of the pixel portion and terminal portion are manufactured by employing such a material film mainly containing Cu, Al, Au, Ag, or an alloy of these elements.

Also, in the above-explained semiconductor device structure, at the plating process operation step, the source wiring lines of the pixel portion are connected to each other by using a wiring line so as to become the same potential. This connected wiring line for the equi-potential purpose may be cut out by laser light after the plating process operation has been carried out, or may be cut out in conjunction with the substrate at the same time after the plating process operation has been carried out.

Also, in accordance with the present invention, the drive circuit may be formed by employing an NMOS circuit constructed of all of n-channel type TFTs, and the TFT of the pixel portion may also be formed on the same substrate by employing an n-channel type TFT.

When an NMOS circuit is formed by combining n-channel type TFTs with each other, there are two cases. That is, as shown in FIG. 23A, such an NMOS circuit is form-ed by combining enhancement type TFTs with each other (will be referred to as an "EEMOS" circuit hereinafter), whereas as indicated in FIG. 23B, such an NMOS circuit is formed by combining an enhancement type TFT with a depletion type TFT (will be referred to as an "EDMOS" circuit hereinafter).

To manufacture both an enhancement type TFT and a depletion type TFT in a distinguishable manner, either such an element (preferably phosphorus) belonging to Group XV of the periodic table or another element (preferably boron) belonging to Group XIII of the periodic table may be properly added to a semiconductor which constitutes a channel forming region.

Also, in such a display apparatus whose display area is small, in the case that a drive circuit is formed by such an NMOS circuit made of n-channel type TFTs, consumed power thereof is larger than that of a CMOS circuit. However, the inventive idea of the present invention may become particularly effective in the case that a display area of a display apparatus is a large size. Therefore, there is no problem as to power consumption in either a desk-top type monitor having a large screen size or a television having a large display screen. Also, in accordance with another aspect of the present invention, all thin film transistors that constitute a gate driver circuit and a source driver circuit over the display substrate can be made of NMOS circuits (i.e. N-channel thin film transistors) as well as all thin film transistors in the pixel portion being N-channel thin film transistors. It is possible to use an externally connected IC chip in addition to these NMOS circuits, especially as a part or a whole of the source driver circuit.

A semiconductor device having the below-mentioned structure is disclosed in the specification of the present invention: That is, the semiconductor device equipped with a TFT containing a semiconductor layer formed on an insulating surface, an insulating film formed on the semiconductor layer, and a gate electrode formed on the insulating film, comprising:

a pixel portion equipped with a first n-channel type TFT having a source wiring line, the surface of which is covered by a material film having a lower resistance value than that of the gate electrode, while surrounding the wiring line made of the same material as that of the gate electrode;

a drive circuit equipped with a circuit constructed of both a second n-channel type TFT and a third n-channel type TFT; and a terminal portion, the surface of which is covered by a material film having a lower resistance value than that of the gate electrode, while surrounding the wiring line made of the same material as that of the gate electrode.

In the above-described semiconductor device structure, the above-described material film having the low resistance (resistivity) value contains Cu, Al, Au, Ag, or an alloy of these elements.

Also, a semiconductor device, according to another aspect of the present invention, is featured by such a semiconductor device equipped with a TFT containing a semiconductor layer formed on an insulating surface, an insulating film formed on the semiconductor layer, and a gate electrode formed on the insulating film, comprising:

a pixel portion equipped with a first n-channel type TFT having a source wiring line which is processed by a plating process operation;

a drive circuit equipped with a circuit constructed of both a second n-channel type TFT and a third n-channel type TFT; and a terminal portion which is processed by a plating process operation.

In the above-described semiconductor device structure, both a surface of the terminal portion and a surface of the source wiring line of the pixel portion are covered by a thin film made of a material which mainly contains Cu, Al, Au, Ag, or an alloy of these elements.

Also, in each of the above-explained semiconductor device structures, both the terminal portion and the source wiring line of the pixel portion are separately, or simultaneously processed by the plating process operation.

The plating-processed source wiring line corresponds to such a plating-processed wiring line which is obtained at the same step as that of the gate electrode.

Also, in the respective semiconductor device structure, the plating-processed source wiring line corresponds to such a plating-processed wiring line made of a material having a lower resistance value (or a resistivity) than that of the gate electrode. Also, the wiring line made of the material having the lower resistance value than that of the gate electrode may be formed in such a manner that after a film has been formed by employing the sputtering method, this sputtered film is patterned. Alternatively, this wiring line may be formed by way of the printing method. When the wiring line is formed by executing the printing method, a total number of masks may be reduced.

Also, in each of the semiconductor device structures, either an EEMOS circuit or an EDMOS circuit is formed by employing the second n-channel type TFT and the third n-channel type TFT.

Also, in each of the above-described semiconductor device structures, the first n-channel type TFT owns a gate electrode, and a channel forming region which is overlapped with the gate electrode, while a width of the channel forming region is identical to a width of the gate electrode.

Also, in the above-described semiconductor device structure, the first n-channel type TFT owns a gate electrode having a taper portion, a channel forming region which is overlapped with the gate electrode, and an impurity region which is partially overlapped with the gate electrode.

Also, in each of above-explained semiconductor device structures, the n-channel type TFT of the drive circuit includes a gate electrode having a taper portion, a channel forming region which is overlapped with the gate electrode, and an impurity region which is partially overlapped with the gate electrode. Also, this first n-channel type TFT may have three channel-forming regions.

Also, in the above-explained semiconductor device structure, impurity concentration in an impurity region of the n-channel type TFT is defined within at least a range of $1 \times 10^{17}$ to $1 \times 10^{18}/cm^3$, and a region having a concentration gradient is contained. A distance from the channel forming region is increased, and also, impurity concentration is increased.

Also, in each of the semiconductor device structures, the first n-channel type TFT may preferably own a plurality of channel-forming regions.

A semiconductor device having another structure is disclosed in the specification of the present invention: the semiconductor device equipped with a TFT containing a semiconductor layer formed on an insulating surface, an insulating film formed on the semiconductor layer, and a gate electrode formed on the insulating film, comprising:

a terminal portion, at least the partial surface of which is covered by a material film having a lower resistance value than that of the gate electrode, while surrounding the electrode made of the same material as that of the gate electrode. This material film having the low resistance value is lower than that of the material of the gate electrode.

A semiconductor device having another structure is disclosed in the specification of the present invention: the semiconductor device equipped with a TFT containing a semiconductor layer formed on an insulating surface, an insulating film formed on the semiconductor layer, and a gate electrode formed on the insulating film, comprising:

a terminal portion, at least the partial surface of which is covered by a material film having a lower resistance value (or a resistivity) than that of the gate electrode, while surrounding the electrode made of the same material as that of the gate electrode;

a wiring line which is covered by a material film having a lower resistance value than that of the gate electrode, while surrounding the wiring line made of the same material as that of the gate electrode.

Also, in the above-explained semiconductor device structure, the wiring line corresponds to a source wiring line.

Also, the semiconductor device described in the respective cases may be either a transmission type liquid crystal module or a reflection type liquid crystal module.

Furthermore, in order to obtain the above-described semiconductor device structures, a semiconductor device manufacturing method, according to another aspect of the present invention, is featured by such a method for manufacturing a semiconductor device provided with a drive circuit, a pixel portion, and a terminal portion on an insulating surface, comprising:

a step for forming a semiconductor layer on the insulating surface;

a step for forming a first insulating film on said semiconductor layer;

a step for forming a first gate electrode, a source wiring line of the pixel portion, and an electrode of the terminal portion on the first insulating film;

a step for adding an impurity element capable of applying an n-type into the semiconductor layer, while the first gate electrode is used as a mask, so as to form an n type first impurity region;

a step for etching the first gate electrode so as to form a taper portion;

a step for adding an impurity element capable of applying an n-type through the taper portion of the first gate electrode into the semiconductor layer so as to form an n type second impurity region;

a step for performing a plating process operation with respect to both a surface of the source wiring line of the pixel portion and a surface of the terminal portion;

a step for forming a second insulating film which covers both the source wiring line of the pixel portion and the terminal portion; and a step for forming both a gate wiring line and a source wiring line of the drive circuit on the second insulating film.

Also, a semiconductor device manufacturing method, according to another aspect of the present invention, is featured by such a method for manufacturing a semiconductor device provided with a drive circuit, a pixel portion, and a terminal portion on an insulating surface, comprising:

a step for forming a semiconductor layer on the insulating surface;

a step for forming a first insulating film on said semiconductor layer;

a step for forming a first gate electrode, a source wiring line of the pixel portion, and an electrode of the terminal portion on the first insulating film;

a step for adding an impurity element capable of applying an n-type into the semiconductor layer, while the first gate electrode is used as a mask, so as to form an n type first impurity region;

a step for etching the first gate electrode so as to form a taper portion;

a step for adding an impurity element capable of applying an n-type through the taper portion of the first gate electrode into the semiconductor layer so as to form an n type second impurity region;

a step for executing a plating process operation with respect to a surface of the source wiring line of the pixel portion;

a step for performing a plating process operation with respect to a surface of the terminal portion;

a step for forming a second insulating film which covers both the source wiring line of the pixel portion and the terminal portion; and a step for forming both a gate wiring line and a source wiring line of the drive circuit on the second insulating film.

Also, in each of the above-explained semiconductor device manufacturing method, both the source wiring line of the pixel portion and the terminal portion are made of such a material mainly containing Cu, Al, Au, Ag, or an alloy of these elements.

Also, in the above-explained semiconductor device manufacturing method, at the plating process operation step, the source wiring lines of the pixel portion are connected to each other by using a wiring line so as to become the same potential. This connected wiring line for the equi-potential purpose may be cut out by laser light ($CO_2$-laser etc.) after the plating process operation has been carried out, or may be cut out in conjunction with the substrate at the same time after the plating process operation has been carried out.

Also, in accordance with another aspect of the present invention, instead of the n-channel type TFT, all of the circuits may be formed on the same substrate by employing p-channel type TFTs. More specifically, all thin film transistors that constitute driver circuits and an active matrix circuit over the substrate can be P-channel type TFTS.

A semiconductor device having another structure is disclosed in the specification of the present invention: That is, the semiconductor device equipped with a TFT containing a semiconductor layer formed on an insulating surface, an insulating film formed on the semiconductor layer, and a gate electrode formed on the insulating film, comprising:

a pixel portion equipped with a first p-channel type TFT having a source wiring line, the surface of which is covered by a material film having a lower resistance value than that of the gate electrode, while surrounding the wiring line made of the same material as that of the gate electrode;

a drive circuit equipped with a circuit constructed of both a second p-channel type TFT and a third p-channel type TFT; and a terminal portion, the surface of which is covered by a material film having a lower resistance value than that of the gate electrode, while surrounding the wiring line made of the same material as that of the gate electrode.

Also, a semiconductor device, according to another aspect of the present invention, is featured by such a semiconductor device equipped with a TFT containing a semiconductor layer formed on an insulating surface, an insulating film formed on the semiconductor layer, and a gate electrode formed on the insulating film, comprising:

a pixel portion equipped with a first p-channel type TFT having a source wiring line which is processed by a plating process operation;

a drive circuit equipped with a circuit constructed of both a second p-channel type TFT and a third p-channel type TFT; and a terminal portion which is processed by a plating process operation.

In the case that the above-described p-channel type TFTs are employed, either an EEMOS circuit or an EDMOS circuit is constituted by employing both the second p-channel type TFT and the third p-channel type TFT.

Also, the present invention is not specifically limited to the structures of TFTs, but an inverse stagger type TFT structure may be employed. Also, as an activation layer of a TFT, not only a semiconductor film having a crystal structure, but also a semiconductor film having an amorphous structure may be employed.

The present invention is featured by manufacturing such a semiconductor device comprising: a source wiring line which is plating-processed by employing a material having a low resistance value (typically known as Cu, Ag, Au, Cr, Fe, Ni, Pt, or alloy of these elements); a TFT of an inverse stagger type pixel portion; a storage capacitor; and a terminal portion. It should be noted that since only the shape of the pixel portion is increased when the display screen size is enlarged, there is no need to plate the metal film on any portions other than the pixel portion. In other words, the metal film may be plating-processed only on the source wiring line of the pixel portion.

Referring now to FIG. 33, a description will be made of a method for plating such a metal film only on the source wiring line. Such a wiring line pattern is formed on a substrate. A plating-process electrode 4805 corresponding to an electrode for performing a plating process operation is mounted on this wiring pattern. Both a terminal portion 4808 connected to a drive circuit provided on the gate wiring line side, and also another terminal 4809 connected to a drive circuit provided on the source wiring line side are formed on this wiring pattern. As indicated in FIG. 33, such a pattern which will constitute the source wiring line 4802 is formed on this wiring line pattern. Since the portion to which the metal film is plated is only the source wiring line 4802 of the pixel portion 4803, such a pattern which will constitute the source wiring line is not connected to the terminal portion which is connected to the drive circuit provided on the source wiring line side. Note, reference numeral 4801 indicates a gate wiring line; 4804, a glass substrate; 4806 and 4807, substrate cut-out lines.

Since the plating process operation is carried out by employing this wiring line pattern, the metal film can be plated only on the source wiring line of the pixel portion. As a consequence, even when the screen size is enlarged, such a semiconductor device capable of realizing low power consumption can be manufactured.

Also, in accordance with one aspect of the present invention, all the thin film transistors which constitute a driver circuit and all the thin film transistors provided at a pixel portion are made of p-channel thin film transistors. Source lines of the pixel portion may be formed of the same layer as the gate electrode of the p-channel thin film transistors. In this case, gate lines of the pixel portion and pixel electrodes may be formed on a same interlayer insulating film over the thin film transistors.

Furthermore, in accordance with another aspect of the present invention, all the thin film transistors which constitute a driver circuit and all the thin film transistors provided at a pixel portion are made of n-channel thin film transistors. Source lines of the pixel portion may be formed of the same layer as the gate electrode of the p-channel thin film transistors. In this case, gate lines of the pixel portion and pixel electrodes may be formed on a same interlayer insulating film over the thin film transistors.

BRIEF DESCRIPTION OF THE DRAWINGS

FIGS. 1A-1D are diagrams for representing a manufacturing step of an AM-LCD according to an embodiment of the present invention;

FIGS. 2A-2D are diagrams for showing a manufacturing step of the AM-LCD according to the embodiment;

FIGS. 3A-3B are diagrams for indicating a manufacturing step of the AM-LCD according to the embodiment;

FIGS. 8A-8C are diagrams for showing a terminal portion of the active matrix type liquid crystal display device;

FIGS. 20A-20B are diagrams for indicating a manufacturing step of the AM-LCD according to the embodiment;

FIGS. 28A-28C are diagrams for indicating a manufacturing step of a transmission type semiconductor device in which a source wiring line is plated by employing "Cu", according to an embodiment of the present invention;

FIGS. 30A-30C are diagrams for indicating a manufacturing step of the transmission type semiconductor device in which the source wiring line is plated by employing "Cu", according to the embodiment of the present invention;

FIGS. 31A-31B are diagrams for indicating a manufacturing step of a reflection type semiconductor device in which a source wiring line is plated by employing "Cu", according to another embodiment of the present invention;

FIGS. 34A-34C are diagrams for indicating a manufacturing step of a transmission type semiconductor device in which a source wiring line is plated by employing "Cu", according to an embodiment of the present invention;

FIGS. 35A-35C are diagrams for indicating a manufacturing step of the transmission type semiconductor device in which the source wiring line is plated by employing "Cu", according to the embodiment of the present invention;

DETAILED DESCRIPTION OF THE PREFERRED EMBODIMENTS

Various embodiment modes of the present invention will now be described in detail.

Embodiment Mode 1

First, after an underlayer insulating film has been manufactured on a substrate, a semiconductor layer having a desirable shape is manufactured by way of a first photolithography step.

Next, an insulating film (containing gate insulating film) which covers the semiconductor layer is formed. Both a first conductive layer and a second conductive layer are formed on the insulating film in a stack layer manner. These stack layer films are processed by way of a second photolithography step by performing a first etching process operation, so that a gate electrode made of both a first conductive layer and a second conductive layer, a source wiring line of a pixel portion, and an electrode of a terminal portion are formed. It should be noted that in accordance with the present invention, after the gate electrode has been firstly formed, a gate wiring line is manufactured on an interlayer insulating film.

Next, while a resist mask which has been manufactured in the second photolithography step is kept under present condition, an impurity element (phosphorus etc.) capable of applying an "n" type is added to the semiconductor so that an "n" type impurity region (high concentration) is formed in a self-alignment manner.

Next, while a resist mask which has been manufactured by way of the second photolithography step is kept under present condition, a second etching process operation is carried out by changing an etching condition, so that both a first conductive layer (first width) having a taper portion, and also a second conductive layer (second width) are manufactured. It should be noted that the first width is made wider than the second width, and such an electrode constituted by the first conductor layer and the second conductor layer may constitute a gate electrode (first gate electrode) of an n-channel type TFT.

Subsequently, after the resist mask has been removed, while the above-described second conductive layer is employed as a mask, the impurity element capable of applying the "n" type is added through the taper portion of the first conductive layer into the semiconductor layer. In this case, while a channel forming region is formed below the second conductive layer, an impurity region (low concentration) is formed below the first conductive layer in such a manner that impurity concentration is gradually increased, while this impurity region is separated from the channel forming region.

Figure 11A:
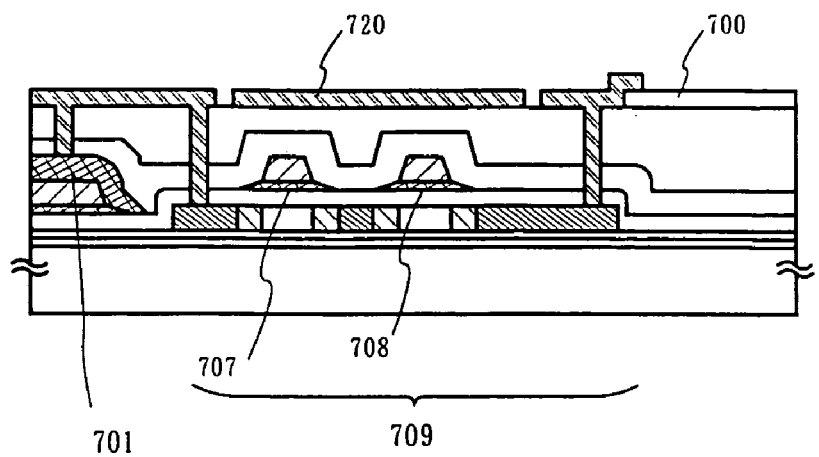
FIGS. 11A-11B are diagrams for showing a sectional view of a pixel portion of the liquid crystal module.
Figure 11B:
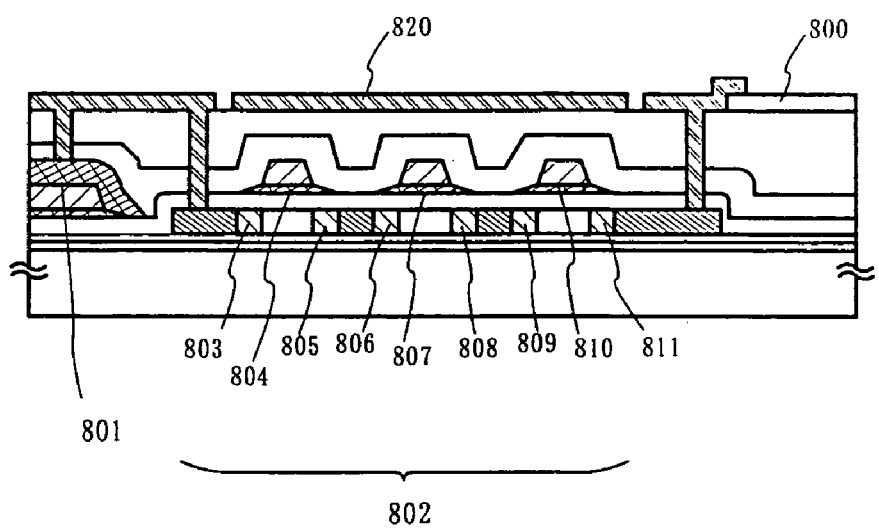
Figure 16:
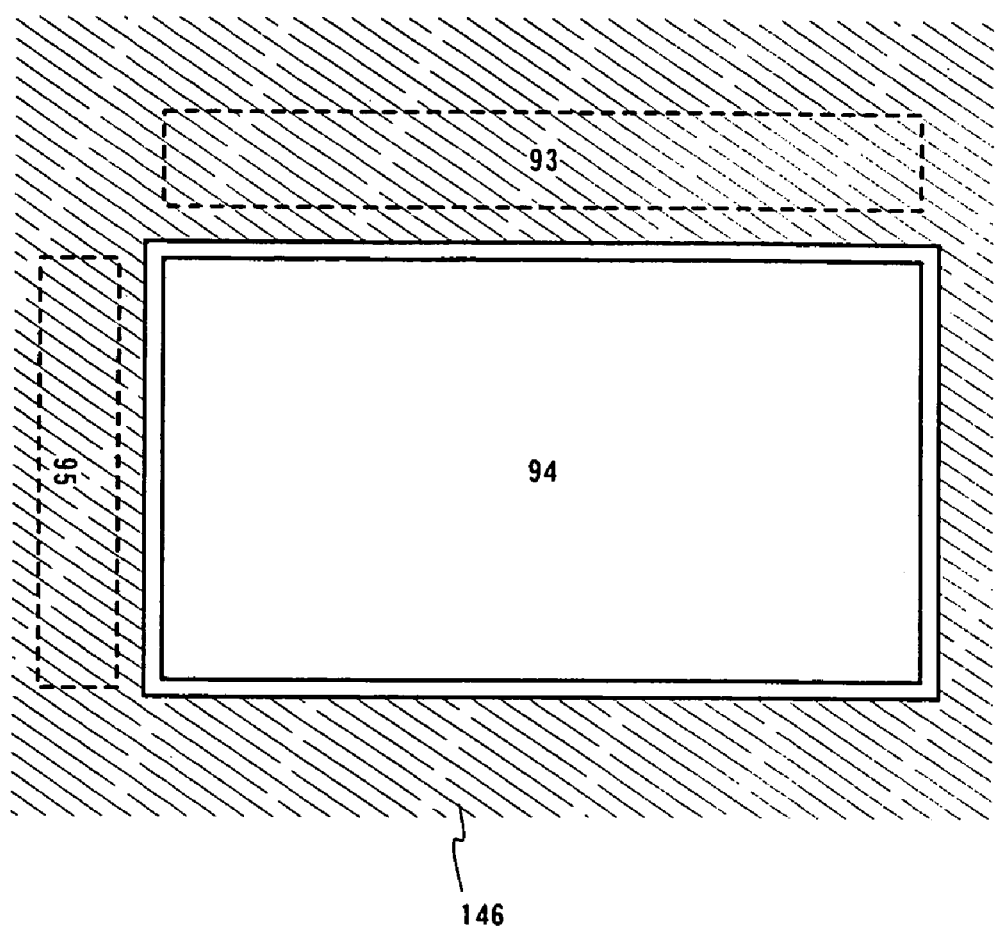
FIG. 16 is a diagram for indicating a mask 146 of the bottom gate type TFT.

Thereafter, the taper portion is selectively removed in order to reduce an OFF-current of a TFT (thin-film transistor) formed in the pixel portion. Only the taper portion of the gate electrode of the pixel portion may be removed by performing a dry etching process operation under such a condition that a mask is overlapped thereon, as indicated in FIG. 16. In particular, the taper portion may not be selectively removed. As indicated in FIGS. 11A-11B, when the taper portion is not selectively removed, this taper portion is formed as a triple gate construction in order that an OFF-current may be preferably reduced.

Next, while a mask is formed so as to cover such a region that an n-channel type TFT is formed by way of a third photolithography step, a third doping process operation is carried out. In this third doping process operation, an impurity element (boron) capable of applying a "p" type is added to the semiconductor so as to form a "p" type impurity region (high concentration).

Subsequently, after the impurity elements added to the respective semiconductor layers are activated, a plating process operation (electrolytic plating method) is carried out so as to form a metal film on a surface of a source wiring line of a pixel portion and also a metal film on a surface of an electrode of a terminal portion. A plating method corresponds to such a method by which a DC current is supplied through a water solution containing metal ions which will be formed by the plating method, and thus, a metal film is formed on a cathode surface. As a metal to be plated, any materials having resistance values lower than the resistance value of the above-described gate electrode may be employed, for instance, copper, silver, gold, chromium, iron, nickel, platinum, or alloys of these metal materials. Since an electric resistance value of copper is very low, this copper is an optimum metal material as a metal film used to cover the surface of the source wiring line of the present invention. As previously described, since the source wiring line of the pixel portion is covered by such a metal material having a low resistance value, even when the area of this pixel portion is increased, the pixel portion can be driven in sufficiently high speeds.

Also, a film thickness of a metal film which is formed by performing a plating method may be properly set by controlling both current density and time by an operator.

In the present invention, such a metal film formed on a surface is also referred to as a source wiring line.

Subsequently, the formation of an interlayer insulating film is carried out, and also the formation of a transparent conductive film is carried out. Next, the transparent conductive film is patterned by way of a fourth photolithography step so as to form a pixel electrode. Next, a contact hole is formed by way of a fifth photolithography step. In this case, a contact hole which is reached to the impurity region, another contact hole which is reached to the gate electrode, and another contact hole which-is reached to the source wiring line are formed.

Next, a conductive film is made of a metal material having a low resistance value. An electrode which connects the gate wiring line, the source wiring line, and the impurity region to each other, and another electrode which connects the pixel electrode and the impurity region to each other are formed by way of a sixth photolithography step. In the present invention, the gate wiring line is electrically connected via the contact hole formed in the interlayer insulating film to either the first gate electrode or the second gate electrode. Also, the source electrode is electrically connected via the contact hole formed in the interlayer insulating film to the impurity region (source region). Also, an electrode which is connected to a pixel electrode is electrically connected via the contact hole formed in the interlayer insulating film to the impurity region (drain region).

As previously explained, the element substrate provided with the pixel portion and the drive circuit can be manufactured by executing the photolithography steps six times in total, namely by employing six sheets of masks. The pixel portion contains the pixel TFT (n-channel TFT), whereas the drive circuit contains the CMOS circuit. It should also be noted that this embodiment represents such an example of forming the transmission type display device. Alternatively, while such a material having a high reflective characteristic is employed as a pixel electrode, a reflection type display device may be manufactured. In the case that a reflection type display device is formed, since both a reflection electrode and a gate wiring line may be formed at the same time, an element substrate may be formed by employing 5 sheets of masks.

Also, in this embodiment, when the gate electrode is formed, both the source wiring line of the pixel portion and the electrode of the terminal portion are manufactured at the same time. Alternatively, these gate electrode, source wiring line of the pixel portion and electrode of the terminal portion may be separately manufactured. For instance, after the impurity element has been added to the respective semiconductor layers, the insulating film capable of protecting the gate electrode may be formed, the impurity elements added to the respective semiconductor layers may be activated, and furthermore, both the source wiring line of the pixel portion and the electrode of the terminal portion may be manufactured on this insulating film at the same time by executing a photolithography step, while these source wiring line and the electrode of the terminal portion are made of such a metal material (material mainly contains typical metal material such as aluminum, silver, and copper) having a low resistance value. Then, the source wiring line of the pixel portion and the electrode of the terminal portion, which have been manufactured in the above-described manner, are processed by a plating process operation. Also, in order to reduce a total number of masks, the source wiring line of the pixel portion may be formed by way of a printing method.

Embodiment Mode 2

First, after an underlayer insulating film has been manufactured on a substrate, a semiconductor layer having a desirable shape is manufactured by way of a first photolithography step.

Next, an insulating film (containing gate insulating film) which covers the semiconductor layer is formed. Both a first conductive layer and a second conductive layer are formed on the insulating film in a stacked layer manner. These stacked layer films are processed by way of a second photolithography step by performing a first etching process operation, so that a gate electrode made of both a first conductive layer and a second conductive layer, a source wiring line of a pixel portion, and an electrode of a terminal portion are formed. It should be noted that in accordance with the present invention, after the gate electrode has been firstly formed, a gate wiring line is manufactured on an interlayer insulating film.

Next, while a resist mask which has been manufactured in the second photolithography step is kept under present condition, an impurity element (phosphorus etc.) capable of applying an "n" type is added to the semiconductor, and then, an "n" type impurity region (high concentration) is formed in a self-alignment manner.

Next, while a resist mask which has been manufactured by way of the second photolithography step is kept under present condition, a second etching process operation is carried out by changing an etching condition, so that both a first conductive layer (first width) having a taper portion, and also a second conductive layer (second width) are manufactured. It should be noted that the first width is made wider than the second width, and such an electrode constituted by the first conductor layer and the second conductor layer may constitute a gate electrode (first gate electrode) of an n-channel type TFT.

Subsequently, after the resist mask has been removed, while the above-described second conductive layer is employed as a mask, the impurity element capable of applying the "n" type is added through the taper portion of the first conductive layer into the semiconductor layer. In this case, while a channel forming region is formed below the second conductive layer, an impurity region (low concentration) is formed below the first conductive layer in such a manner that impurity concentration is gradually increased, while this impurity region is separated from the channel forming region.

Thereafter, the taper portion is selectively removed in order to reduce an OFF-current of a TFT (thin-film transistor) formed in the pixel portion. Only the taper portion of the gate electrode of the pixel portion may be removed by performing a dry etching process operation under such a condition that a mask is overlapped thereon, as indicated in FIG. 16. In particular, the taper portion may not be selectively removed. As indicated in FIGS. 11A-11B, when the taper portion is not selectively removed, this taper portion is formed as a triple gate construction in order that an OFF-current may be preferably reduced.

Subsequently, after the impurity elements added to the respective semiconductor layers are activated, a plating process operation (electrolytic plating method) is carried out so as to form a metal film on a surface of a source wiring line of a pixel portion and also a metal film on a surface of an electrode of a terminal portion. A plating method corresponds to such a method by which a DC current is supplied through a water solution containing metal ions which will be formed by the plating method, and thus, a metal film is formed on a cathode surface. As a metal to be plated, any materials having resistance values lower than the resistance value of the above-described gate electrode may be employed, for instance, copper, silver, gold, chromium, iron, nickel, platinum, or alloys of these metal materials. Since an electric resistance value of copper is very low, this copper is an optimum metal material as a metal film used to cover the surface of the source wiring line of the present invention. As previously described, since the source wiring line of the pixel portion is covered by such a metal material having a low resistance value, even when the area of this pixel portion is increased, the pixel portion can be driven in sufficiently high speeds.

Also, a film thickness of a metal film which is formed by performing a plating method may be properly set by controlling both current density and time by an operator.

In the present invention, such a metal film formed on a surface is also referred to as a source wiring line.

Subsequently, forming of an interlayer insulating film is carried out, and also forming of a transparent conductive film is carried out. Next, the transparent conductive film is patterned by way of a third photolithography step so as to form a pixel electrode. Next, a contact hole is formed by way of a fourth photolithography step. In this case, a contact hole which is reached to the impurity region, another contact hole which is reached to the gate electrode, and another contact hole which is reached to the course wiring line are formed.

Next, a conductive film is made of a metal material having a low resistance value. An electrode which connects the gate wiring line, the source wiring line, and the impurity region to each other, and another electrode which connects the pixel electrode and the impurity region to each other are formed by way of a fifth photolithography step. In the present invention, the gate wiring line is electrically connected via the contact hole formed in the interlayer insulating film to either the first gate electrode or the second gate electrode. Also, the source electrode is electrically connected via the contact hole formed in the interlayer insulating film to the impurity region (source region). Also, an electrode which is connected to a pixel electrode is electrically connected via the contact hole formed in the interlayer insulating film to the impurity region (drain region).

As previously explained, the element substrate provided with the pixel portion and the drive circuit can be manufactured by executing the photolithography steps five times in total, namely by employing five sheets of masks. The pixel portion contains the pixel TFT (n-channel TFT), whereas the drive circuit contains such an EEMOS circuit (n-channel TFT) shown in FIG. 23A. It should be understood that this embodiment represents such an example of forming the transmission type display device. Alternatively, while such a material having a high reflective characteristic is employed as a pixel electrode, a reflection type display device may be manufactured. In the case that a reflection type display device is formed, since both a reflection electrode and a gate wiring line may be formed at the same time, an element substrate may be formed by employing 4 sheets of masks.

Figure 23A:
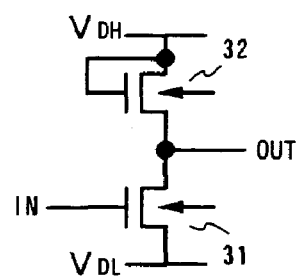
FIGS. 23A-23B are diagrams for showing a structure of an NMOS circuit according to another embodiment of the present invention.
Figure 23B:
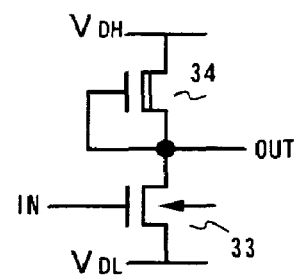

Also, in such a case that an EDMOS circuit as represented in FIG. 23B is fabricated by combining an enhancement type MOS circuit with a depletion type MOS circuit, a mask is previously formed before a conductive film is formed, and either such an element (preferably, phosphorous is selected) belonging to the Group XV of the periodic table or such an element (preferably, boron is selected) belonging to the 13-th element of the periodic table may be selectively added to a semiconductor which constitutes a channel forming region. In this case, the element substrate may be formed by using 6 sheets of masks.

Also, in this embodiment, when the gate electrode is formed, both the source wiring line of the pixel portion and the electrode of the terminal portion are manufactured at the same time. Alternatively, these gate electrode, source wiring line of the pixel portion and electrode of the terminal portion may be separately manufactured. For instance, after the impurity element has been added to the respective semiconductor layers, the insulating film capable of protecting the gate electrode may be formed, the impurity elements added to the respective semiconductor layers may be activated, and furthermore, both the source wiring line of the pixel portion and the electrode of the terminal portion may be manufactured on this insulating film at the same time by executing a photolithography step, while these source wiring line and the electrode of the terminal portion are made of such a metal material (material mainly contains typical metal material such as aluminum, silver, and copper) having a low resistance value Then, the source wiring line of the pixel portion and the electrode of the terminal portion, which have been manufactured in the above-described manner, are processed by a plating process operation. Also, in order to reduce a total number of masks, the source wiring line of the pixel portion may be formed by way of a printing method.

Also, while a p-channel TFT is employed as the n-channel TFT, all of the drive circuits may be manufactured by PMOS circuits made of the p-channel type TFTs, and the TFTs of the pixel portion may be formed by such p-channel type TFTs.

Embodiment Mode 3

A description will now be made of a transmission type semiconductor device in which the present invention is explained below.

First, a conductive film is formed on an entire surface of a substrate, and the conductive film is shaped by a desirable shape by way of a first photolithography step.

Figure 33:
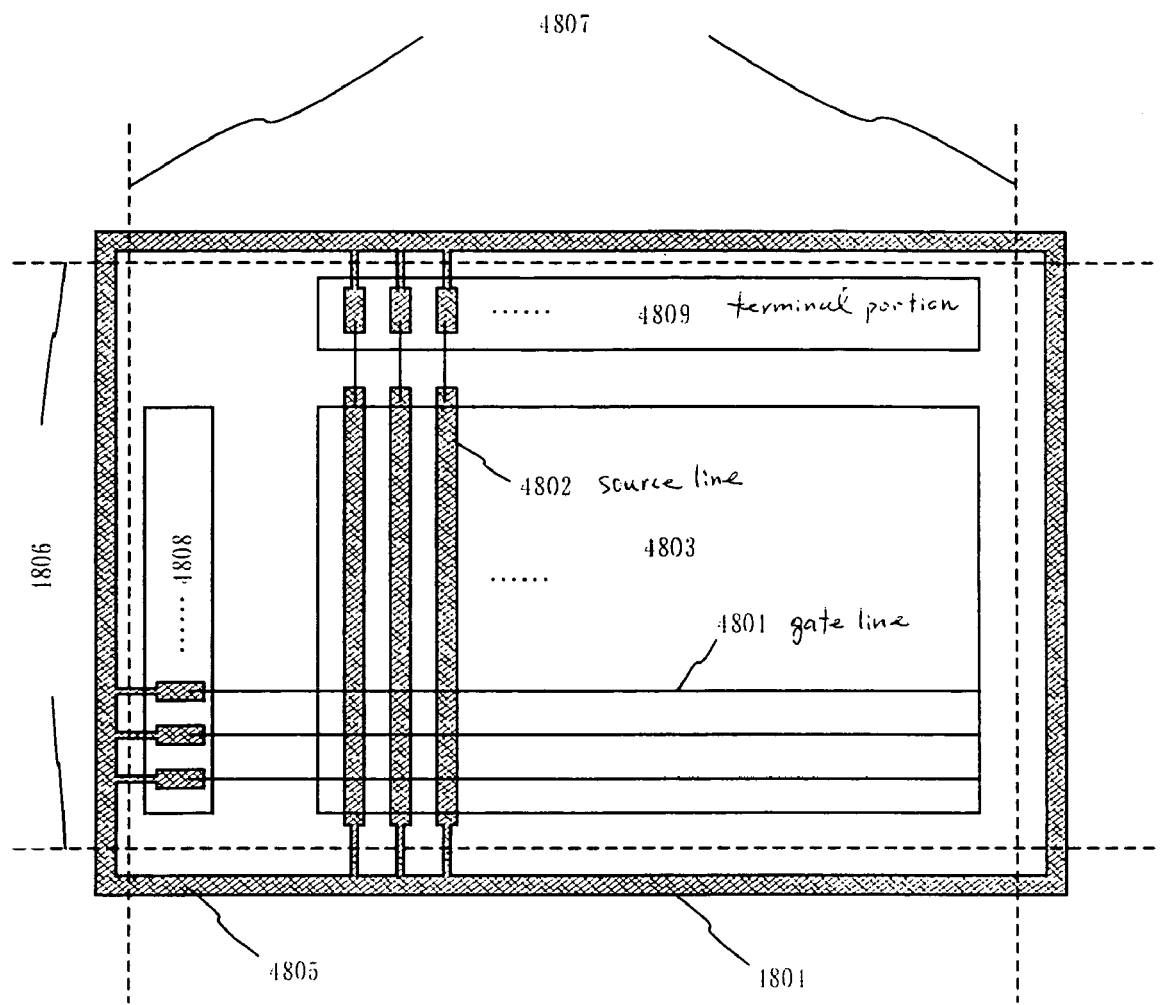
FIG. 33 is a diagram for representing a wiring pattern containing the source wiring line of the transmission type semiconductor device.

Next, a current which is suitable for a plating process is supplied from a plating-process electrode 4805 so as to plate a metal film on a source wiring line. This plating-process electrode 4805 is connected to this source wiring line. In this case, since the conductive film is formed to have a shape as shown in FIG. 33, the metal film can be plated only the source wiring line by mounting the electrode on the substrate.

It should be understood in this specification that an expression "metal film" indicates Cu, Ag, Au, Cr, Fe, Ni, Pt, or an alloy of these metal elements.

Each of the above-described manufacturing methods are featured by that the source wiring lines of the pixel portion are connected to each other by wiring lines in order to become the same potentials in the above-described plating steps. Also, the wiring lines used to connect the source wiring lines so as to become the same potential may be cut out by using laser light ($CO_2$-laser etc.) after the plating process operation is carried out, or may be cut out at the same time with respect to the substrate after the plating process operation is performed. Also, a short-circuit ring may be formed by using these wiring patterns.

Next, an insulating film is formed on an entire surface. A first amorphous semiconductor film, and a second amorphous semiconductor film are formed on the insulating film in a stacked layer manner. The second amorphous semiconductor film contains one conductivity type (either "n" type or "p" type) impurity element. An unnecessary portion of these stacked layer film is etched so as to be removed by way of a second photolithography step, and then, the source electrode, a gate electrode, and a holding (storage) capacitor are formed, while having desirable shapes.

Next, after the resist mask of the second photolithography step has been removed, a portion of the second amorphous semiconductor film containing the one conductivity type (either n-type or p-type) impurity element is removed by way of the third photolithography step. Thereafter, both a source region and a drain region of the gate electrode are formed.

Subsequently, after the resist mask of the third photolithography step has been removed, a first interlayer insulating film is formed in such a manner that this first interlayer insulating film covers the source wiring line, the TFT of the pixel portion, the holding capacitor, and the terminal portion.

Next, a second interlayer insulating film is formed on the first interlayer insulating film. The second interlayer insulating film is made of an organic insulating material constructed of acrylic resin. Thereafter, a resist mask is formed by performing a fourth photolithography step, and then, a contact hole is formed by executing a dry etching process step. In this case, a contact hole which is reached to the second amorphous semiconductor film having one conductive type (either n-type or p-type) impurity element of the gate electrode is formed; another contact hole which is reached to the second amorphous semiconductor film containing one conductive type (either n-type or p-type) impurity element of the holding capacitor is formed; and also another contact hole which is reached to the source wiring line is formed. At the same time, an unnecessary first interlayer insulating film and an unnecessary second interlayer insulating film of a terminal portion are etched, so that a terminal portion is formed.

Next, a second amorphous semiconductor film (drain region) containing one conductive type (either n-type or p-type) impurity element, and a transparent pixel electrode used to electrically connect the holding capacitor are formed by way of a fifth photolithography step.

Subsequently, a metal wiring line made of a metal material having a low resistance value is formed. A gate electrode, an electrode, and a metal wiring line electrically connected to the terminal portion are formed by way of a sixth photolithography step. This electrode is used to connect the second amorphous semiconductor film which contains the one conductivity type (either n-type or p-type) impurity element to the source wiring line. In accordance with the present invention, the gate wiring line is electrically connected through the contact hole formed in the insulating film to either a first gate electrode or a second gate electrode. Also, the source wiring line is electrically connected through the contact hole formed in the insulating film to both the source wiring line and a second amorphous semiconductor film (source region) containing one conductivity type (either n-type or p-type) impurity element. Also, the pixel electrode is electrically connected through the contact hole formed in the interlayer insulating film to the second amorphous semiconductor film (drain region) containing one conductivity type (either n-type or p-type) impurity element.

As previously described, the transmission type semiconductor display device can be manufactured by executing the photolithography steps six times in total. This semiconductor display device is constituted by the source wiring line which is plated by the metal film, the inverse-stagger type pixel portion, the holding capacitor, and the terminal portion.

Embodiment Mode 4

A reflection type semiconductor device in which the present invention is embodied will now be explained.

A reflection type semiconductor device may be manufactured by executing the same manufacturing steps up to the fourth photolithography step used to the transmission type semiconductor device of the embodiment mode 3. Since a fifth photolithography step is carried out, a gate wiring line, an electrode used to connect a source wiring line to a second amorphous semiconductor film (source region), a pixel electrode, and a metal wiring line are manufactured. The second amorphous semiconductor film contains one conductivity type (either n-type or p-type) impurity element. The metal wiring line is electrically connected to a terminal portion. It should also be noted that as a material of this metal wiring line, it is preferable to employ such a metal material having a high reflection characteristic so as to constitute the pixel electrode. That is, a typical material mainly containing either Al or Ag is employed.

In the above-described case, since the pixel electrode is formed by employing a similar element to that of the metal wiring line, the pixel electrode may be formed at the same time while the fifth photolithography step is carried out.

As previously described, the reflection type semiconductor display device can be manufactured by executing the photolithography steps five times in total. This semiconductor display device is constituted by the source wiring line which is plated by the metal film, the inverse-stagger type pixel portion, the holding capacitor, and the terminal portion.

The semiconductor devices with employment of the above-explained structures will now be described more in detail with reference to the below-mentioned embodiments.

Embodiment 1

In this embodiment, a method of simultaneously manufacturing a pixel portion (n-channel TFT) and TFTs (n-channel TFT and p-channel TFT), which is providing a CMOS circuit of a drive circuit provided on the periphery of the pixel portion, on the same substrate will be described with reference to FIGS. 1A to 10.

In this embodiment, a substrate 100 is used, which is made of barium borosilicate glass such as #7059 glass and #1737 glass produced by Corning Corp. or aluminoborosilicate glass. As the substrate 100, any substrate can be used as long as it has transparency. A quartz substrate may be used. A plastic substrate having heat resistance enduring a treatment temperature of this embodiment also may be used.

Then, an underlying film 101 composed of an insulating film such as a silicon oxide film, a silicon nitride film, or a silicon oxide nitride film is formed on the substrate 100. In this embodiment, a two-layered structure is used as the underlying film 101. However, a single insulating film or a lamination of two or more insulating films using the above insulating film may also be used. As a first layer of the underlying film 101, a silicon oxide nitride film 101a is formed to a thickness of 10 to 200 nm (preferably, 50 to 100 nm) by plasma CVD, using $SiH_4$, $NH_3$, and $N_2O$ as reactive gas. In this embodiment, a silicon oxide nitride film 101a (composition ratio: Si=32%, O=27%, N=24%, and H=17%) having a thickness of 50 nm is formed. Then, as a second layer of underlying film 101, a silicon oxide nitride film 101b is formed to a thickness of 50 to 200 nm (preferably, 100 to 150 nm) by plasma CVD, using $SiH_4$ and $N_2O$ as reactive gas. In this embodiment, a silicon oxide nitride film (composition ratio: Si=32%, O=59%, N=7%, and H=2%) having a thickness of 100 nm is formed.

Then, semiconductor layers 102 to 105 are formed on the underlying film. The semiconductor layers 102 to 105 are formed by forming a semiconductor film having an amorphous structure by a known method (sputtering, LPCVD, plasma CVD, or the like), conducting a known crystallization precessing (laser crystallization, thermal crystallization, or thermal crystallization using a catalyst such as nickel) to obtain a crystalline semiconductor film, and patterning the film into a desired shape. The semiconductor layers 102 to 105 are formed to a thickness of 25 to 80 nm (preferably, 30 to 60 nm). There is no particular limit regarding the material for the crystalline semiconductor film. However, it is preferable to form silicon or a silicon germanium alloy. In this embodiment, an amorphous silicon film of 55 nm is formed by plasma CVD, and thereafter, a solution containing nickel is held on the amorphous silicon film. The amorphous silicon film is dehydrogenated (at 500° C., for one hour), and then subjected to thermal crystallization (at 550° C., tor 4 hours). Furthermore, laser annealing is conducted for the purpose of improving crystallization, whereby a crystalline silicon film is formed. The crystalline silicon film is subjected to patterning by photolithography to form the semiconductor layers 102 to 105.

Furthermore, in the case of manufacturing a crystalline semiconductor film by laser crystallization, a pulse-oscillation type or continuous light emission type excimer laser, a YAG laser and a $YVO_4$ laser can be used. When using these lasers, laser light emitted from a laser oscillator may be condensed into a line shape by an optical system and allowed to radiate to a semiconductor film. Crystallization conditions are appropriately selected by the operator. However, when using an excimer laser, a pulse oscillation frequency is set to be 30 Hz, and a laser energy density is set to be 100 to 400 mJ/cm$^2$ (typically 200 to 300 mJ/cm$^2$). In the case of using a pulse oscillation YAG laser, the second harmonic thereof may be used, a pulse oscillation frequency may be set to be 1 to 10 kHz, and a laser energy density may be set to be 300 to 600 mJ/cm$^2$ (typically, 350 to 500 mJ/cm$^2$). Laser light condensed in a line shape with a width of 100 to 1000 µm (e.g., 400 µm) may be radiated over the entire surface of a substrate, and a line-shaped laser light overlap ratio at this time may be set to be 80 to 98%.

Then, a gate insulating film 106 is formed so as to cover the semiconductor layers 102 to 105. The gate insulating film 106 is formed of an insulating film containing silicon so as to have a thickness of 40 to 150 nm by plasma CVD or sputtering. In this embodiment, a silicon oxide nitride film (composition ratio: Si=32%, O=59%, N=7%, and H=2%) is formed to a thickness of 115 nm by plasma CVD. Needless to say, the gate insulating film is not limited to a silicon oxide nitride film, and may have a single layer or multi-layered structure of insulating films containing another silicon.

Then, as shown in FIG. 1A, a first conductive film 107a (thickness: 20 to 100 nm) and a second conductive film 107b (thickness: 100 to 400 nm) are laminated on the gate insulating film 106. In this embodiment, the first conductive film 107a made of a TaN film having a thickness of 30 nm and the second conductive film 107b made of a W film having a thickness of 370 nm are laminated thereon. The TaN film is formed by sputtering using Ta as a target in an atmosphere containing nitrogen. The W film is formed by sputtering using W as a target. The W film can also be formed by thermal CVD using tungsten hexafluoride ($WF_6$). In any case, it is required to lower a resistance in order to use the W film as a gate electrode, and it is desirable that a resistance ratio of the W film is 20 µΩcm or less. The resistance ratio of the W film can be lowered by enlarging crystal grains thereof. However, in the case where there are a number of impurity elements such as oxygen in the W film, crystallization is inhibited, and the resistance of the W film is increased. Therefore, in this embodiment, the W film is formed by sputtering using high-purity W (purity: 99.9999% or 99.99%) as a target so that no impurity may be allowed to enter in the W film from a vapor phase during the film formation, whereby a resistance ratio of 9 to 20 µΩcm can be achieved.

In this embodiment, the first conductive film 107a is made of TaN, and the second conductive film 107b is made of W. However, the present invention is not limited thereto. Both the films may be formed of an element selected from Ta, W, Ti, Mo, Al, Cu, Cr, and Nd, or an alloy material containing the element as its main component or a compound material. A semiconductor film such as a polycrystalline silicon film doped with an impurity element such as phosphorus may also be used. Furthermore, the following combination may be used: the first conductive film made of a tantalum (Ta) film and the second conductive film made of a W film; the first conductive film made of a titanium nitride (TiN) film and the second conductive film made of a W film; the first conductive film made of a tantalum nitride (TaN) film and the second conductive film made of an Al film; the first conductive film made of tantalum nitride (TaN) film and the second conductive film made of a Cu film.

Then, masks 108a to 112a made of a resist are formed by photolithography, and first etching processing for forming electrodes and wiring is conducted. The first etching processing is conducted as first and second etching conditions. In this embodiment, under the first etching condition, etching is conducted by an inductively coupled plasma (ICP) etching method, in which plasma is generated by using $CF_4$, $Cl_2$, and $O_2$ as etching gas (flow rate: 25/25/10 (sccm)) with an RF power (13.56 MHZ) of 500 W supplied to a coil-shaped electrode at a pressure of 1 Pa. As the etching gas, chlorine type gas such as $Cl_2$, $BCl_3$, $SiCl_4$, and $CCl_4$ or fluorine gas such as $CF_4$, $SF_6$, and $NF_3$, or $O_2$ can be appropriately used. Herein, a dry etching apparatus (Model E645-ICP) using ICP produced by Matsushita electric Industrial Co., Ltd. is used. An RF power (13.56 MHZ) of 150 W is also applied to the substrate side (sample stage), whereby a substantially negative self-bias voltage is applied thereto. Under the first etching condition, the W film is etched and end portions of the first conductive layer are tapered. Under the first etching condition, an etching rate with respect to W is 200.39 nm/min., an etching rate with respect to TaN is 80.32 nm/min., and a selection ratio of W with respect to TaN is about 2.5. Furthermore, under the first etching condition, a taper angle of W becomes about 26°.

Thereafter, without removing the masks 108a to 112a made of a resist, etching is conducted for about 30 seconds under the second etching condition, in which plasma is generated by using $CF_4$ and $Cl_2$ as etching gas (flow rate ratio: 30/30 (sccm)) with an RF power (13.56 MHZ) of 500 W supplied to a coil-shaped electrode at a pressure of 1 Pa. An RF power (13.56 MHZ) of 20 W is also applied to the substrate side (sample stage), whereby a substantially negative self-bias voltage is applied thereto. Under the second etching condition using a mixture of $CF_4$ and $Cl_2$ as etching gas, the W film and the TaN film are etched to the same degree. Under the second etching condition, an etching rate with respect to W is 58.97 nm/min., and an etching rate with respect to TaN is 66.43 nm/min. In order to conduct etching without leaving any residual on the gate insulating film, an etching time may be increased by about 10 to 20%.

According to the first etching processing, by appropriately prescribing the shape of a resist mask, the end portions of the first conductive layer and the second conductive layer are tapered due to the effect of a bias voltage applied to the substrate side. The angle of the taper portion may be 15 to 45°.

Thus, conductive layers 113 to 117 (first conductive layers 113a to 117a and second conductive layers 113b to 117b) of a first shape composed of first conductive layers and second conductive layers are formed by the first etching processing (FIG. 1B). The width of the first conductive layer in the channel length direction corresponds to the first width shown in above Embodiment modes. Although not shown, regions of the insulating film 106 to be a gate insulating film, not covered with the conductive layers 113 to 117 of a first shape, are etched by about 10 to 20 nm to be thin.

Without removing the resist masks, the first doping processing is conducted, whereby an impurity element providing an n-type is added to the semiconductor layers (FIG. 1C). The doping processing may be conducted by ion doping or ion implantation. Ion doping is conducted under the conditions of a dose amount of $1\times10^{13}$ to $5\times10^{15}/cm^2$ and an acceleration voltage of 60 to 100 keV. In this embodiment, doping is conducted at a dose amount of $1.5\times10^{15}/cm^2$ and an acceleration voltage of 80 keV. As the impurity element providing an n-type, an element belonging to Group XV, typically, phosphorus (P) or arsenic (As) is used. Herein, phosphorus (P) is used. In this case, the conductive layers 113 to 116 function as masks with respect to the impurity element providing an n-type, whereby high-concentration impurity regions 118 to 121 are formed in a self-alignment manner. An impurity element imparting an n-type is added to the high-concentration impurity regions 118 to 121 in a concentration of $1\times10^{20}$ to $1\times10^{21}/cm^3$.

Then, without removing the resist masks, second etching processing is conducted. Herein, etching is conducted for 25 seconds by using $SF_6$, $Cl_2$, and $O_2$ as etching gas (flow rate ratio: 24/12/24 (sccm)) with an RF power (13.56 MHZ) of 700 W supplied to a coil-shaped electrode at a pressure of 1.3 Pa to thereby generate plasma. An RF power (13.56 MHZ) of 10 W is also applied to the substrate side (sample stage), whereby a substantially negative self-bias voltage is applied thereto. In the second etching processing, an etching rate with respect to W is 227.3 nm/min., an etching rate with respect to TaN is 32.1 nm/min., and a selection ratio of W with respect to TaN is 7.1. An etching rate with respect to SiON that is the insulating film 106 is 33.7 nm/min. In the case of using $SF_6$ as the etching gas, a selection ratio with respect to the insulating film 106 is high, so that a decrease in a film thickness can be suppressed.

The taper angle of the second conductive layer (W) becomes 70° in the second etching processing. Furthermore, in the second etching processing, second conductive layers 122b to 126b are formed. On the other hand, the first conductive layers are hardly etched to form first conductive layers 122a to 126a. In addition, the masks from resist 108a to 112a are changed its shape into masks from resist 108b to 112b by the second etching processing (FIG. 1D). Although not shown, actually, the width of the first conductive layers is narrowed by about 0.15 μm (i.e., about 0.3 μm over the total line width) compared with the state before the second etching processing. Furthermore, the width of the second conductive layer in the channel length direction corresponds to the second width shown in Embodiment modes.

The electrode formed by the first conductive layer 122a and the second conductive layer 122b becomes the n-channel TFT type gate electrode of the CMOS circuit formed in the following steps. The electrode formed by the first conductive layer 125a and the second conductive layer 125b becomes an electrode of the holding capacitor formed in the following steps.

It is also possible to use $CF_4$, $Cl_2$, and $O_2$ as the etching gas in the second etching processing. In this case, etching may be conducted by generating plasma under a flow rate ratio of 25/25/10 (sccm) with an RF power (13.56 MHZ) of 500 W supplied to a coil-shaped electrode at a pressure of 1 Pa. An RF power (13.56 MHZ) of 20 W is also applied to the substrate side (sample stage), whereby a substantially negative self bias voltage is applied thereto. In the case of using $CF_4$, $Cl_2$, and $O_2$, an etching rate with respect to W is 124.62 nm/min., an etching rate with respect to TaN is 20.67 nm/min., and a selection ratio of W with respect to TaN is 6.05. Thus, the W film is selectively etched. Furthermore, in this case, the regions of the insulating film 106, not covered with the conductive layers 122 to 126 of a first shape, are etched by about 50 nm to be thin.

Then, after removing the resist masks, second doping processing is conducted to obtain a state shown in FIG. 2A. Doping is conducted using the second conductive layers 122b to 125b as masks with respect to an impurity element so that the impurity element is added to the semiconductor layers below the taper portions of the first conductive layers. In this embodiment, phosphorus (P) is used as the impurity element, and plasma doping is conducted under the doping conditions of a dose amount of $1.5\times10^{14}/cm^2$, an acceleration voltage of 90 keV, an ion current density of 0.5 μA/cm², phosphine ($PH_3$) 5% hydrogen dilute gas, and a flow rate of 30 sccm. Thus, low-concentration impurity regions 127 to 136 are formed so as to be overlapped with the first conductive layers in a self-alignment manner. The concentration of phosphorus (P) added to the low-concentration impurity regions 127 to 136 is $1\times10^{17}$ to $1\times10^{19}/cm^2$, and the low-concentration impurity regions 127 to 136 have a concentration gradient in accordance with the thickness of the taper portions of the first conductive layers. In the semiconductor layer overlapped with the taper portion of the first conductive layer, an impurity concentration (P concentration) decreases gradually from the end of the taper portion of the first conductive layer inwardly. More specifically, in the second doping processing, a concentration distribution is formed. Furthermore, an impurity element is also added to the high-concentration impurity regions 118 to 121 to form high-concentration impurity regions 137 to 145.

In this embodiment, the width (in the channel length direction) of the taper portion is preferably at least 0.5 μm or more up to a range of 1.5 μm to 2 μm. Therefore, although influenced by a thickness, the width in the channel length direction of the low-concentration impurity region having a concentration gradient is not beyond a range of 1.5 μm to 2 μm, either. Herein, although the high-concentration impurity regions and the low-concentration impurity regions are shown separately. Actually, there is no clear border therebetween and regions having a concentration-gradient are formed. Similarly, there is no clear border between the channel forming regions and the low-concentration impurity regions.

Then, the region other than the pixel portion 94 are covered by the mask 146 and third etching processing is conducted. The metal plate, the glass plate, the ceramic plate and the ceramic glass plate can be used to the mask 146. The upper view of the mask 146 is shown in FIG. 16. In the third etching processing, taper portions of the first conductive layers which are not overlapped with the mask 146 are selectively conducted dry etching to eliminate regions overlapped with impurity regions of the semiconductor layers. The third etching processing is conducted by using an ICP etching apparatus, using, as etching gas, $Cl_3$ having a high selection ratio with respect to W. In this embodiment, etching is conducted for 30 seconds by generating plasma, using $Cl_3$ with a flow rate ratio of 80 (sccm), with an RF power (13.56 MHZ) of 350 W supplied to a coil-shaped electrode at a pressure of 1.2 Pa. An RF power (13.56 MHZ) of 50 W is also supplied to the substrate side (sample stage), whereby a substantially negative self-bias voltage is applied thereto. In the third etching, first conductive layers 124c and 126c are formed (FIG. 2B).

An example of conducting a third etching process is shown in this embodiment. The third etching process is not conducted if there is no need to conduct.

Next, the semiconductor layers to be active layers of n-channel TFTs are covered with resist masks 147 formed by third photolithography. Under this condition, third doping processing is conducted. In the third doping processing, p-type impurity regions 148 to 150 (high-concentration impurity regions and low-concentration impurity regions) are formed in which an impurity element providing conductivity (p-type) opposite to the above-mentioned conductivity (n-type) is added to the semiconductor layers to be active layers of p-channel TFTs. Since the semiconductor layers are doped with the impurity element by allowing the impurity element to pass through the taper portions, the p-type low-concentration impurity regions have a concentration gradient similar to that of the n-type low-concentration impurity regions (FIG. 2C). Using the first conductive layers as masks with respect to an impurity element, an impurity element providing a p-type is added to form p-type impurity regions 148 to 150. In this embodiment, the p-type impurity regions 148 to 150 are formed by ion doping using diborane ($B_2H_6$). In the first and second doping processing, phosphorus is added to the impurity regions in different concentrations. However, by conducting doping processing so that the concentration of boron becomes $2\times10^{20}$ to $2\times10^{21}/cm^3$ in either region, whereby they function as a source region and a drain region of a p-channel TFT. Thus, there is no problem.

Furthermore, in the case of using the condition of preventing a decrease in film thickness in the second etching processing (for example, in the case of using $SF_6$ as etching gas), in order to facilitate doping of boron, etching (reactive ion etching (RIE) using $CHF_3$ gas) for thinning the insulating film 106 may be conducted before the third doping processing.

Then, as shown in FIG. 2D, an impurity element added to each semiconductor layer is activated. The activation is conducted by thermal annealing using an annealing furnace. Thermal annealing may be conducted at 400° C. to 700° C., typically 500° C. to 550° C. in a nitrogen atmosphere having an oxygen concentration of 1 ppm or less, preferably 0.1 ppm or less. In this embodiment, activation is conducted by heat treatment at 550° C. for four hours. Instead of thermal annealing, laser annealing or rapid thermal annealing (RTA) can be applied.

Though not shown in the drawing, the impurity elements are diffused through the activation treatment to thereby erase the border between the n-type impurity regions (low concentration) and the impurity regions (high concentration) almost completely.

In this embodiment, at the same time as the above-mentioned activation, nickel used as a catalyst during crystallization is gettered in the impurity region containing phosphorus of high concentration, whereby a nickel concentration in the semiconductor layer mainly to be a channel forming region is reduced. In a TFT having a channel forming region thus produced, an OFF current value is decreased and crystallinity is satisfactory. Therefore, a high electric field effect mobility is obtained, and satisfactory characteristics can be achieved.

Next, heat treatment is conducted in a hydrogen atmosphere to hydrogenate the semiconductor layers. Plasma hydrogenation (using hydrogen excited by plasma) can be used as another method of hydrogenation.

In the case of using laser annealing as the activation, it is desirable that laser light such as excimer laser and YAG laser is radiated after the above hydrogenation.

Figure 7A:
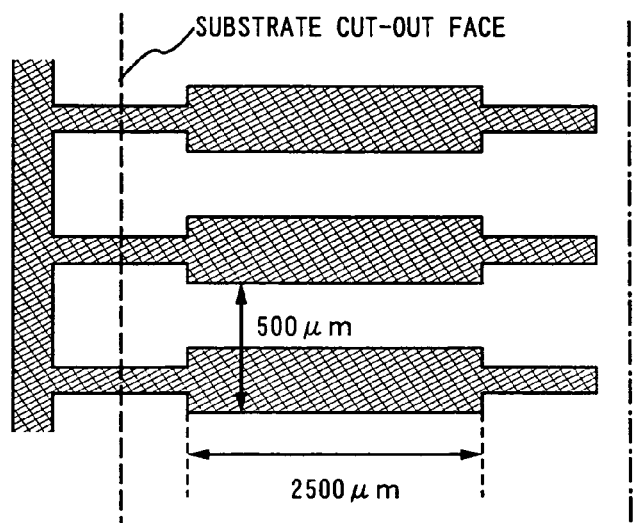
FIGS. 7A-7B are diagrams for showing a terminal portion of the active matrix type liquid crystal display device.
Figure 7B:
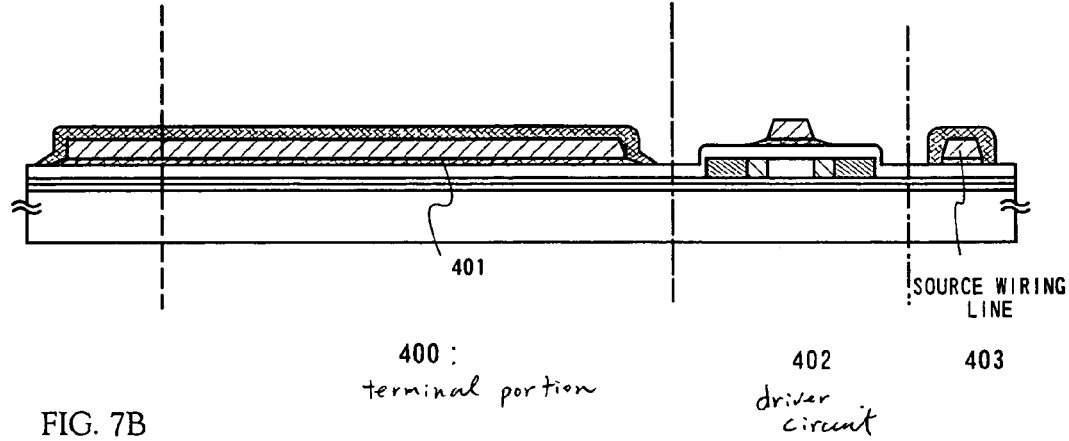

Next, a plating process operation is carried out with respect to both the surface of the source wiring line 126 of the pixel portion 403, and the electrode surface of the terminal portion. FIG. 7A shows an upper view of the terminal portion just after the plating process operation is carried and FIG. 7B indicates a sectional view thereof. In FIGS. 7A-7B, reference numeral 400 indicates a terminal portion, and reference numeral 401 represents an electrode which is connected to an external terminal. Also, for the sake of simple explanations, FIGS. 7A-7B indicates one TFT provided in the drive circuit portion 402, and only the source wiring line 126 is indicated in the pixel portion 403. In this embodiment, the plating process operation was carried out by employing the copper plating fluid (manufactured by EEJA: "MICROFAB Cu2200"). As indicated in one example of FIG. 10, when this plating process operation is carried out, either wiring lines or electrodes, which will be plated, are coupled to each other by employing a dummy pattern so as to become the same potentials. When the substrate is cut out in the succeeding step, the adjoining electrodes are cut out so as to be separated from each other. Alternatively, a short-circuit ring may be formed by using the dummy pattern.

Next, a first interlayer insulating film 155 capable of covering the source wiring line of the pixel is formed. As this first interlayer insulating film 155, an inorganic insulating film mainly containing silicon may be employed.

Next, a second interlayer insulating film 156 made of an organic insulating material is formed on the first interlayer insulating film 155. In this embodiment, an acrylic resin film having a thickness of 1.6 μm was formed.

Next, a pixel electrode 170 made of a transparent conductive film is patterned on the second interlayer insulating film by employing a photomask. As the transparent conductive film which constitutes the pixel electrode 170, for instance, ITO (alloy made of indium oxide and tin oxide), an alloy made of indium oxide and zinc oxide ($In_2O_3$—ZnO), zinc oxide (ZnO), and the like may be employed.

Next, while the second insulating film is selectively etched by employing the photomask, a contact hole which is reached to the respective impurity regions (137, 138, 148, 149, 151, 153, 150) is formed; another contact hole which is reached to the source wiring line 126 of the pixel portion is formed; and another contact hole which is reached to the gate electrode 124 is formed; and also, another contact hole which is reached to the electrode 125b is formed.

Next, electrodes 157 to 160 which are electrically connected to the respective impurity regions (137, 138, 149, 148), and a source wiring line of the drive circuit are formed;

electrodes 169 and 163 which are electrically connected to both the impurity region 150 and the impurity region 153 are formed; an electrode (connection electrode) 161 is formed which electrically connects the impurity region 151 which constitutes a source region to the source wiring line 126 of the pixel portion; a gate wiring line 162 which is electrically connected to the gate electrode 124 is formed; and also a capacitor wiring line which is electrically connected to the electrode 125*b* is formed.

Also, a pixel electrode 170 is electrically connected to the impurity region 153 of th pixel TFT 206 by such an electrode 163 which is made in contact-with and is overlapped with this pixel electrode 170. Also, this pixel electrode 170 is electrically connected to the impurity region 150 of the holding capacitor 207 by another electrode 169 which is made in contact with and is overlapped with the pixel electrode 147.

Also, in this embodiment, such an example is shown that the electrodes 169 and 163 are formed after the pixel electrodes have been formed. Alternatively, the contact holes are formed and the electrode is formed, and thereafter, the pixel electrode made of the transparent conductive film may be formed in such a manner that this pixel electrode is overlapped with this electrode.

Also, the impurity elements capable of applying the p type are added to the respective impurity regions 135, 136, 144, 145, which may function as one electrode of a holding capacitor 207. This holding capacitor 207 is formed by electrodes 125*a* and 125*b* connected to the capacitor wiring line, and also by a semiconductor layer, while an insulating film 106 is used as a dielectric member.

While the above-described manufacturing method is carried out, both the drive circuit 201 and the pixel portion 205 can be formed on the same substrate. The drive circuit 201 contains the CMOS circuit 202 constructed of the n-channel type TFT 203 and the p-channel type TFT 204. The pixel portion 205 contains the pixel TFT 206 made of the n-channel TFT and the holding capacitor 207 (see FIG. 3B). It should be noted that such a substrate is referred to as an "active matrix substrate" in this specification, for the sake of convenience.

Figure 4:
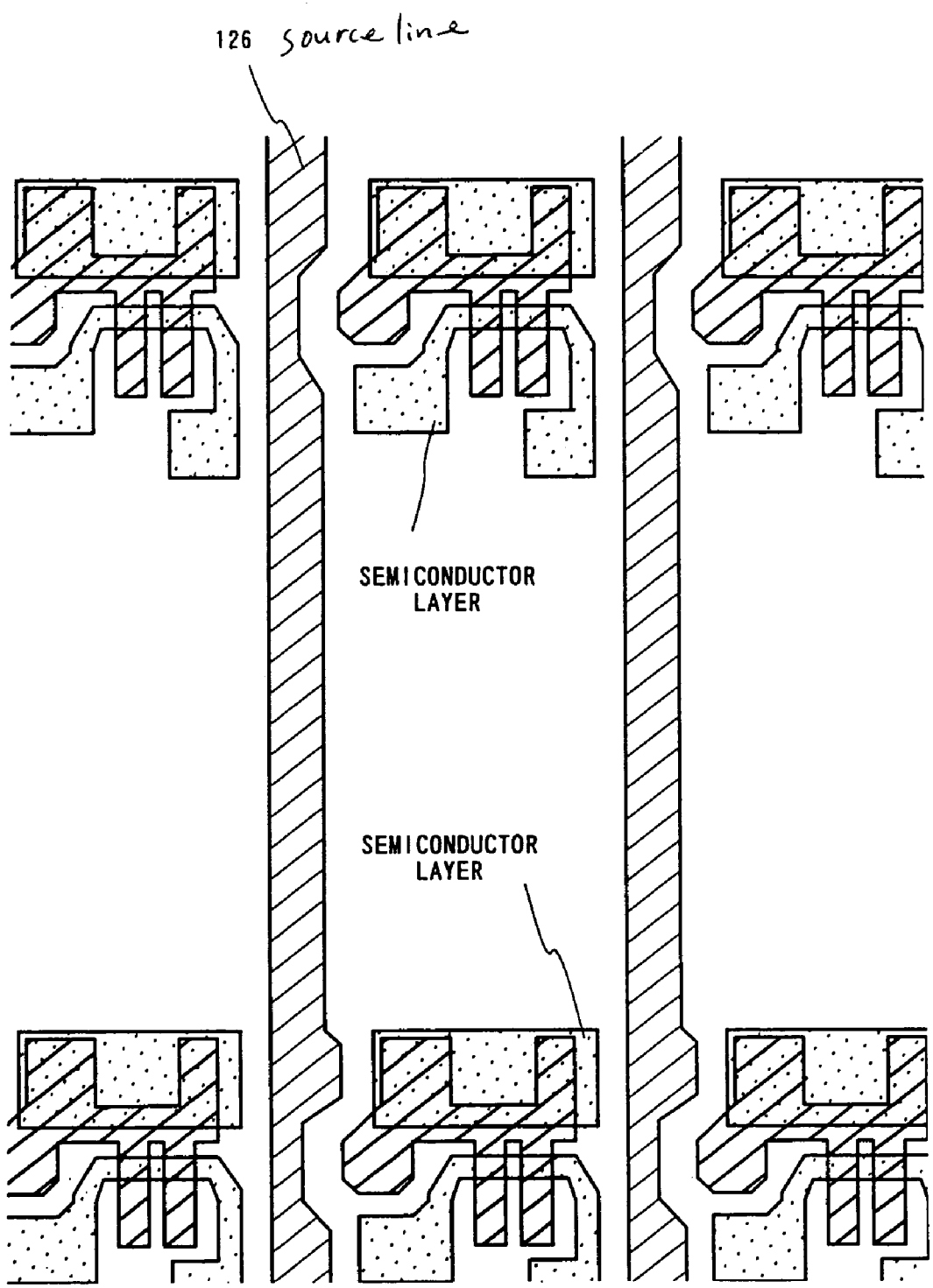
FIG. 4 is a diagram for showing an upper view of a pixel of the AM-LCD.
Figure 5:
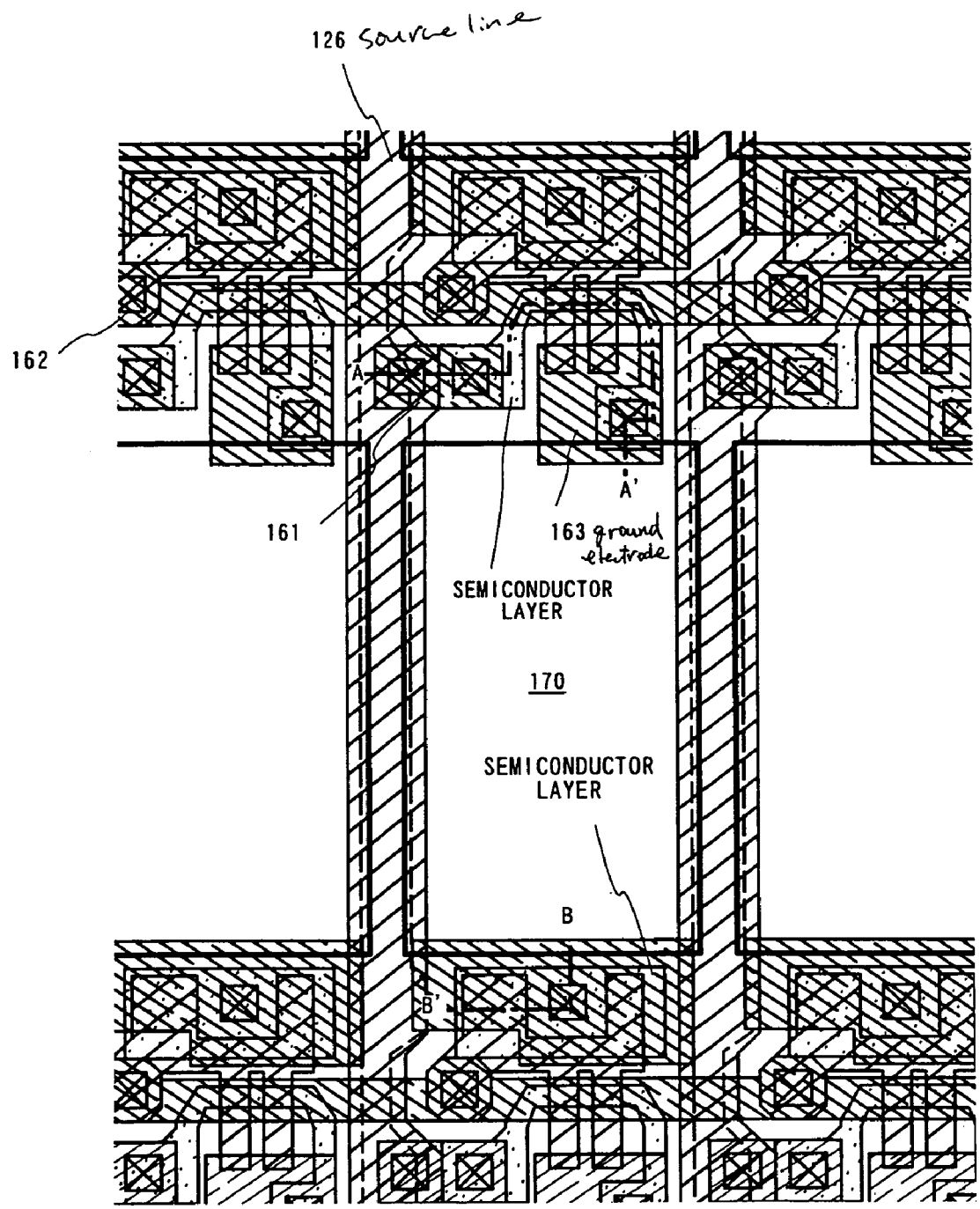
FIG. 5 is a diagram for showing an upper view of a pixel of the AM-LCD.

FIG. 5 is an upper view for indicating the pixel portion of the active matrix substrate manufactured in this embodiment. It should also be noted that the same reference numerals shown in FIG. 3B are employed as those for indicating the same, or similar elements in FIG. 4 and FIG. 5. The dotted line A-A' shown in FIG. 3B corresponds to a sectional view, taken along a dotted line A-A' in FIG. 4. The dotted line B-B' shown in FIG. 3B corresponds to a sectional view taken along a dotted line B-B' of FIG. 5. Also, FIG. 4 is an upper view of the active matrix substrate obtained just after the source wiring line 126 of the pixel is formed.

The pixel structure of this embodiment is manufactured in such a manner that while a black matrix is not employed, an edge portion of the pixel electrode 170 is arranged to be overlapped with the source wiring line 126 in order to shield spaces among the pixel electrodes.

Also, in accordance with the steps shown in this embodiment, a total number of photomasks which are required to manufacture the active matrix substrate could become six.

Figure 6:
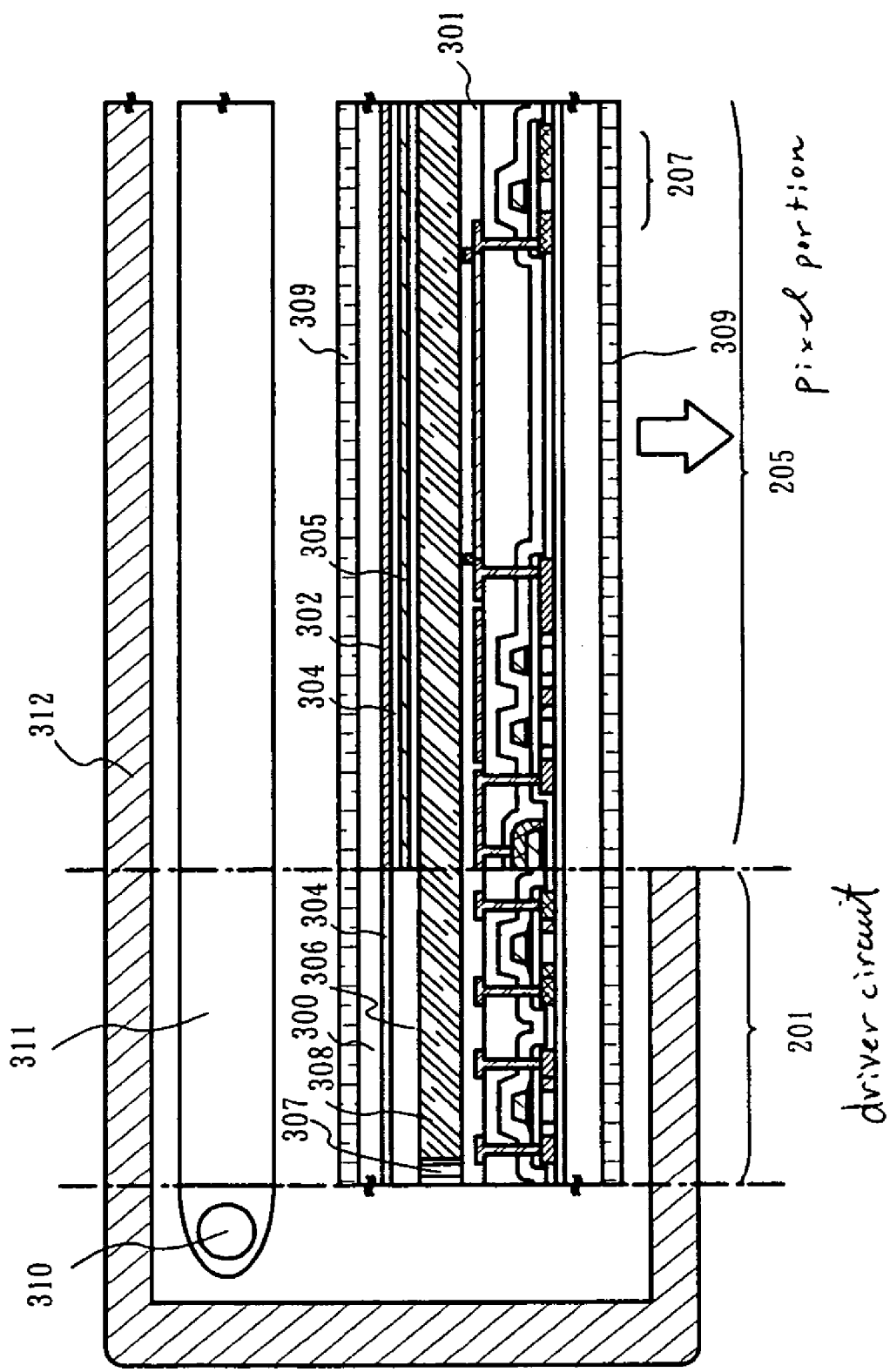
FIG. 6 is a diagram for indicating a sectional structure of an active matrix type liquid crystal display device according to an embodiment of the present invention.

A description will now be made of steps by which an active matrix type liquid crystal display device may be manufactured from this active matrix substrate obtained by the above method. FIG. 6 is used to explain this manufacturing steps.

After the active matrix substrate formed under such a condition of FIG. 3B has been obtained, an orientation film 301 is formed on this active matrix substrate of FIG. 3B, and then, the resultant active matrix substrate is processed by a rubbing process operation. It should also be noted that in this embodiment, before the orientation film 301 is formed, a spacer having a pillar shape was formed at a desirable position by patterning the organic resin film such as an acrylic resin film in order to maintain an interval of the substrate. Alternatively, a spacer having a spherical shape may be distributed on an entire surface of the substrate instead of the pillar-shaped spacer.

Next, a counter substrate 300 is prepared. A color filter is provided on this counter substrate. In this color filter, a colored layer 302 and a light shielding layer 303 are arranged in correspondence with each of the pixels. A flatting film 304 capable of covering this color filter and the light shielding layer was provided. Next, a counter electrode 305 made of a transparent conductive film was formed on the flatting film 304 in the pixel portion, and another orientation film 306 was formed on an entire surface of the counter substrate, and then, the resultant substrate was processed by the rubbing process operation.

Then, both the active matrix substrate on which the pixel portion and the drive circuit are formed, and the counter substrate 300 are adhered to each other by using a sealing material 307. While a filler is mixed into the sealing material 307, these two substrates are adhered to each other by maintaining an uniform interval by this filler and the pillar-shaped spacer. Thereafter, a liquid crystal material 308 is injected into the space between both the substrates so as to completely seal these substrates by using sealing agent (not shown). As the liquid crystal material 308, the known liquid crystal material may be employed. Then, either the active matrix substrate or the counter substrate is cut out so as to form a desirable shape. In this case, the dummy pattern which is provided so as to perform the plating process operation is cut out.

FIG. 8A is an upper view of the active matrix liquid crystal display device after being cut out and FIG. 8B is a sectional view of this liquid crystal display device, taken along a dotted line D-D'. In FIGS. 8A-8C, reference numeral 400 shows a terminal portion, and reference numeral 401 indicates an electrode which is connected to the external terminal. Also, for the sake of simplicity, one TFT of the drive circuit portion 402 is shown and only the source wiring line 126 is shown in the pixel portion 403 in FIGS. 8A-8C. Also, the electrode 401 is electrically connected to wiring lines 157 to 160. In the terminal portion 40, a portion of the electrode 401 which is processed by the plating process operation is exposed, and a transparent conductive film 404 is formed.

Furthermore, a polarization plate 309 and the like were properly provided by using the technique known in this field. Then, an FPC is adhered to the exposed portion within the terminal portion by employing the known technique. FIG. 8C indicates a sectional view of the liquid crystal display device after the FPC 405 has been adhered thereto.

Referring now to an upper view of FIG. 9, a construction of the liquid crystal module manufactured in accordance with the above-explained manner will be described. It should be noted the same reference numerals shown in FIG. 6 will be employed as those for denoting the same components in FIG. 9.

Figure 9:
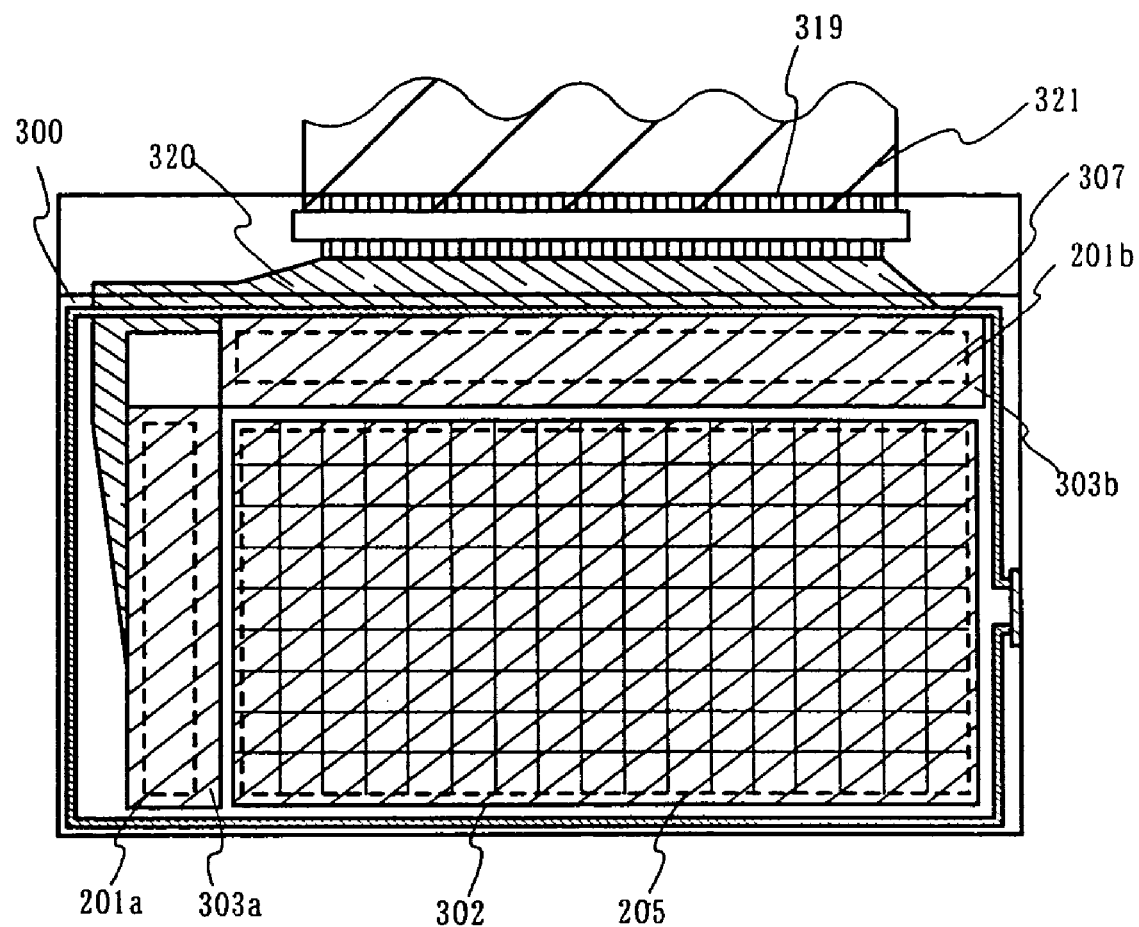
FIG. 9 is a diagram for representing an outer view of a liquid crystal module according to an embodiment of the present invention.

In the upper view of the liquid crystal module shown in FIG. 9, such an active matrix substrate is adhered via the sealing material 370 to the counter substrate 300 where the color filter is provided. On this active matrix substrate, there are formed the pixel portion, the drive circuit, an external input terminal 319 used to adhere an FPC (Flexible Printed Circuit) 321, a wiring line 320 used to connect the external input terminal 319 to input portions of the respective circuits.

A light shielding layer 303*a* is provided on the side of the counter substrate in such a manner that this light shielding layer 303a is overlapped with the gate-wiring-line-sided drive circuit 201a. Another light shielding layer 303b is provided on the side of the counter substrate in such a manner that this light shielding layer 303a is overlapped with the source-wiring-line-sided drive circuit 201b. Also, in the color filter 302 which is provided on the side of the counter substrate on the pixel portion 205, the light shielding layers and the colored layers made of the red (R) color, the green (G) color, and the blue (B) color are provided in correspondence with the respective pixels. When the liquid crystal module actually displays thereon an image, a color representation is formed by three colors constructed of the colored layer of red (R) color, the colored layer of green(G) color, and the colored layer of blue (B) color. It is so assumed that these colored layers of the respective colors may be arbitrarily arranged.

In this case, the color filter 302 is provided on the counter substrate so as to realize the color display mode, but the present invention is not limited thereto. When an active matrix substrate is manufactured, a color filter may be formed on this active matrix substrate.

Also, the light shielding layer 303 is provided between the adjoining pixels in the color filter so as to shield the light at the place other than the display region. Alternatively, a light shielding layer may also be provided at such a region capable of covering the drive circuit. Alternatively, since the region capable of covering the drive circuit is covered by a cover when the liquid crystal display device is assembled as a display unit of an electronic appliance at a succeeding stage, such a light shielding layer may not be especially provided. Also, when the active matrix substrate is manufactured, the light shielding layer may be formed on the active matrix substrate.

Also, an FPC 321 constituted by a base film and a wiring line is adhered to the external input terminal by employing anisotropic conductive resin. Furthermore, this FPC 321 is furthermore reinformed by a reinforcement plate so as to emphasize a mechanical strength.

Also, in this example, all of the drive circuits are formed on the substrate. Alternatively, several pieces of ICs may be employed in a portion of the drive circuits.

The liquid crystal module manufactured in the above-described manner may be employed as display units of various sorts of electronic appliances. When this liquid crystal module is assembled, a back light 310 and a light conducting plate 311 are provided, which is covered by a cover 312, an active matrix type liquid crystal display device indicated in FIG. 6 may be accomplished. It should also be noted that the cover 312 is adhered to the liquid crystal module by employing adhesive agent and organic resin. Also, when the substrate is adhered to the counter substrate, both the substrate and the counter substrate may be surrounded by a frame, and a space between the substrate and this frame is filled with organic resin so as to adhere this substrate to the frame.

Embodiment 2

The present invention is featured by that a source wiring line of a pixel portion is formed by way of such a different step from that of a source wiring line of a drive circuit. In this embodiment, a different point from that of the prior art will now be explained with reference to FIG. 10. It should be understood that in FIG. 10, only three pieces of source wiring lines 91 of the pixel portion, and only three pieces of gate wiring liens 92 are displayed for the sake of simplicity. Also, the source wiring lines 91 of the pixel portion are made of band shapes which are located in parallel to each other, and an interval among these source wiring lines 91 is equal to a pixel pitch.

Figure 10:
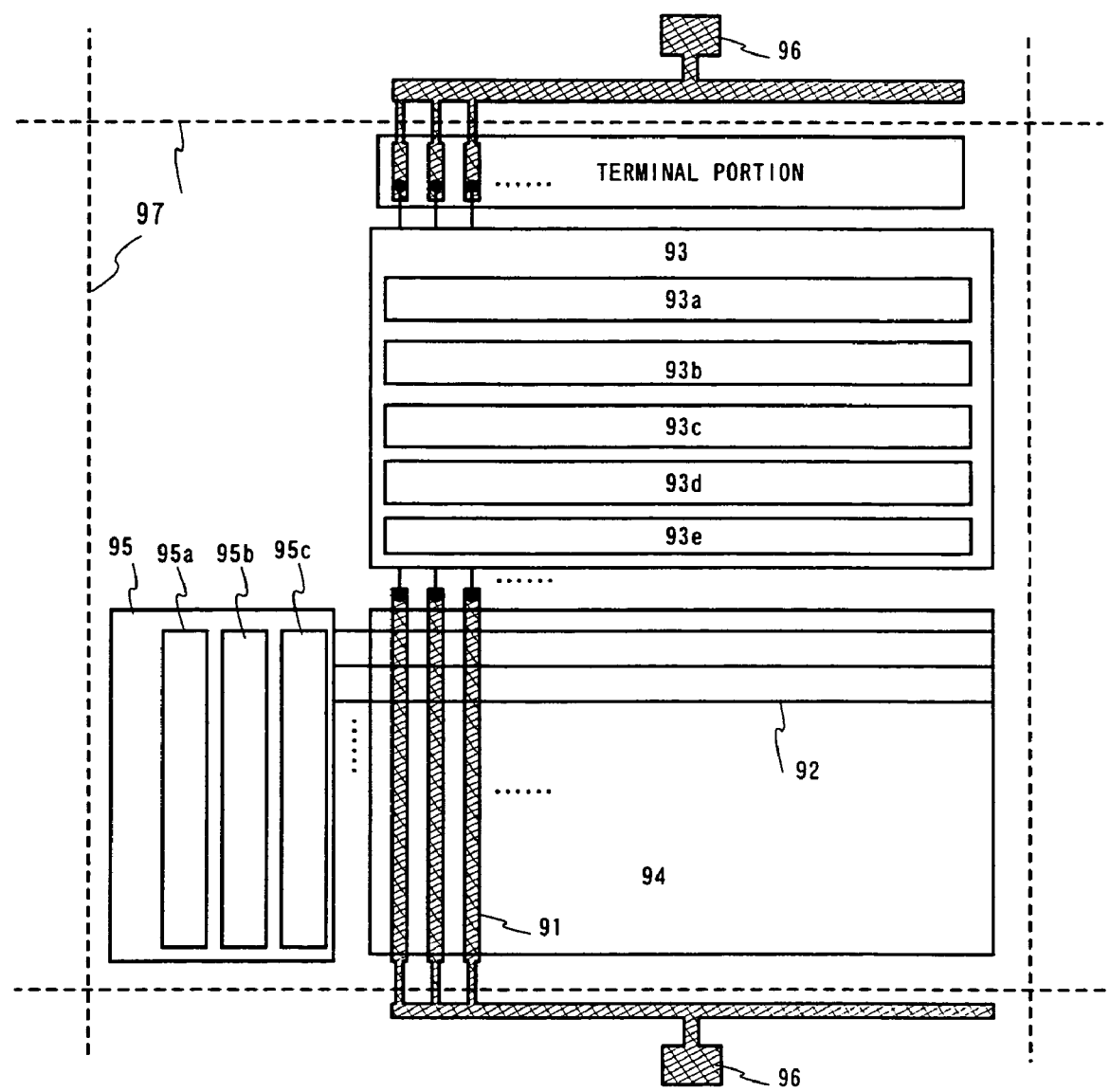
FIG. 10 is a diagram for showing an upper view of the liquid crystal module.

It should also be noted that FIG. 10 is a block construction used to realize a digital drive. In this embodiment, this block construction contains a source-sided drive circuit 93, a pixel portion 94, and a gate-sided drive circuit 95. It should also be noted that an expression "drive circuit" implies such a general term involving a gate-sided drive circuit and a source-sided drive circuit.

The source-sided drive circuit 93 is provided with a shift register 93a, a latch (A) 93b, a latch (B) 93c, a D/A converter 93d, and a buffer 93e. Also, the gate-sided drive circuit 95 is provided with a shift register 95a, a level shifter 95b, and a buffer 95c. Also, a level shifter circuit may be provided between the latch (B) 93c and the D/A converter 93d, if necessary.

Also, in this embodiment, as represented in FIG. 10, a contact portion is present between the source-sided drive circuit 93 and the pixel portion 94. This is because the source wiring lines of the source-sided drive circuit and the source lipe 91 of the pixel portion are formed in the different processes. In accordance with the present invention, the source wiring lines of the pixel portion is formed in accordance with the different process from the process for the source wiring lines of the source-sided drive circuit in order that the plating process operation is carried out with respect to the wiring line using the same material as that of the gate electrode, and then, this plated wiring line is covered by a material having a low resistance value.

Also, in order to perform the plating process operation, all of the source wiring lines of the pixel portion are connected to each other by employing a wiring line pattern in such a manner that all of these source lines become the same potential, and an electrode 96 for performing a plating process operation is provided. Also, the terminal portion are similarly connected to each other by employing a wiring line pattern, and an electrode for executing a plating process operation is provided. In FIG. 10, the electrodes used to perform the plating process operation are separately provided. Alternatively, while the source wiring lines are connected by the wiring pattern, the connected source wiring lines may be processed by the plating process operation by a single electrode within one time. Also, a dotted line shown in FIG. 10 constitutes a cut-out line 97 of the substrate, and indicates such a place which is cut out after the plating process operation has bee performed.

Also, a pixel portion 94 contains a plurality of pixels, and TFT elements are provided within these plural pixels. Also, in the pixel portion 94, a large number of gate wiring lines which are connected to the gate-sided drive circuits are provided in parallel to each other. Also, the terminal portion is preferably covered by a material having a low resistance value, while plating process operation is carried out with respect to an electrode with employment of the same material as that of the gate electrode.

Alternatively, a gate-sided drive circuit may also be provided at the opposite side of the gate-sided drive circuit 95, while sandwiching the pixel portion 94.

Also, in the case that the drive circuit is driven in the analog manner, a sampling circuit may be provided instead of the latch circuit.

It should also be noted that this embodiment 2 may be combined with the embodiment 1.

Embodiment 3

In the embodiment 1, such an example is indicated. That is, the taper portion is selectively etched away. In this embodiment 3, no etching process operation is carried out. It should be understood that since only a pixel portion of this embodiment 3 is different from the embodiment 1, only such a pixel portion is indicated in FIGS. 11A-11B.

This embodiment 3 is such an example that the third etching process operation of FIG. 2B of the embodiment 1 is not carried out. In FIG. 11A, a gate electrode of a pixel TFT 709 forms a pixel electrode 700 constructed of a transparent conductive film.

In FIG. 11A, a structure of the gate electrode is different from the gate electrode structure of the embodiment 1, and the first conductive layers 707 and 708 own taper potions. As a result, the first conductive layer 707 is overlapped with the impurity region, while sandwiching the insulating film.

It should be noted that the first conductive layers 707 and 708 having the taper portions correspond to the first conductive layer 124a of the embodiment 1. Note, reference numeral 701 indicates a source wiring line; 720, a gate wiring line.

Also, FIG. 11B shows such an example that the resulting liquid crystal module is made of a triple gate structure. In FIG. 11B, the first conductive layer 804 is overlapped with impurity regions 803 and 805, while sandwiching an insulating film. Also, a first conductive layer 807 is overlapped with impurity regions 806 and 808, while sandwiching an insulating film, and a first conductive layer 810 is overlapped with impurity regions 809 and 811, while sandwiching an insulating film. Note, reference numeral 801 indicates a source wiring line (by the planting process); 820, a gate wiring line.

Since the triple gate structure is employed in this embodiment 3, the OFF-current can be reduced. Also, since the width of the gate electrode is made narrow, for example, 1.5 μm, the OFF-current may be further reduced.

It should also above noted that this embodiment 3 may be freely combined with either the embodiment 1 or the embodiment 2.

Embodiment 4

The embodiment 1 shows such an example that the active matrix substrate used in the transmission type liquid crystal display device is formed. This embodiment 4 indicates an example of a reflection type liquid crystal display device. It should be understood that since only a pixel portion of this embodiment 4 is different from the embodiment 1, only such a pixel portion is indicated in FIG. 12.

As a substrate, a glass substrate, a quartz substrate, and a plastic substrate may be employed. Furthermore, since this embodiment 4 corresponds to the reflection type liquid crystal display device, there is no specific limitation. For instance, a silicon substrate, a metal substrate, or a stainless steel substrate where an insulating film is formed on a surface thereof may be alternatively employed.

Figure 12:
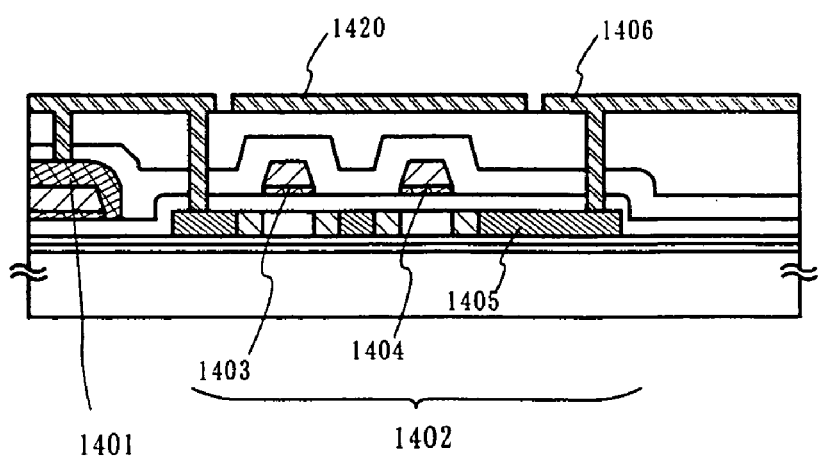
FIG. 12 is a diagram for showing a sectional view of a pixel portion of the liquid crystal module.

FIG. 12 is such an example that while a plating process operation is carried out in accordance with the embodiment 1 so as to obtain a source wiring line 1401, after a second interlayer insulating film is formed, the resultant substrate is, patterned by employing a photomask to form a contact hole, and then, the respective electrodes, a gate wiring line, and a pixel electrode 1406 are formed. The pixel electrode 1406 is electrically connected to an impurity region 1405. As materials of these electrodes and the pixel electrode 1406, such materials having superior reflection characteristics may be employed, e.g., either a film mainly containing Al. (aluminum), or Ag (silver) or a stacked layer film of these materials may be used. In FIG. 12, the pixel TFT 1402 owns a double gate structure, and also has two sets of channel forming regions. These channel forming regions are overlapped with each other, while sandwiching the gate electrodes 1403 and 1404, and the insulating film. Note, reference numeral 1420 indicates a gate wiring line.

In accordance with the method for manufacturing the structure of FIG. 12, since the pixel electrodes and the gate wiring lines can be manufactured at the same time, a total number of photomasks required to manufacture the active matrix substrate could be reduced to 5.

Embodiment 5

Figure 13A:
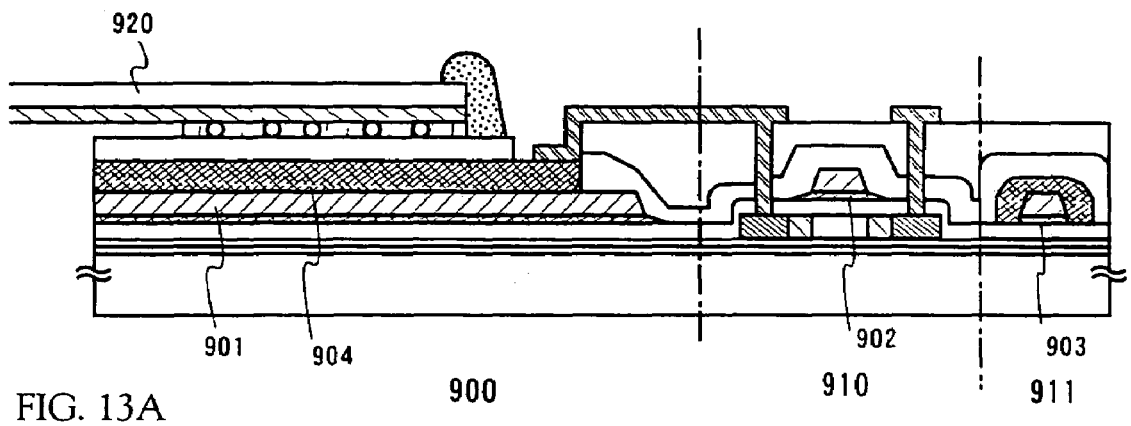
FIGS. 13A-13C are diagrams for showing a terminal portion of the liquid crystal module.
Figure 13B:
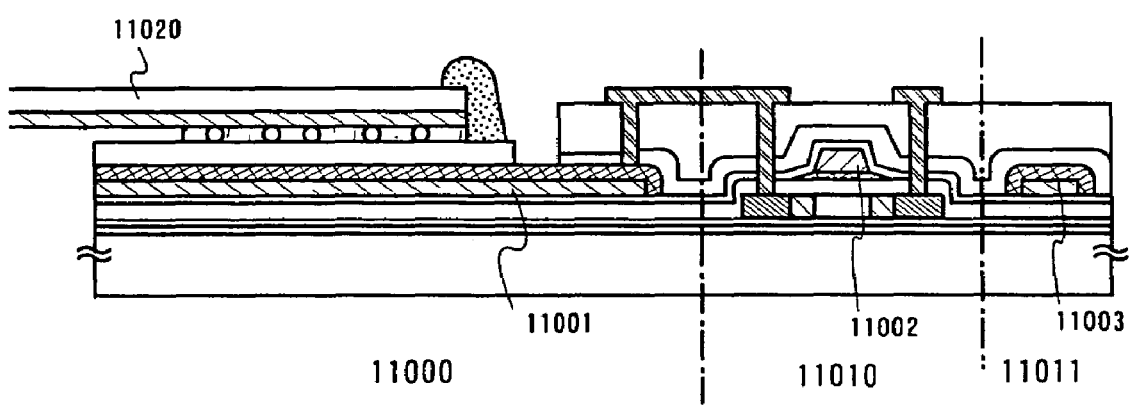
Figure 13C:
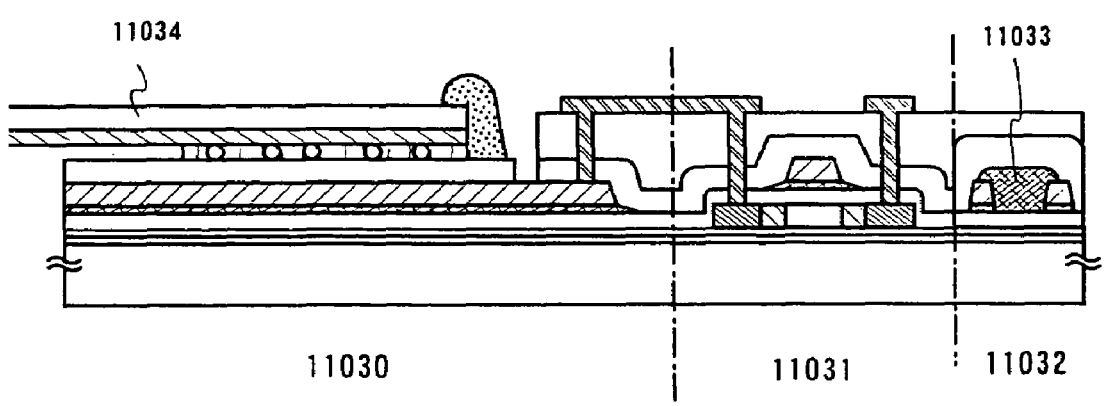

FIGS. 13A-13C show an example of an embodiment 5 in which a source wiring line is formed by a different step from that of the embodiment 1.

FIG. 13A represents such an example that after a source wiring line 903 of a pixel portion 911 is processed by a plating process operation, an interlayer insulating film is formed, and a contact hole is formed in this interlayer insulating film, and thereafter, a terminal portion 900 is processed by a plating process operation.

First, an electrode 901 of the terminal portion 900 is formed at the same step as that of a gate electrode 902 of a drive circuit portion 910. A source electrode 903 is formed at the same step as this electrode. First, only the source wiring line 903 of the pixel portion 911 is selectively processed by a plating process operation. Subsequently, an interlayer insulating film is formed and a contact hole is formed. When this contact hole is formed, a portion of the electrode 901 of the terminal portion 900 is exposed. Next, only such an exposed region of the electrode 901 of the terminal portion 900 is processed by a plating process operation, so that a plated film 904 is formed. Thereafter, an extraction wiring line, a source wiring line, and a drain wiring line are formed. Subsequently, a structure shown in FIG. 13A may be formed in accordance with the succeeding steps of the embodiment 1.

It should be noted that the activation of the impurity elements contained in the semiconductor layer may be preferably carried out before the plated film 904 is formed. Note, reference numeral 920 indicates an FPC.

Also, similar to the embodiment 1, when the plating process operation is carried out, the wiring lines and the electrodes, which will be plated, are connected to each other by employing dummy patterns in such a manner that the potentials of these wiring lines, or the electrodes are made equal to each other. When the substrate is cut out at the later step, the mutual electrodes are cut out so as to be separated from each other. Alternatively, a short-circuit ring may be formed by using these dummy patterns.

FIG. 13B indicates such an example that a plating process operation is carried out at a step different from the step FIG. 13A. This embodiment corresponds to such an example that when a gate electrode 11002 is formed, a source wiring line 11003 is not formed at the same time.

After an insulating film capable of protecting the gate electrode 11002 has been formed, while the impurity elements added to the respective semiconductor layers are activated, both a source wiring line 11003 of a pixel portion 11011 and an electrode 11001 of a terminal portion 11000 are formed at the same time on the insulating film by executing a photolithography step. This wiring line and the electrode are made of a metal material having a low resistance value (typically known as metal materials mainly containing aluminum, silver, and copper). As previously described, since the source wiring line 11003 of the pixel portion 11011 is formed by employing such a metal material having a low resistance value, even when the area of the pixel portion is increased, the liquid crystal module can be sufficiently driven. Also, in order to reduce a total number of masks, the source wiring line may be formed by way of a printing method.

Next, while a plating process operation (electrolytic plating method) is carried out, a metal film is formed on both a surface of the source wiring line 11003 of the pixel portion 11011, and also a surface of the electrode 11001 of the terminal portion 11000. Subsequently, such a structure shown in FIG. 13B may be formed in accordance with the embodiment 1 in the succeeding steps.

FIG. 13C indicates such an example that a source wiring line is formed at a step different from the step shown in FIG. 13A. Note, reference numeral 11020 indicates an FPC.

In this embodiment, the source wiring line is formed by executing a printing method. A conductive layer was formed in order to improve positional precision of the source wiring line 11033 of the pixel portion 11032.

In this embodiment, conductive layers were formed at the same steps as those of the gate electrode. Next, while the gate electrode was not covered by the insulating film, the impurity element was activated. As the activation process, for instant, since thermal annealing operation was carried out under reduced pressure within inactive atmosphere, it could suppress that the gate electrode owns the high resistance value due to oxidation of the conductive layers. Subsequently, a source wiring line was formed by employing a printing method in order to embed a space between the conductive layers. Also, since the conductive layer is formed along the source wiring line, it is possible to avoid the line disconnection which may occur in the printing method (screen printing method). Subsequently, such a structure shown in FIG. 13C may be formed in accordance with the succeeding steps of the embodiment 1. Note, in FIG. 13C, reference numeral 11030 indicates a terminal portion; 11031, a drive circuit portion; and 11034, an FPC.

A screen printing method is carried out as follows: for instance, while a plate having an opening of a desirable pattern is used as a mask, either paste (dilution fluid) mixed with metal particles (Ag, Al etc.) or ink is formed from the opening on a substrate corresponding to a member to be printed. Thereafter, the resulting substrate is thermally sintered, so that a wiring line having a desirable pattern is formed. Since such a screen printing method is relatively low cost and may be applied to a large area, this screen printing method may be suitable for the present invention.

Alternatively, instead of the screen printing method, a letterpress (relief) printing method using a rotary drum, an intaglio printing method, and various sorts of offset printing method may be applied to the present invention.

The source wiring line of the pixel portion may be formed by executing the above-explained various methods.

It should also be noted that the present embodiment 5 may be freely combined with any one of the above-described embodiments 1 to 4.

Embodiment 6

Figure 14:
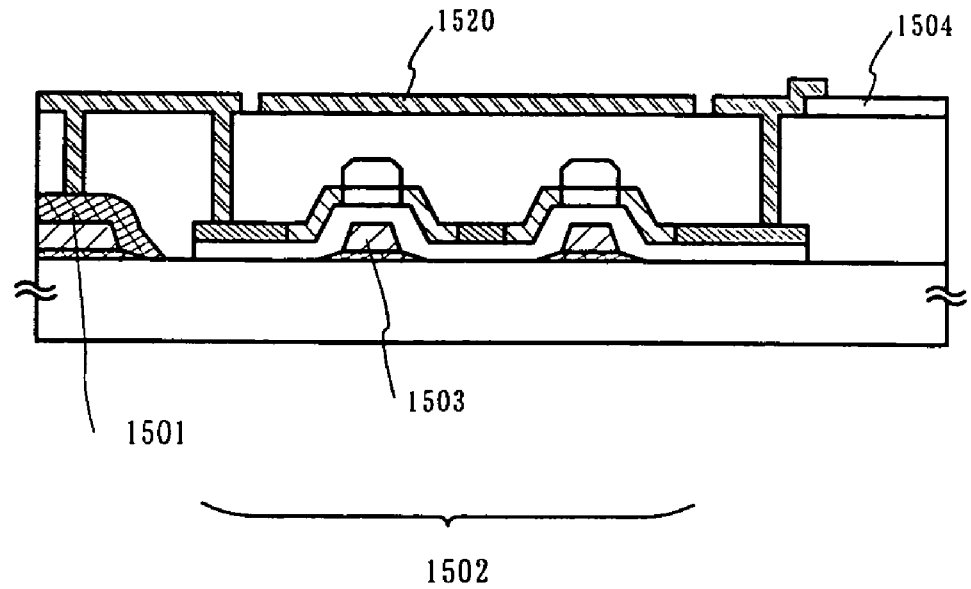
FIG. 14 is a diagram for illustratively showing an example of a bottom gate type TFT.

In the embodiment 1, there is shown such an example of the TFT having the top gate structure. However, the present invention is not limited to this TFT structure. In this embodiment, FIG. 14 indicates such an example of a pixel TFT 1502 having a bottom gate structure.

First, after both a gate electrode 1503 and a source wiring line have been formed on a substrate, a gate insulating film is formed. Next, a semiconductor film is formed in such a manner that this semiconductor film is overlapped with the gate electrode 1503 while sandwiching the gate insulating film. Next, an insulating layer is selectively formed on such a portion of the semiconductor film, which constitutes a channel forming region, and then, a doping operation is carried out. Subsequently, after an activation process operation is carried out, both the semiconductor film and the gate insulating film are selectively removed. At this time, the insulating film which covers the source wiring line is removed so as to expose the surface of this source wiring line. Next, the surface of the source wiring line is processed by the plating process operation, so that such a source wiring line 1501 having a low resistance value is formed.

Next, an interlayer insulating film is formed, a pixel electrode 1504 made of ITO is formed, and then, a contact hole is formed. Next, an electrode is formed which connects the source region of the pixel TFT 1502 to the source wiring line 1501; a gate wiring line 1520 connected to the gate electrode is formed; and another electrode is formed which connects the drain region of the pixel TFT 1502 to the pixel electrode 1504.

It should also be noted that the present embodiment 6 may be freely combined with any one of the above-described embodiments 1 to 5.

Embodiment 7

Figure 15:
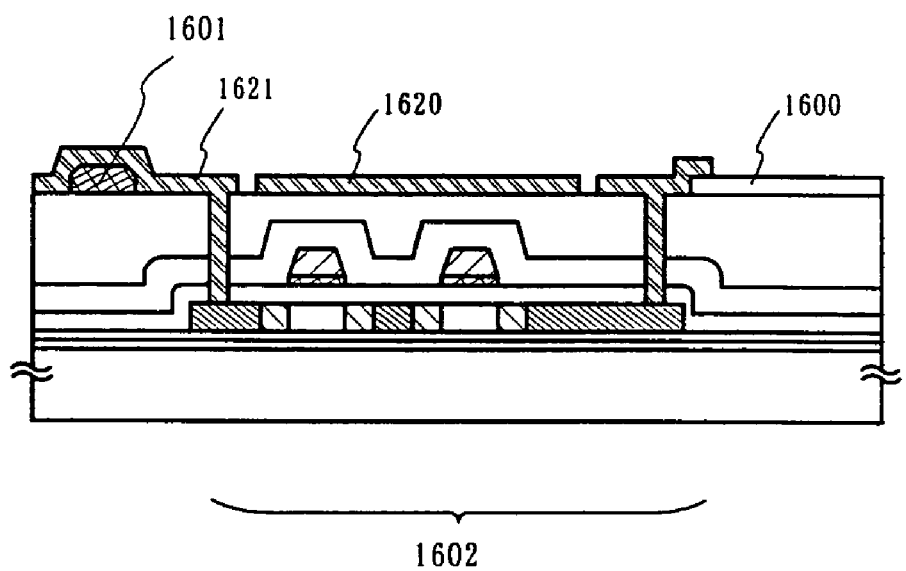
FIG. 15 is a diagram for indicating a sectional view of a pixel portion in accordance with the present invention.

FIG. 15 indicates such an example that a source wiring line is formed at a step different from the step shown in the embodiment 1.

FIG. 15 is such an example that after an interlayer insulating film has been formed, a pixel electrode 1600 made of ITO is formed on the interlayer insulating film, and then, a source wiring line 1601 is formed.

In this embodiment, while the source wiring line 1601 is formed by way of the screen printing method, a connection electrode 1621 is provided which is employed so as to connect this source wiring line 1601 to a source region of a pixel TFT 1602.

A screen printing method is carried out as follows: for instance, while a plate having an opening of a desirable pattern is used as a mask, either paste (dilution fluid) mixed with metal particles (Ag, Al, Cu etc.) or ink is formed from the opening on a substrate corresponding to a member to be printed. Thereafter, the resulting substrate is thermally sintered, so that a wiring line having a desirable pattern is formed. Since such a screen printing method is relatively low cost and may be applied to a large area, this screen printing method may be suitable for the present invention.

Alternatively, instead of the screen printing method, a letterpress (relief) printing method using a rotary drum, an intaglio printing method, and various sorts of offset printing method may be applied to the present invention.

In this embodiment, while the source wiring line 1601 was made of copper, both the connection electrode 1621 and the gate wiring line 1621 were formed by such a triple-layer stacked layer of Ti/Al/Ti.

It should also be noted that the present embodiment 7 may be freely combined with any one of the above-described embodiments 1 to 4.

Embodiment 8

Figure 17:
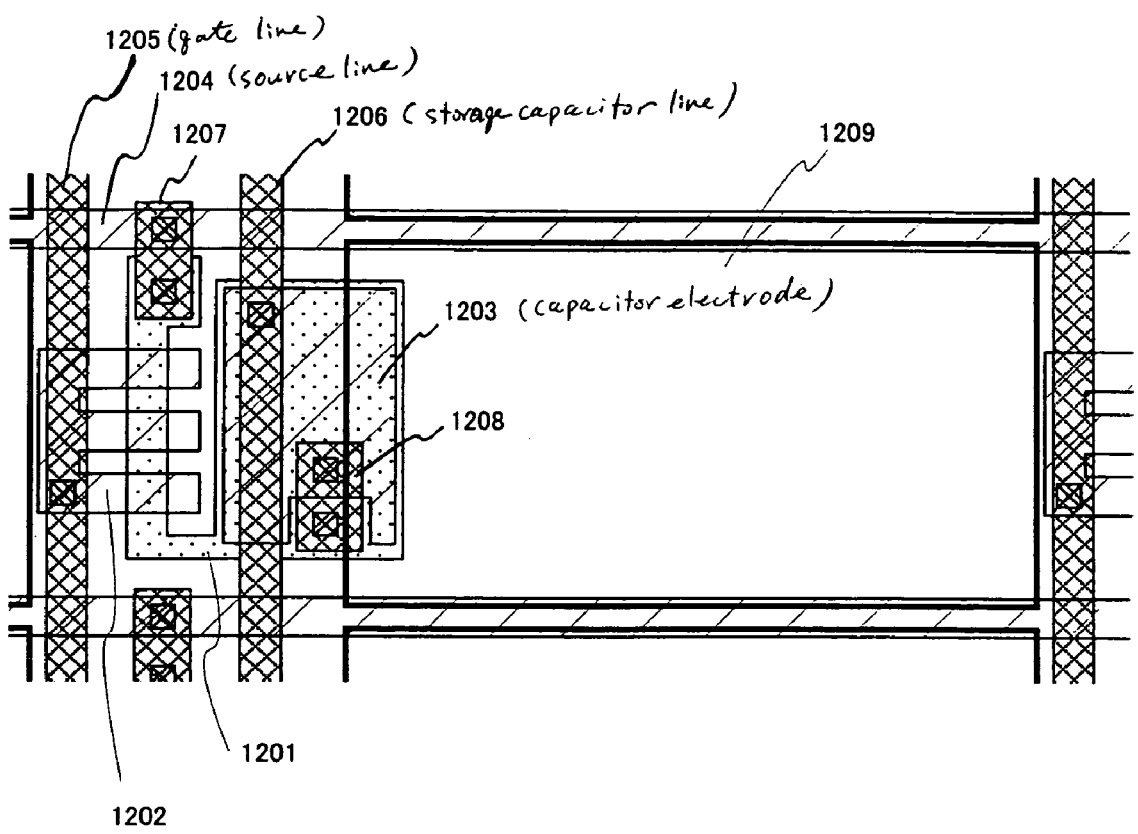
FIG. 17 is a diagram for showing an upper view of a pixel of the bottom gate type TFT.

FIG. 17 represents an example of an upper view of a pixel in the case that a liquid crystal module is constructed of a triple gate structure in this embodiment 8.

In FIG. 17, reference numeral 1201 indicates a semiconductor layer, reference numeral 1202 shows a gate electrode, reference numeral 1203 represents a capacitive electrode, reference numeral 1204 shows a source wiring line, and reference numeral 1205 denotes a gate wiring line. Also, reference numeral 1206 indicates a capacitive wiring line, reference numeral 1207 shows an electrode for connecting the semiconductor layer to the source wiring line, reference numeral 1209 indicates a pixel electrode, and reference numeral 1208 shows an electrode for connecting the semiconductor layer to the pixel electrode.

In this embodiment, both the gate electrode 1202 and the capacitive electrode 1203 are formed at the same step on an insulating film which covers the semiconductor layer 1201. The source wiring line 1204 is formed at the same step, or different steps of these electrodes. In this embodiment, after an impurity element has been added to the semiconductor layer and the added impurity element has been activated, the wiring line was formed on the gate insulating film at a different step, and a surface thereof is processed by a plating process operation so as to lower a resistance value of this wiring line. Also, in this embodiment, the gate electrode 1205, the capacitive electrode 1206, the electrodes 1207 and 1208 on the interlayer insulating film which covers the gate electrode 1202, the source wiring line 1204, and the capacitive wiring line 1203 are formed at the same step. Also, the electrode 1208 is provided in such a manner that this electrode 1208 is made in contact with a portion of the pixel electrode 1209 and is overlapped with this portion. The pixel electrode 1209 is made of a transparent conductive film which is formed on the interlayer insulating film. Also, as shown in FIG. 17, as viewed from the upper surface, the capacitive wiring line 1206 is arranged between the electrode 1208 and the electrode 1207.

The gate electrode 1202 is overlapped with the semiconductor layer 1201 at three positions, while sandwiching therebetween the gate insulating film, and thus, constitutes a triple gate structure. Since a sectional view of a portion near the gate electrode is substantially identical to that of FIG. 11B, an explanation thereof is omitted.

FIG. 11B is such an example that the capacitor of the pixel portion is formed in the semiconductor layer which is different from the pixel TFT. In FIG. 17, a capacitor is formed by a portion of the semiconductor layer of the pixel TFT. To secure the capacitor, the thickness of the insulating film may be made thin up to approximately 80 nm.

In this embodiment, since the triple gate structure is employed, the OFF current may be reduced. Also, since the width of the gate electrode 1202 is made narrow, for example, 1.5 μm, the OFF-current may be further reduced.

It should also be noted that the present embodiment 8 may be freely combined with any one of the above-described embodiments 1 to 7.

Embodiment 9

This embodiment 9 indicates such an example that PPTA (Plural Pulse Thermal Annealing) is employed as the thermal processing operation in the embodiment 1.

The thermal process operation "PPTA" implies such a thermal processing operation that a heating cycle by a light source (halogen lamp, metal halide lamp, high-pressure mercury lamp, high-pressure sodium lamp, xenon lamp etc.), and a cooling cycle by circulating coolant (nitrogen, helium, argon, krypton, xenon etc.) into a processing chamber are repeatedly carried out plural times. The light emission time of the light source per 1 time is equal to 1 through 60 seconds, preferably, 0.1 through 20 seconds. The light source irradiates light plural times. The light source is turned ON in an intermittent manner by a power supply thereof and a control circuit in such a manner that the holding time period of the semiconductor film becomes 0.5 to 5 seconds.

While the actual heating time is shortened by PPTA, since light which is selectively absorbed by the semiconductor film is irradiated form the light source provided on one surface side, or the light sources provided on both surface sides, only the semiconductor film is selectively heated (temperature increasing speed of 100 to 200° C./second) without heating the substrate itself to higher temperatures. Also, in order to suppress the temperature increase of the substrate, this substrate is cooled from the peripheral portion thereof by employing the coolant (temperature decreasing speed of 50 to 150° C./second).

The following example is indicated in which one heating process operation among the heating process operations executed in Embodiment 1 is used in activation.

In the activation process shown in FIG. 2D, the activation process operation is carried out by PPTA. While a tungsten halogen lamp is employed as a light source, pulse light is irradiated from one surface side, or both surface sides of the substrate. At this time, a flow rate of "He" is increased/decreased in synchronism with turning ON/OFF of the tungsten halogen lamp so as to selectively heat the semiconductor film.

The impurity element may be activated by this PPTA, and also, the metal element which is employed to crystalize and is contained in the semiconductor layer may be gettering-processes from the channel forming region into the impurity region. It should be noted that if not only phosphorus, but also an impurity element capable of applying the p type are added into the impurity region, then a more effective effect may be achieved. As a result, such a step for adding boron capable of adding the p type may be preferably added after the first doping step. Alternatively, while the PPTA processing chamber is set to such a pressure reduction condition lower than, or equal to 13.3 Pa, it is possible to prevent occurrences of oxidation and contamination.

It should also be noted that the present embodiment 9 may be freely combined with any one of the above-described embodiments 1 to 8.

Embodiment 10

In this embodiment, a method of simultaneously manufacturing a pixel portion (n-channel TFT) and TFTs (an EEMOS circuit from n-channel TFT), which is providing a NMOS circuit of a drive circuit provided on the periphery of the pixel portion, on the same substrate will be described with reference to FIGS. 18A to 22.

In this embodiment, a substrate 1000 is used, which is made of barium borosilicate glass such as #7059 glass and #1737 glass produced by Corning Corp. or aluminoborosilicate glass. As the substrate 1000, any substrate can be used as long as it has transparency. A quartz substrate may be used. A plastic substrate having heat resistance enduring a treatment temperature of this embodiment also may be used.

Then, an underlying film 1001 composed of an insulating film such as a silicon oxide film, a silicon nitride film, or a silicon oxide nitride film is formed on the substrate 1000. In this embodiment, a two-layered structure is used as the underlying film 1001. However, a single insulating film or a lamination of two or more insulating films using the above insulating film may also be used. As a first layer of the underlying film 1001, a silicon oxide nitride film 1001a is formed to a thickness of 10 to 200 nm (preferably, 50 to 100 nm) by plasma CVD, using $SiH_4$, $NH_3$, and $N_2O$ as reactive gas. In this embodiment, a silicon oxide nitride film 1001a (composition ratio: Si=32%, O=27%, N=24%, and H=17%) having a thickness of 50 nm is formed. Then, as a second layer of underlying film 1001, a silicon oxide nitride film 1001b is formed to a thickness of 50 to 200 nm (preferably, 100 to 150 nm) by plasma CVD, using $SiH_4$ and $N_2O$ as reactive gas. In this embodiment, a silicon oxide nitride film 1001b (composition ratio: Si=32%, O=59%, N=7%, and H=2%) having a thickness of 100 nm is formed.

Then, semiconductor layers 1002 to 1005 are formed on the underlying film. The semiconductor layers 1002 to 1005 are formed by forming a semiconductor film having an amorphous structure by a known method (sputtering, LPCVD, plasma CVD, or the like), conducting a known crystallization precessing (laser crystallization, thermal crystallization, or thermal crystallization using a catalyst such as nickel) to obtain a crystalline semiconductor film, and patterning the film into a desired shape. The semiconductor layers 1002 to 1005 are formed to a thickness of 25 to 80 nm (preferably, 30 to 60 nm). There is no particular limit regarding the material for the crystalline semiconductor film. However, it is preferable to form silicon or a silicon germanium alloy. In this embodiment, an amorphous silicon film of 55 nm is formed by plasma CVD, and thereafter, a solution containing nickel is held on the amorphous silicon film. The amorphous silicon film is dehydrogenated (at 500° C., for one hour), and then subjected to thermal crystallization (at 550° C., for 4 hours). Furthermore, laser annealing is conducted for the purpose of improving crystallization, whereby a crystalline silicon film is formed. The crystalline silicon film is subjected to patterning by photolithography to form the semiconductor layers 1002 to 1005.

Furthermore, after the semiconductor layers 1002 to 1005 are formed, doping of a trace amount of impurity elements (boron or phosphorus) may be appropriately conducted so as to manufacture separately enhancement type and depression type.

Furthermore, in the case of manufacturing a crystalline semiconductor film by laser crystallization, a pulse-oscillation type or continuous light emission type excimer laser, a YAG laser and a $YVO_4$ laser can be used. When using these lasers, laser light emitted from a laser oscillator may be condensed into a line shape by an optical system and allowed to radiate to a semiconductor film. Crystallization conditions are appropriately selected by the operator. However, when using an excimer laser, a pulse oscillation frequency is set to be 30 Hz, and a laser energy density is set to be 100 to 400 $mJ/cm^2$ (typically 200 to 300 $mJ/cm^2$). In the case of using a pulse oscillation YAG laser, the second harmonic thereof may be used, a pulse oscillation frequency may be set to be 1 to 10 kHz, and a laser energy density may be set to be 300 to 600 $mJ/cm^2$ (typically, 350 to 500 $mJ/cm^2$). Laser light condensed in a line shape with a width of 100 to 1000 μm (e.g., 400 μm) may be radiated over the entire surface of a substrate, and a line-shaped laser light overlap ratio at this time may be set to be 80 to 98%.

Figure 25:
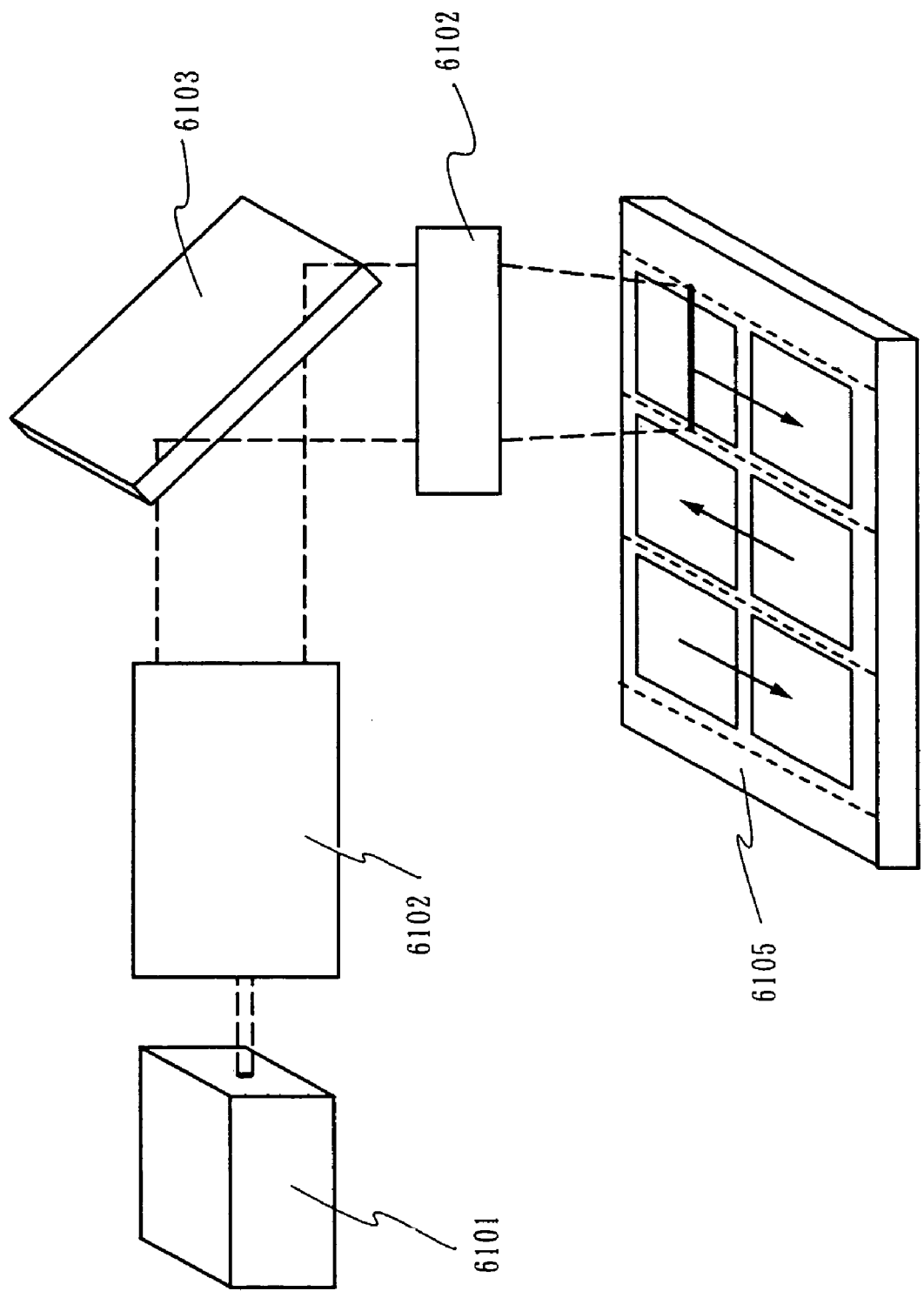
FIG. 25 is a simplified diagram for representing a condition of laser irradiation.

In addition, the state of laser radiation is shown briefly in FIG. 25. The laser light emitted from the laser light source 6101 is radiated to a large substrate 6105 by the optical system 6102 and the mirror 6103. The arrow on the large substrate shows a scanning direction of the laser light. FIG. 25 shows executing a multiple pattern to form six substrates sized 12.1 inches from the large substrate 6105 sized 650× 550 nm.

Then, a gate insulating film 1006 is formed so as to cover the semiconductor layers 1002 to 1005. The gate insulating film 1006 is formed of an insulating film containing silicon so as to have a thickness of 40 to 150 nm by plasma CVD or sputtering. In this embodiment, a silicon oxide nitride film (composition ratio: Si=32%, O=59%, N=7%, and H=2%) is formed to a thickness of 115 nm by plasma CVD. Needless to say, the gate insulating film is not limited to a silicon oxide nitride film, and may have a single layer or multi-layered structure of insulating films containing another silicon.

Figures 18A, 18B, 18C, 18D:
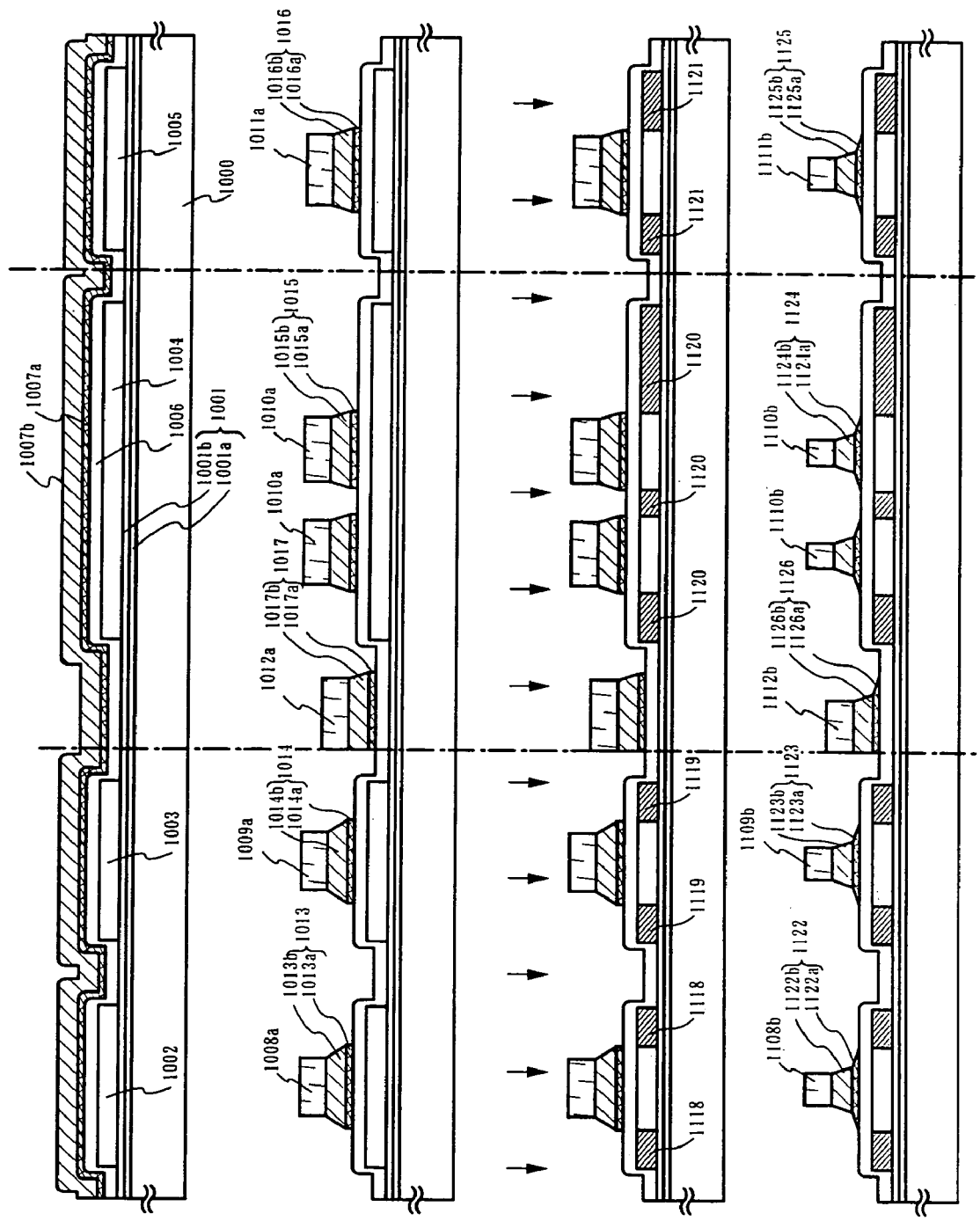
FIGS. 18A-18D are diagrams for representing a manufacturing step of an AM-LCD according to another embodiment of the present invention.

Then, as shown in FIG. 18A, a first conductive film 1007a (thickness: 20 to 100 nm) and a second conductive film 1007b (thickness: 100 to 400 nm) are laminated on the gate insulating film 1006. In this embodiment, the first conductive film 1007a made of a TaN film having a thickness of 30 nm and the second conductive film 1007b made of a W film having a thickness of 370 nm are laminated thereon. The TaN film is formed by sputtering using Ta as a target in an atmosphere containing nitrogen. The W film is formed by sputtering using W as a target. The W film can also be formed by thermal CVD using tungsten hexafluoride ($WF_6$). In any case, it is required to lower a resistance in order to use the W film as a gate electrode, and it is desirable that a resistance ratio of the W film is 20 μΩcm or less. The resistance ratio of the W film can be lowered by enlarging crystal grains thereof However, in the case where there are a number of impurity elements such as oxygen in the W film, crystallization is inhibited, and the resistance of the W film is increased. Therefore, in this embodiment, the W film is formed by sputtering using high-purity W (purity: 99.9999% or 99.99%) as a target so that no impurity may be allowed to enter in the W film from a vapor phase during the film formation, whereby a resistance ratio of 9 to 20 pdcm can be achieved.

In this embodiment, the first conductive film 1007a is made of TaN, and the second conductive film 1007b is made of W. However, the present invention is not limited thereto. Both the films may be formed of an element selected from Ta, W, Ti, Mo, Al, Cu, Cr, and Nd, or an alloy material containing the element as its main component or a compound material. A semiconductor film such as a polycrystalline silicon film doped with an impurity element such as phosphorus may also be used. Furthermore, the following combination may be used: the first conductive film made of a tantalum (Ta) film and the second conductive film made of a W film; the first conductive film made of a titanium nitride (TiN) film and the second conductive film made of a W film; the first conductive film made of a tantalum nitride (TaN) film and the second conductive film made of an Al film; the first conductive film made of tantalum nitride (TaN) film and the second conductive film made of a Cu film.

Then, masks 1008a to 1012a made of a resist are formed by photo)lithography, and first etching processing for forming electrodes and wiring is conducted. The first etching processing is conducted as first and second etching conditions. In this embodiment, under the first etching condition, etching is conducted by an inductively coupled plasma (ICP) etching method, in which plasma is generated by using $CF_4$, $Cl_2$, and $O_2$ as etching gas (flow rate: 25/25/10 (sccm)) with an RF power (13.56 MHZ) of 500 W supplied to a coil-shaped electrode at a pressure of 1 Pa. As the etching gas, chlorine type ,as such as $Cl_2$, $BCl_3$, $SiCl_4$, and $CCl_4$ or fluorine gas such as $CF_4$, $SF_6$, and $NF_3$, or $O_2$ can be appropriately used. Herein, a dry etching apparatus (Model E645-ICP) using ICP produced by Matsushita electric Industrial Co., Ltd. is used. An RF power (13.56 MHZ) of 150 W is also applied to the substrate side (sample stage), whereby a substantially negative self-bias voltage is applied thereto. Under the first etching condition, the W film is etched and end portions of the first conductive layer are tapered. Under the first etching condition, an etching rate with respect to W is 200.39 nm/min., an etching rate with respect to TaN is 80.32 nm/min., and a selection ratio of W with respect to TaN is about 2.5. Furthermore, under the first etching condition, a taper angle of W becomes about 26°.

Thereafter, without removing the masks 1008a to 1012a made of a resist, etching is conducted for about 30 seconds under the second etching condition, in which plasma is generated by using $CF_4$ and $Cl_2$ as etching gas (flow rate ratio: 30/30 (sccm)) with an RF power (13.56 MHZ) of 500 W supplied to a coil-shaped electrode at a pressure of 1 Pa. An RF power (13.56 MHZ) of 20 W is also applied to the substrate side (sample stage), whereby a substantially negative self-bias voltage is applied thereto. Under the second etching condition using a mixture of $CF_4$ and $Cl_2$ as etching gas, the W film and the TaN film are etched to the same degree. Under the second etching condition, an etching rate with respect to W is 58.97 nm/min., and an etching rate with respect to TaN is 66.43 nm/min. In order to conduct etching without leaving any residual on the gate insulating film, an etching time may be increased by about 10 to 20%.

According to the first etching processing, by appropriately prescribing the shape of a resist mask, the end portions of the first conductive layer and the second conductive layer are tapered due to the effect of a bias voltage applied to the substrate side. The angle of the taper portion may be 15 to 45°.

Thus, conductive layers 1013 to 1017 (first conductive layers 1013a to 1017a and second conductive layers 1013b to 1017b) of a first shape composed of first conductive layers and second conductive layers are formed by the first etching processing (FIG. 18B). The width of the first conductive layer in the channel length direction corresponds to the first width shown in above Embodiment modes. Although not shown, regions of the insulating film 1006 to be a gate insulating film, not covered with the conductive layers 1013 to 1017 of a first shape, are etched by about 10 to 20 nm to be thin.

Without removing the resist masks, the first doping processing is conducted, whereby an impurity element providing an n-type is added to the semiconductor layers (FIG. 18C). The doping processing may be conducted by ion doping or ion implantation. Ion doping is conducted under the conditions of a dose amount of $1\times10^{13}$ to $5\times10^{15}/cm^2$ and an acceleration voltage of 60 to 100 keV. In this embodiment, doping is conducted at a dose amount of $1.5\times10^{15}/cm^2$ and an acceleration voltage of 80 keV. As the impurity element providing an n-type, an element belonging to Group XV, typically, phosphorus (P) or arsenic (As) is used. Herein, phosphorus (P) is used. In this case, the conductive layers 1013 to 1016 function as masks with respect to the impurity element providing an n-type, whereby high-concentration impurity regions 1118 to 1121 are formed in a self-alignment manner. An impurity element imparting an n-type is added to the high-concentration impurity regions 1118 to 1121 in a concentration of $1\times10^{20}$ to $1\times10^{21}/cm^3$.

Then, without removing the resist masks, second etching processing is conducted. Herein, etching is conducted for 25 seconds by using $SF_6$, $Cl_2$, and $O_2$ as etching gas (flow rate ratio: 24/12/24 (sccm)) with an RF power (13.56 MHZ) of 700 W supplied to a coil-shaped electrode at a pressure of 1.3 Pa to thereby generate plasma. An RF power (13.56 MHZ) of 10 W is also applied to the substrate side (sample stage), whereby a substantially negative self-bias voltage is applied thereto. In the second etching processing, an etching rate with respect to W is 227.3 nm/min., an etching rate with respect to TaN is 32.1 nm/min., and a selection ratio of W with respect to TaN is 7.1. An etching rate with respect to SiON that is the insulating film 1006 is 33.7 nm/min. In the case of using $SF_6$ as the etching gas, a selection ratio with respect to the insulating film 1006 is high, so that a decrease in a film thickness can be suppressed.

The taper angle of the second conductive layer (W) becomes 70° in the second etching processing. Furthermore, in the second etching processing, second conductive layers 1122b to 1126b are formed. On the other hand, the first conductive layers are hardly etched to form first conductive layers 1122a to 1126a. In addition, the masks from resist 1008a to 1012a are changed its shape into masks from resist 1008b to 1012b by the second etching processing (FIG. 18D). Although not shown, actually, the width of the first conductive layers is narrowed by about 0.15 μm (i.e., about 0.3 μm over the total line width) compared with the state before the second etching processing. Furthermore, the width of the second conductive layer in the channel length direction corresponds to the second width shown in Embodiment modes.

The electrode formed by the first conductive layer 1122a and the second conductive layer 1122b becomes the n-channel TFT type gate electrode of the CMOS circuit formed in the following steps. The electrode formed by the first conductive layer 1125a and the second conductive layer 1125b becomes an electrode of the storage capacitor formed in the following steps.

It is also possible to use $CF_4$, $Cl_2$, and $O_2$ as the etching gas in the second etching processing. In this case, etching may be conducted by generating plasma under a flow rate ratio of 25/25/10 (sccm) with an RF power (13.56 MHZ) of 500 W supplied to a coil-shaped electrode at a pressure of 1 Pa. An RF power (13.56 MHZ) of 20 W is also applied to the substrate side (sample stage), whereby a substantially negative self bias voltage is applied thereto. In the case of using $CF_4$, $Cl_2$, and $O_2$, an etching rate with respect to W is 124.62 nm/min., an etching rate with respect to TaN is 20.67 nm/min., and a selection ratio of W with respect to TaN is 6.05. Thus, the W film is selectively etched. Furthermore, in this case, the regions of the insulating film 1006, not covered with the conductive layers 1122 to 1126 of a first shape, are etched by about 50 nm to be thin.

Figure 19A:
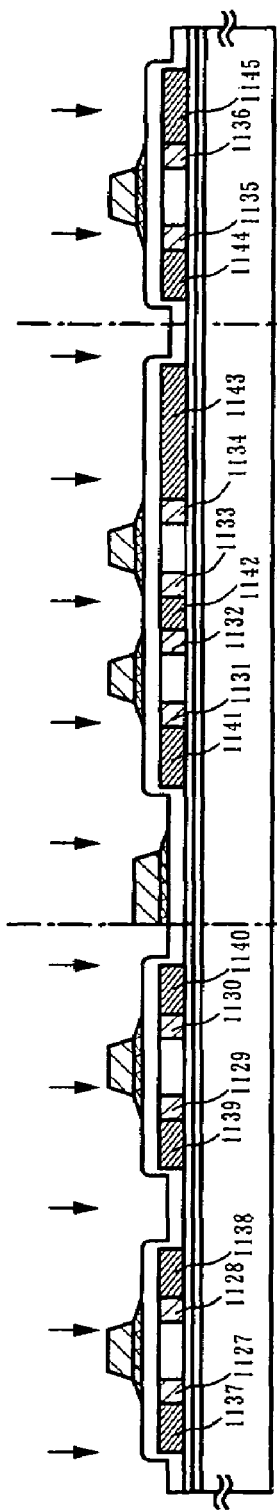
FIGS. 19A-19C are diagrams for showing a manufacturing step of the AM-LCD according to the embodiment.

Then, after removing the resist masks, second doping processing is conducted to obtain a state shown in FIG. 19A. Doping is conducted using the second conductive layers 1122b to 1125b as masks with respect to an impurity element so that the impurity element is added to the semiconductor layers below the taper portions of the first conductive layers. In this embodiment, phosphorus (P) is used as the impurity element, and plasma doping is conducted under the doping conditions of a dose amount of $1.5\times10^{14}/cm^2$, an acceleration voltage of 90 keV, an ion current density of 0.5 μA/cm², phosphine ($PH_3$) 5% hydrogen dilute gas, and a flow rate of 30 sccm. Thus, low-concentration impurity regions 1127 to 1136 are formed so as to be overlapped with the first conductive layers in a self-alignment manner. The concentration of phosphorus (P) added to the low-concentration impurity regions 1127 to 1136 is $1\times10^{17}$ to $1\times10^{19}$ cm², and the low-concentration impurity regions 1127 to 1136 have a concentration gradient in accordance with the thickness of the taper portions of the first conductive layers. In the semiconductor layer overlapped with the taper portion of the first conductive layer, an impurity concentration (P concentration) decreases gradually from the end of the taper portion of the first conductive layer inwardly. More specifically, in the second doping processing, a concentration distribution is formed. Furthermore, an impurity element is also added to the high-concentration impurity regions 1118 to 1121 to form high-concentration impurity regions 1137 to 1145.

In this embodiment, the width (in the channel length direction) of the taper portion is preferably at least 0.5 µm or more up to a range of 1.5 µm to 2 µm. Therefore, although influenced by a thickness, the width in the channel length direction of the low-concentration impurity region having a concentration gradient is not beyond a range of 1.5 µm to 2 µm, either. Herein, although the high-concentration impurity regions and the low-concentration impurity regions are shown separately. Actually, there is no clear border therebetween and regions having a concentration gradient are formed. Similarly, there is no clear border between the channel forming regions and the low-concentration impurity regions.

Figure 19B:
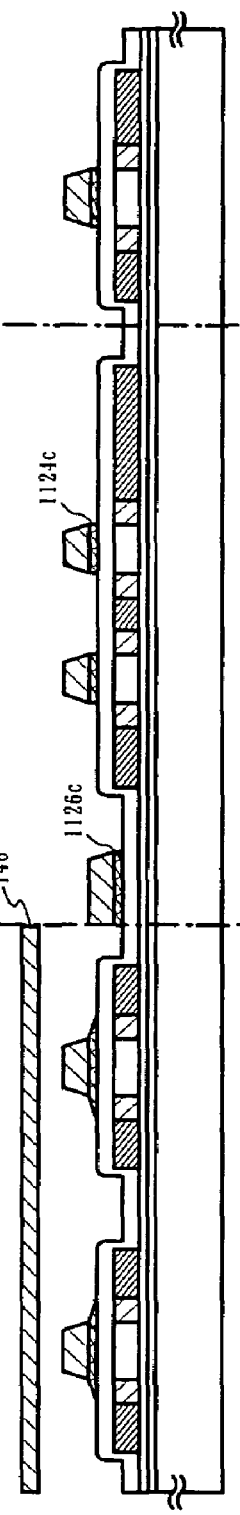
Figure 19C:
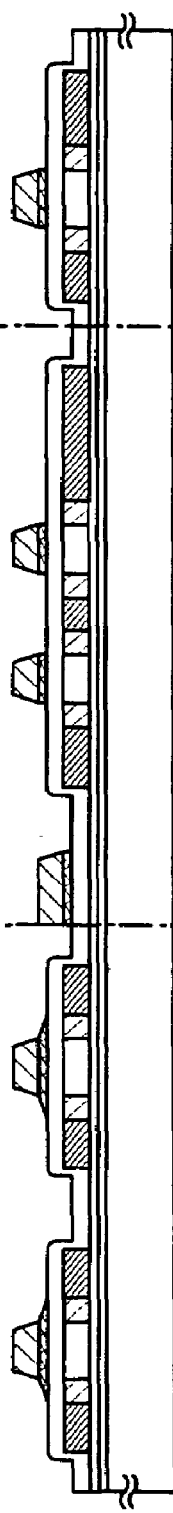

Then, the region other than the pixel portion are covered by the mask 146 and third etching processing is conducted. The metal plate, the glass plate, the ceramic plate and the ceramic glass plate can be used to the mask 146. The upper view of the mask 146 is shown in FIG. 16. In the third etching processing, taper portions of the first conductive layers which are not overlapped with the mask 146 are selectively conducted dry etching to eliminate regions overlapped with impurity regions of the semiconductor layers. The third etching processing is conducted by using an ICP etching apparatus, using, as etching gas, Cl₃ having a high selection ratio with respect to W. In this embodiment, etching is conducted for 30 seconds by generating plasma, using Cl₃ with a flow rate ratio of 80 (sccm), with an RF power (13.56 MHZ) of 350 W supplied to a coil-shaped electrode at a pressure of 1.2 Pa. An RF power (13.56 MHZ) of 50 W is also supplied to the substrate side (sample stage), whereby a substantially negative self-bias voltage is applied thereto. In the third etching, first conductive layers 1124c and 1126c are formed (FIG. 19B).

An example of conducting a third etching process is shown in this embodiment. The third etching process is not conducted if there is no need to conduct.

Then, as shown in FIG. 19D, an impurity element added to each semiconductor layer is activated. The activation is conducted by thermal annealing using an annealing furnace. Thermal annealing may be conducted at 400 to 700° C., typically 500 to 550° C. in a nitrogen atmosphere having an oxygen concentration of 1 ppm or less, preferably 0.1 ppm or less. In this embodiment, activation is conducted by heat treatment at 550° C. for four hours. Instead of thermal annealing, laser annealing or rapid thermal annealing (RTA) can be applied.

Though not shown in the drawing, the impurity elements are diffused through the activation treatment to thereby erase the border between the n-type impurity regions (low concentration) and the impurity regions (high concentration) almost completely.

In this embodiment, at the same time as the above-mentioned activation, nickel used as a catalyst during crystallization is gettered in the impurity region containing phosphorus of high concentration, whereby a nickel concentration in the semiconductor layer mainly to be a channel forming region is reduced. In a TFT having a channel forming region thus produced, an OFF current value is decreased and crystallinity is satisfactory. Therefore, a high electric field effect mobility is obtained, and satisfactory characteristics can be achieved.

Next, heat treatment is conducted in a hydrogen atmosphere so as to be hydrogenated the semiconductor layers. Plasma hydrogenation (using hydrogen excited by plasma) can be used as another method of hydrogenation.

In the case of using laser annealing as the activation, it is desirable that laser light such as excimer laser and YAG laser is radiated after the above hydrogenation.

Next, a plating process operation is carried out with respect to both the surface of the source wiring line 1126 of the pixel portion, and the electrode surface of the terminal portion. FIG. 7A shows an upper view of the active matrix type liquid crystal display device just after the plating process operation is carried and FIG. 7B indicates a sectional view thereof. In FIGS. 7A-7B, reference numeral 400 indicates a terminal portion, and reference numeral 401 represents an electrode which is connected to an external terminal. Also, for the sake of simple explanations, FIGS. 7A-7B indicate one TFT provided in the drive circuit portion 402, and only the source wiring line 1126 is indicated in the pixel portion 403. In this embodiment, the plating process operation was carried out by employing the copper plating fluid (manufactured by EEJA.: "MICROFAB Cu2200"). As indicated in one example of FIG. 10, when this plating process operation is carried out, either wiring lines or electrodes, which will be plated, are coupled to each other by employing a dummy pattern so as to become the same potentials. When the substrate is cut out in the succeeding step, the adjoining electrodes are cut out so as to be separated from each other. Alternatively, a short-circuit ring may be formed by using the dummy pattern.

Next, a first interlayer insulating film 1155 capable of covering the source wiring line of the pixel is formed. As this first interlayer insulating film 1155, an inorganic insulating film mainly containing silicon may be employed.

Next, a second interlayer insulating film 1156 made of an organic insulating material is formed on the first interlayer insulating film 1155. In this embodiment, an acrylic resin film having a thickness of 1.6 µm was formed.

Next, a pixel electrode 1147 made of a transparent conductive film is patterned on the second interlayer insulating film by employing a photomask. As the transparent conductive film which constitutes the pixel electrode 1147, for instance, ITO (alloy made of indium oxide and tin oxide), an alloy made of indium oxide and zinc oxide (In₂O₃—ZnO), zinc oxide (ZnO), and the like may be employed.

Next, while the second insulating film is selectively etched by employing the photomask, a contact hole which is reached to the respective impurity regions (1137, 1138, 1139, 1140, 1151, 1153, 1144) is formed; another contact hole which is reached to the source wiring line 1126 of the pixel portion is formed; and another contact hole which is reached to the gate electrode 1124 is formed; and also, another contact hole which is reached to the electrode 1125b is formed.

Next, electrodes 1157 to 1160 which are electrically connected to the respective impurity regions (1137, 1138, 1139, 1140), and a source wiring line of the drive circuit are formed; electrodes 1150 and 1163 which are electrically connected to both the impurity region 1144 and the impurity region 1153 are formed; an electrode (connection electrode) 1161 is formed which electrically connects the impurity region 1151 which constitutes a source region to the source wiring line 1126 of the pixel portion; a gate wiring line 1162 which is electrically connected to the gate electrode 1124 is formed; and also a capacitor wiring line 1169 which is electrically connected to the electrode 1125b is formed.

Also, a pixel electrode 1147 is electrically connected to the impurity region 1153 of the pixel TFT 206 by such an electrode 1163 which is made in contact with and is overlapped with this pixel electrode 1147. Also, this pixel electrode 1147 is electrically connected to the impurity region 1144 of the holding capacitor by another electrode 1150 which is made in contact with and is overlapped with the pixel electrode 1147.

Also, in this embodiment, such an example is shown that the electrodes 1150 and 1163 are formed after the pixel electrodes have been formed. Alternatively, the contact holes are formed and the electrode is formed, and thereafter, the pixel electrode made of the transparent conductive film may be formed in such a manner that this pixel electrode is overlapped with this electrode.

Also, the impurity elements capable of applying the n-type are added to the respective impurity regions 1135, 1136, 1144, 1145, which may function as one electrode of a holding capacitor. This holding capacitor is formed by electrodes 1125a and 1125b connected to the capacitor wiring line 1169, and also by a semiconductor layer, while an insulating film 1006 is used as a dielectric member.

While the above-described manufacturing method is carried out, both the drive circuit and the pixel portion 205 can be formed on the same substrate. The drive circuit contains the NMOS circuit 1182 constructed of two n-channel type TFTs 1180 and 1181. The pixel portion 205 contains the pixel TFT 206 made of the n-channel TFT 206 and the holding capacitor 1183 (see FIG. 20B). It should be noted that such a substrate is referred to as an "active matrix substrate" in this specification, for the sake of convenience.

In addition, the EEMOS circuit is structured shown in FIG. 23A by using two n-channel TFT in this embodiment.

Figure 21:
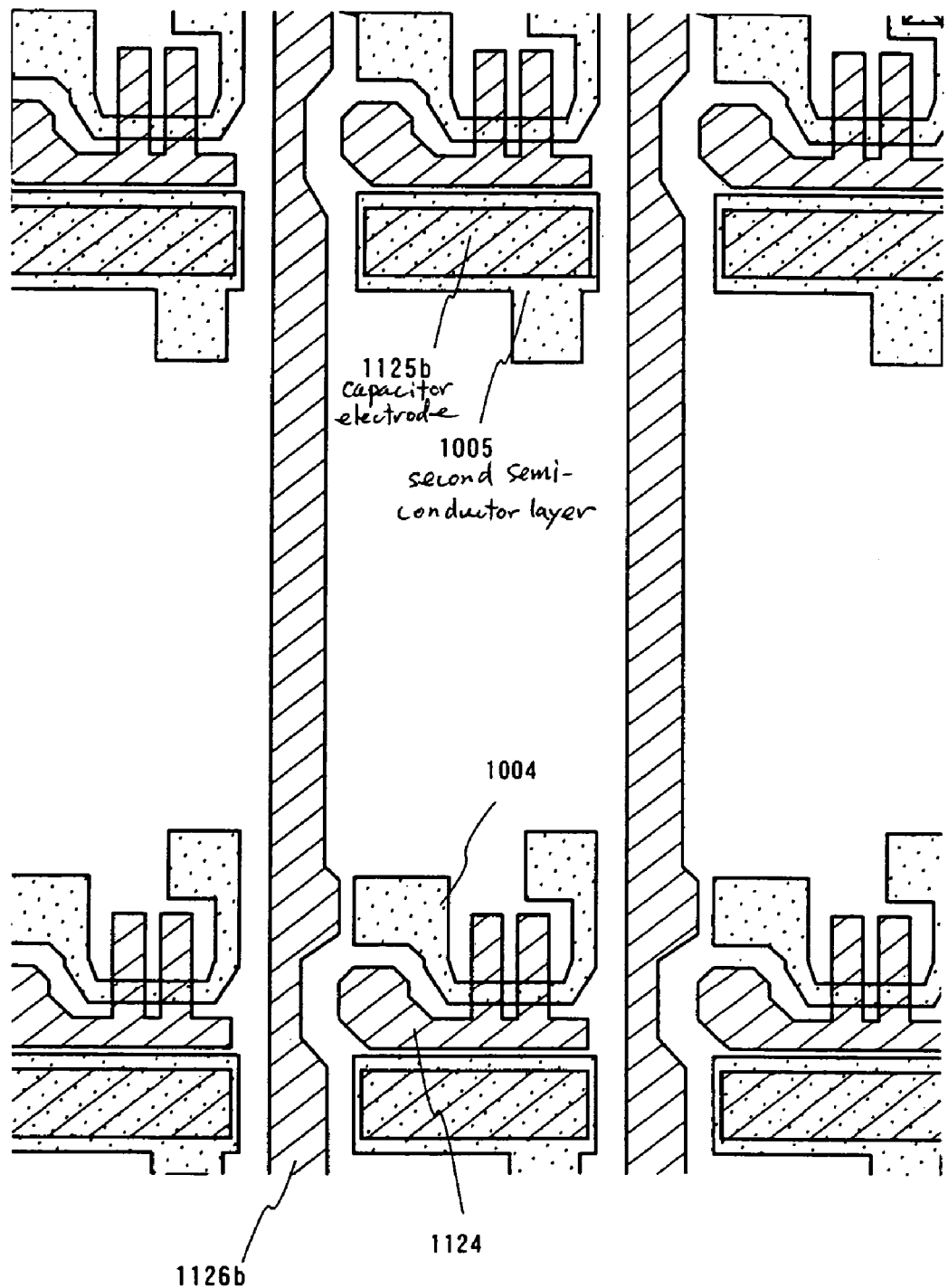
FIG. 21 is a diagram for showing an upper view of a pixel of the AM-LCD.
Figure 22:
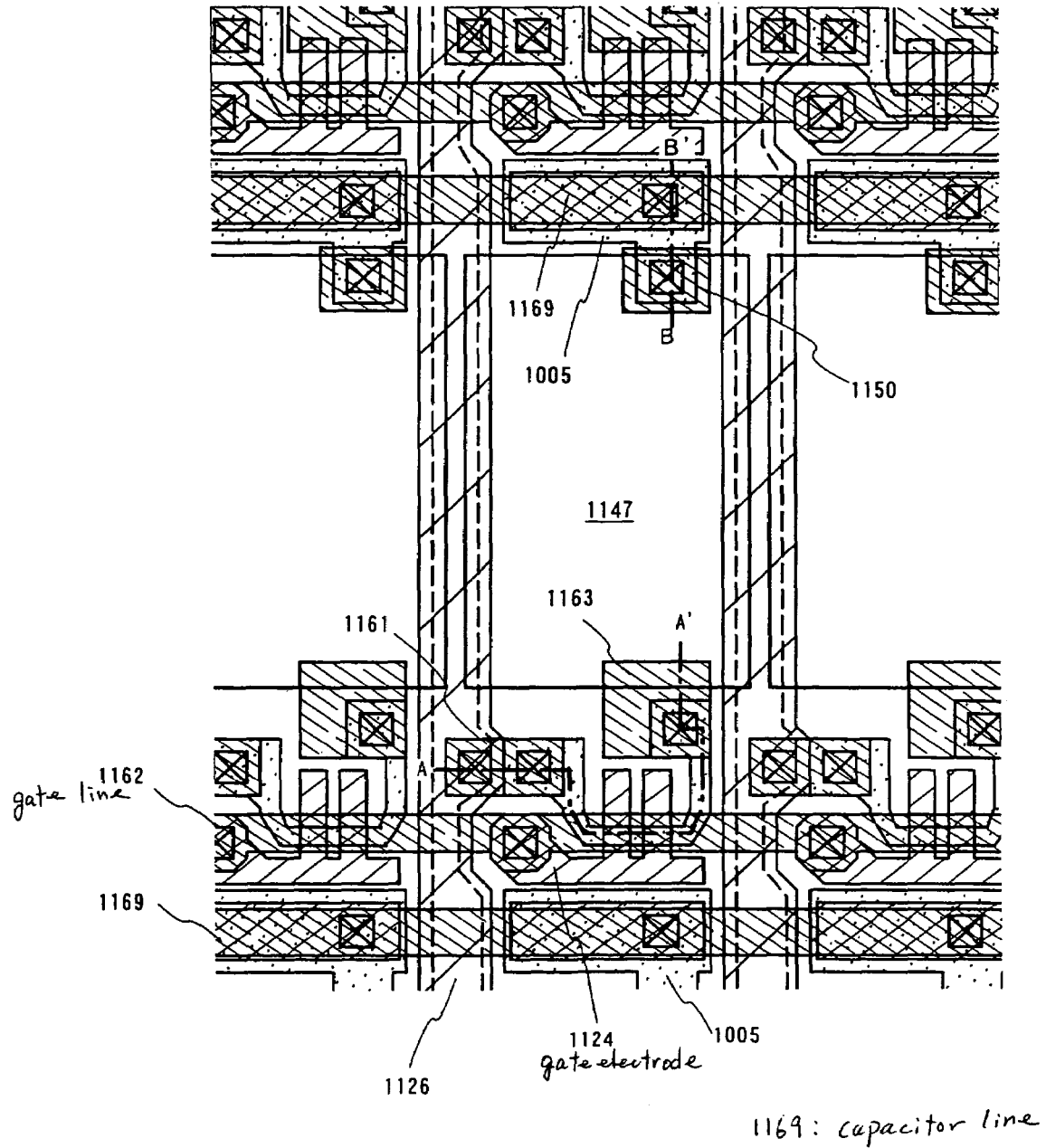
FIG. 22 is a diagram for showing an upper view of a pixel of the AM-LCD.

FIG. 22 is an upper view for indicating the pixel portion of the active matrix substrate manufactured in this embodiment. It should also be noted that the same reference numerals shown in FIG. 20B are employed as those for indicating the same. The dotted line A-A' shown in FIG. 20B corresponds to a sectional view, taken along a dotted line A-A' in FIG. 22. The dotted line B-B' shown in FIG. 20B corresponds to a sectional view taken along a dotted line B-B' of FIG. 22. Also, FIG. 21 is an upper view of the active matrix substrate obtained just after the source wiring line 1126 of the pixel is formed.

The pixel structure of this embodiment is manufactured in such a manner that while a black matrix is not employed, an edge portion of the pixel electrode 1147 is arranged to be overlapped with the source wiring line 1126 in order to shield spaces among the pixel electrodes.

Also, in accordance with the steps shown in this embodiment, a total number of photomasks which are required to manufacture the active matrix substrate could become five.

A description will now be made of steps by which an active matrix type liquid crystal display device shown in FIG. 6 may be manufactured according to Embodiment 1 from this active matrix substrate obtained.

Embodiment 11

In such a case of n-channel type TFT shown in Embodiment 10, elements belonging to the group XV in the periodic table (preferably, phosphorus) or elements belonging to the group XIII in the periodic table (preferably, boron) may be added to the semiconductor in the channel forming region to selectively fabricate the enhancement type and depletion type.

In a case where an NMOS circuit is formed by combining the n-channel TFTs, it is formed as a combination of enhancement-type TFTs (hereinafter referred to as "EEMOS circuit") or a combination of depletion-type and enhancement-type TFTs (hereinafter referred to as "EDMOS circuit").

FIG. 23A shows an example of the EEMOS circuit, and FIG. 23B shows an example of the EDMOS circuit. Each of components 31 and 32 shown in FIG. 23A is an enhancement-typ of n-channel TFT (hereinafter referred to as E-type NTFT). Components 33 shown in FIG. 23B is an E-type NTFT and 34 is a depletion type of n-channel TFT (hereinafter referred to as D-type NTFT), respectively.

In FIGS. 23A and 23B, $V_{DH}$ designates a power supply line to which a positive voltage is applied (positive power supply line), and $V_{DL}$ designates a power supply line to which a negative voltage is applied (negative power supply line). The negative power supply line may be a ground-potential power supply line (grounded power supply line).

Figure 24A:
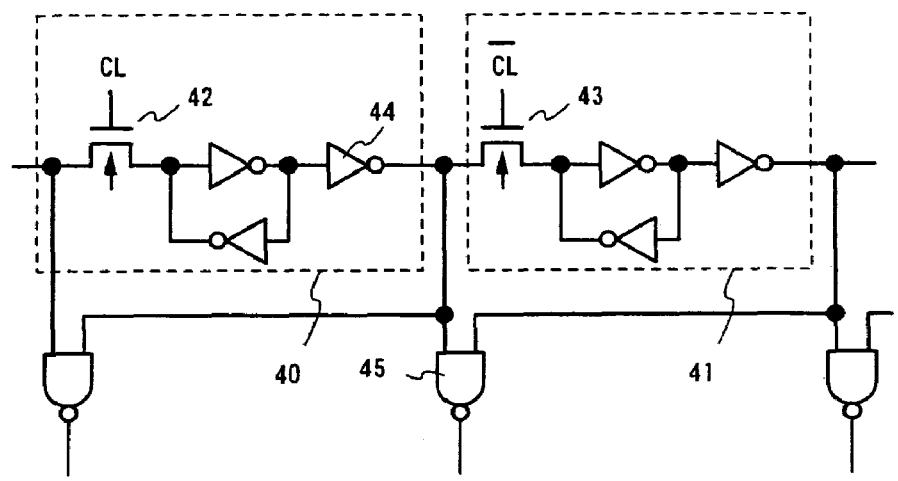
FIGS. 24A-24B are diagrams for indicating a structure of a shift register according to another embodiment of the present invention.
Figure 24B:
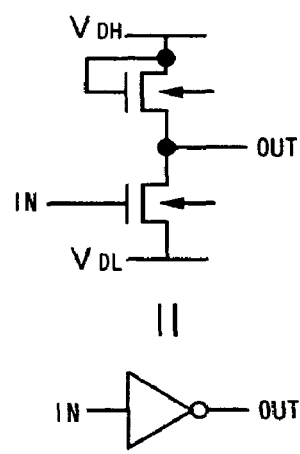

FIGS. 24A-24B show an example of a shift register formed by using the EEMOS circuit shown in FIG. 23A or the EDMOS circuit shown in FIG. 23B. Portions 40 and 41 of FIGS. 24A-24B are flip-flop circuits. Components 42 and 43 are E-type NTFTs. A clock signal (CL) is input to the gate of the E-type NTFT 42, and a clock signal (CL-bar) of the opposite polarity is input to the gate of the E-type NTFT 43. A symbol indicated by 44 represents an inverter circuit. To form this inverter circuit, the EEMOS circuit shown in FIG. 23A or the EDMOS circuit shown in FIG. 23B is used, as shown in FIG. 24B. Therefore all of drive circuits of the display device can be all structured by n-channel type TFT. Note, reference numeral 45 indicates an NAND circuit.

Further, this embodiment can be freely combined with any structures of Embodiments 2 to 10.

Embodiment 12

The drive circuit and the pixel portion in accordance with the present invention can be used in various modules (active matrix type liquid crystal module and active matrix type EC module). In other words, the present invention can be applied to all of the electronic equipments having these modules as the display section.

The following can be given as examples of the electronic equipment: video cameras; digital cameras; head mounted displays (goggle type display); car navigation systems; projectors; car stereo; personal computers; portable information terminals (such as mobile computers, portable telephones and electronic notebook). An example of these is shown in FIGS. 26A to 27B.

Figure 26A:
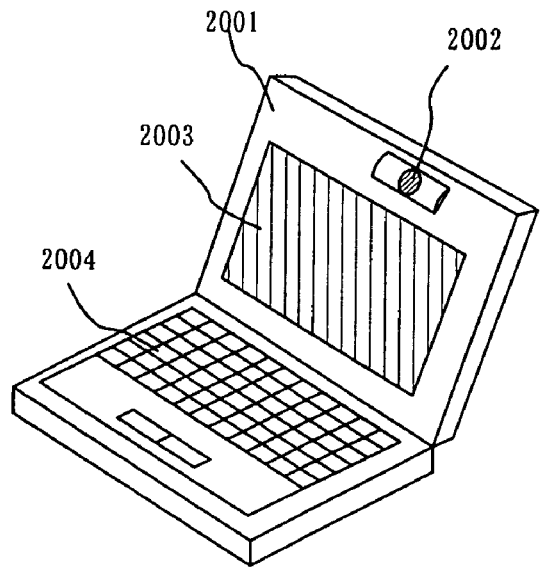
FIGS. 26A-26C are diagrams for showing an example of an electronic appliance according to another embodiment of the present invention.

FIG. 26A shows a personal computer, and it includes a main body 2001, an image input section 2002, a display portion 2003, and a keyboard 2004. The present invention is applicable to the display portion 2003.

Figure 26B:
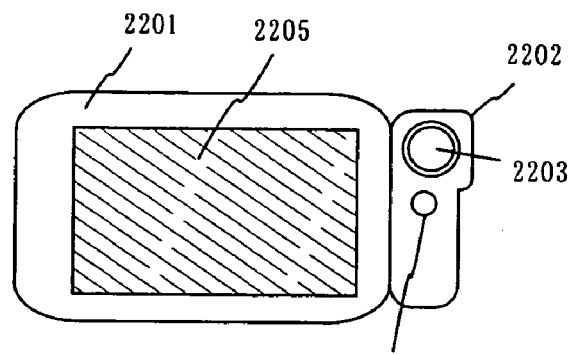

FIG. 26B shows a mobile computer, and it includes a main body 2201, a camera section 2202, an image receiving section 2203, operation switches 2204, and a display portion 2205. The present invention is applicable to the display portion 2205.

Figure 26C:
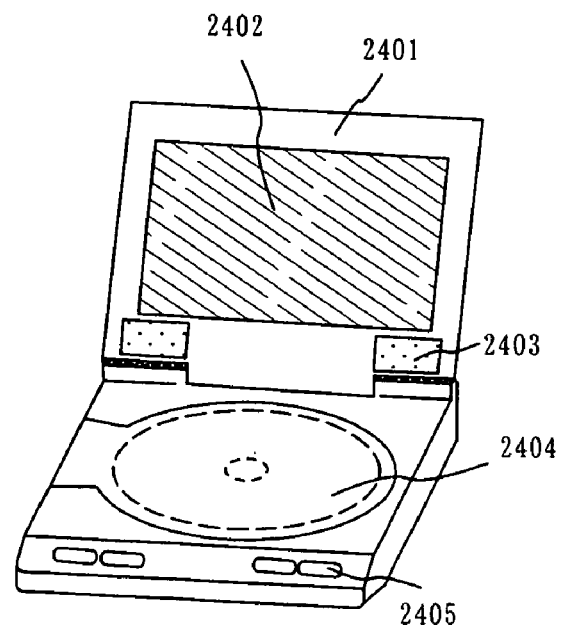

FIG. 26C shows a player using a recording medium which records a program (hereinafter referred to as a recording medium), and it includes a main body 2401; a display portion 2402; a speaker section 2403; a recording medium 2404; and operation switches 2405. This player uses DVD (digital versatile disc), CD, etc. for the recording medium, and can be used for music appreciation, film appreciation, games and Internet. The present invention is applicable to the display portion 2402.

Figure 27A:
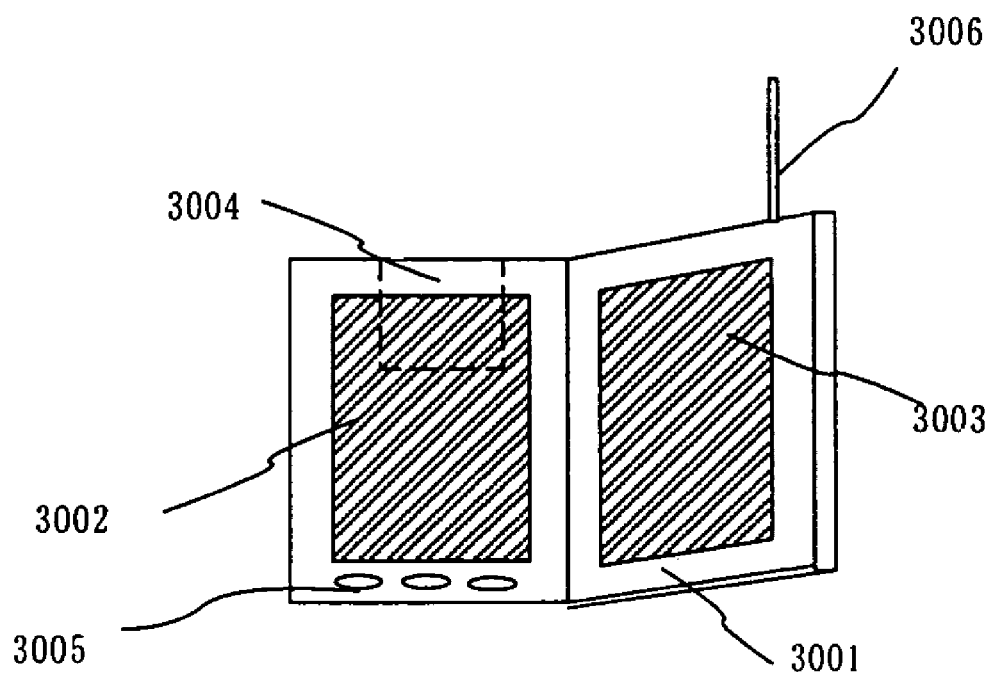
FIGS. 27A-27B are diagrams for indicating an example of the electronic appliance according to another embodiment of the present invention.

FIG. 27A shows a portable book (electronic book), and it includes a main body 3001, display portions 3002 and 3003, a recording medium 3004, operation switches 3005, and an antenna 3006. The present invention can be applied to the display portions 3002 and 3003.

Figure 27B:
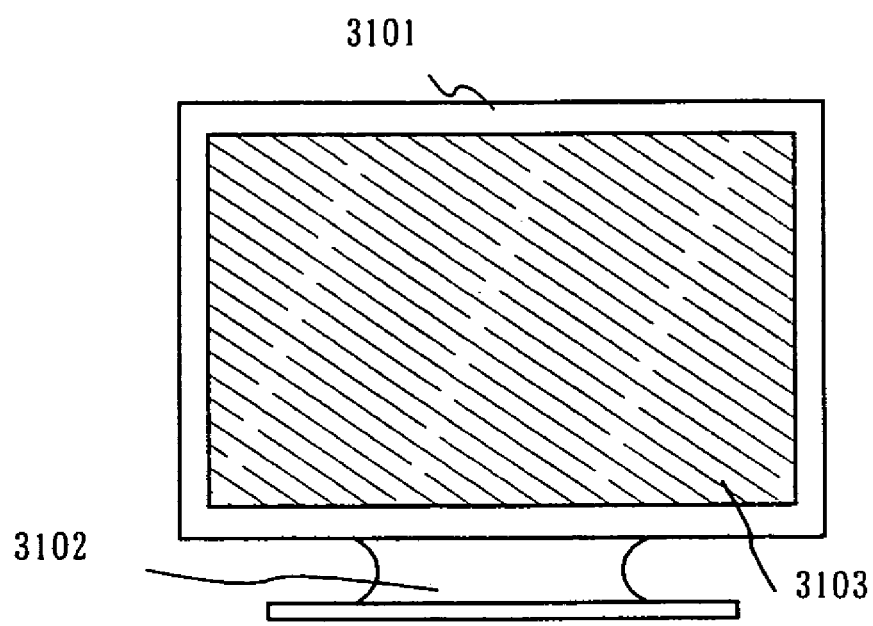

FIG. 27B shows a display, and it includes a main body 3101, a support stand 3102, and a display portion 3103. The present invention can be applied to the display portion 3103, which is equal to or greater than 10 to 50 inches in diagonal.

The applicable range of the present invention is thus extremely wide, and it is possible to apply the present invention to a manufacturing method of electronic equipments in all fields. Further, the electronic equipment of the embodiment 12 can be realized by using a constitution of any combination of the embodiments 1 to 11.

Embodiment 13

Referring now to FIG. 28A to FIG. 30C and FIG. 32, a description will now be made of an embodiment of the present invention. In this embodiment, a method for manufacturing a liquid crystal display device is indicated. Such a method by which a TFT of a pixel portion is formed on a substrate in an inverse stagger type, and a holding capacitor to be connected to the above-described TFT is manufactured, will now be explained in detail in accordance with steps. FIG. 28A to FIG. 30C represent, at the same time, a terminal portion in the manufacturing steps, which is electrically connected to a wiring line of a circuit provided on another substrate. This substrate provided on an edge portion of the substrate. It should be noted that sectional views of FIG. 28A to FIG. 30C correspond to a sectional view, taken along a line A-A' of FIG. 32.

First, a semiconductor display device is manufactured by employing a substrate 4100 having a light transmission characteristic. As a usable substrate, such glass substrates as barium borosilicate glass and alumina borosilicate glass may be employed, which are typically known as #7059 glass and #1737 glass, manufactured by Corning Inc. Such a substrate having a light transmission characteristic known as a quartz substrate and a plastic substrate may be employed as another substrate.

After a conductive layer is formed over an entire surface of the above-explained substrate 4100, a first lithography step is carried out, a resist mask is formed, and an unnecessary portion is removed by way of an etching process operation, so that both wiring lines and electrodes (namely, source wiring line 4102, gate electrodes 4103 and 4104, holding capacitor 4105, and terminal 4101) are formed (see FIG. 28A).

The above-described wiring lines and electrodes may be manufactured from materials of such an element selected from Ti, Ta, W, Mo, Cr, Nd, of an alloy which contains the above-explained elements, or of nitride which contains the above-described elements. Furthermore, plural sets of these elements which are selected from Ti, Ta, W, Wo, Cr, Nd, plural sets of these alloys containing the above-explained elements, or plural sets of nitride containing the above-explained elements may be stacked as the materials of these wiring lines and electrodes.

Next, both a Cu film 4106 and another Cu film 4110 are formed on both a source wiring line 4102 and a terminal portion 4101 by executing a plating method (see FIG. 28B). By coating the source line with the copper film 4106, the wiring resistance can be decreased and it is possible to lower the power consumption of the display. This is advantageous when the diagonal size of the pixel portion exceeds 5 inches inasmuch as the power consumption caused by the wiring resistance becomes significant in a larger size display. In particular, this is advantageous when the wirings consist of Ti, Ta, W, Mo, Cr, Nd, an alloy thereof or a nitride of these elements. In this embodiment, Cu is employed as the metal film. Alternatively, Ag, Au, Cr, Fe, Ni, Pt, or an alloy of these elements may be employed as this metal film.

Also, each of the above-described manufacturing methods is featured by that in the plating process step, the source wiring lines of the pixel portions are connected to each other by using wiring lines so as to become same potentials to each other. Also, the wiring lines which are used to connect these source wiring lines so as to become equi-potential may be cut out by laser light ($CO_2$ laser etc.) after the plating process operation has been accomplished, or may be cut out at the same time when the substrate is cut out after the plating process operation has been completed. Also, a short-circuit ring may be formed by using these wiring patterns.

Next, an insulating film 4107 is formed over an entire surface. While a silicon nitride film is employed as this insulating film, a thickness of this insulating film is selected to be 50 to 200 nm. Preferably, this insulating film having a thickness of 150 nm is formed. It should be understood that the gate insulating film is not limited to the silicon nitride film, but may be manufactured by employing such an insulating film as a silicon oxide film, a silicon oxide nitride film, and a tantalum oxide film (see FIG. 28C).

Next, a first amorphous semiconductor film 4108 having a thickness of 50 to 200 nm, preferably 100 to 150 nm, is formed on an entire surface of the insulating film 4107 by employing the known method such as the plasma CVD method and the sputtering method. An amorphous silicon (a-Si) film is typically formed, while having a film thickness of 100 nm (see FIG. 28C).

Next, a second amorphous semiconductor film 4109 containing one conductivity type (either n-type or p-type) impurity element is formed, while having a thickness of 20 to 80 nm. The second amorphous semiconductor film 4109 containing the impurity element capable of applying one conductivity type (either n-type or p-type) is formed on the entire surface by employing the known method such as the plasma CVD method and the sputtering method. In this embodiment, while a silicon target into which phosphorus has been added is employed, the second amorphous semiconductor film 4109 containing the n-type impurity element was formed (see FIG. 28C).

Next, photoresist masks 4205 and 4206 are formed by way of a second photolithography step, and then, an unnecessary portion thereof is removed by way of an etching process operation so as to form a source wiring line 4311. As the etching method in this case, either a wet etching method or a dry etching method is employed (see FIG. 29A).

In this etching step, while the second amorphous semiconductor film 4109 and the first amorphous semiconductor film 4108 are sequentially etched at a place other than the resist masks 4205 and 4206, both the second amorphous semiconductor film 4203 and the fist amorphous semiconductor film 4201 are formed in a TFT 4312 of the pixel portion. Also, both the second amorphous semiconductor film 4204 and the first amorphous semiconductor film 4202 are formed in a holding capacitor 4313.

Figure 29A:
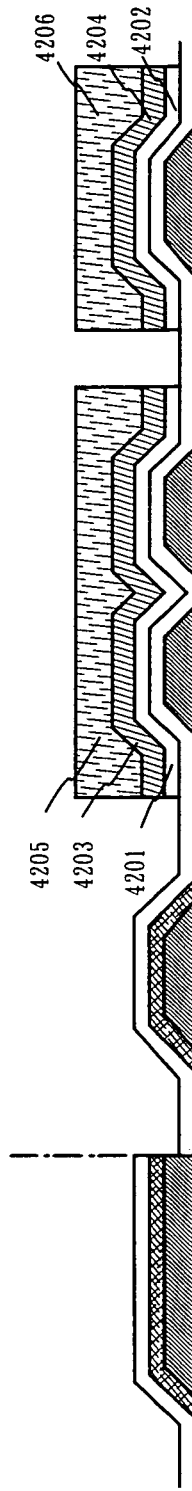
FIGS. 29A-29C are diagrams for indicating a manufacturing step of a transmission type semiconductor device in which the source wiring line is plated by employing "Cu", according to the embodiment of the present invention.
Figure 29B:
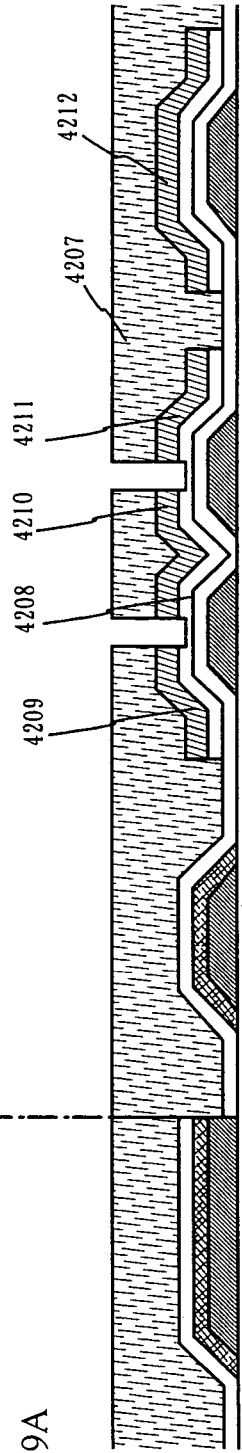

Next, after the resist masks 4205 and 4206 have been removed, a third photolithography step is carried out, and a resist mask 4207 is formed, and also an unnecessary portion is removed by way of an etching process operation, so that both a first amorphous semiconductor film 4208, and second amorphous semiconductor films 4209, 4210, 4211 are formed (see FIG. 29B).

Figure 29C:
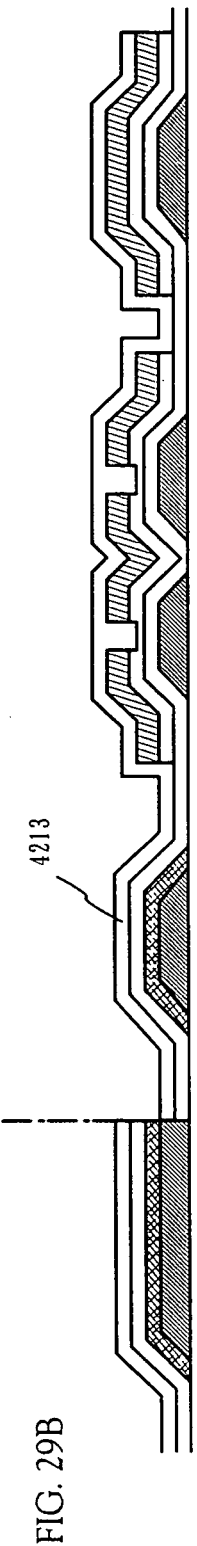
Figure 32:
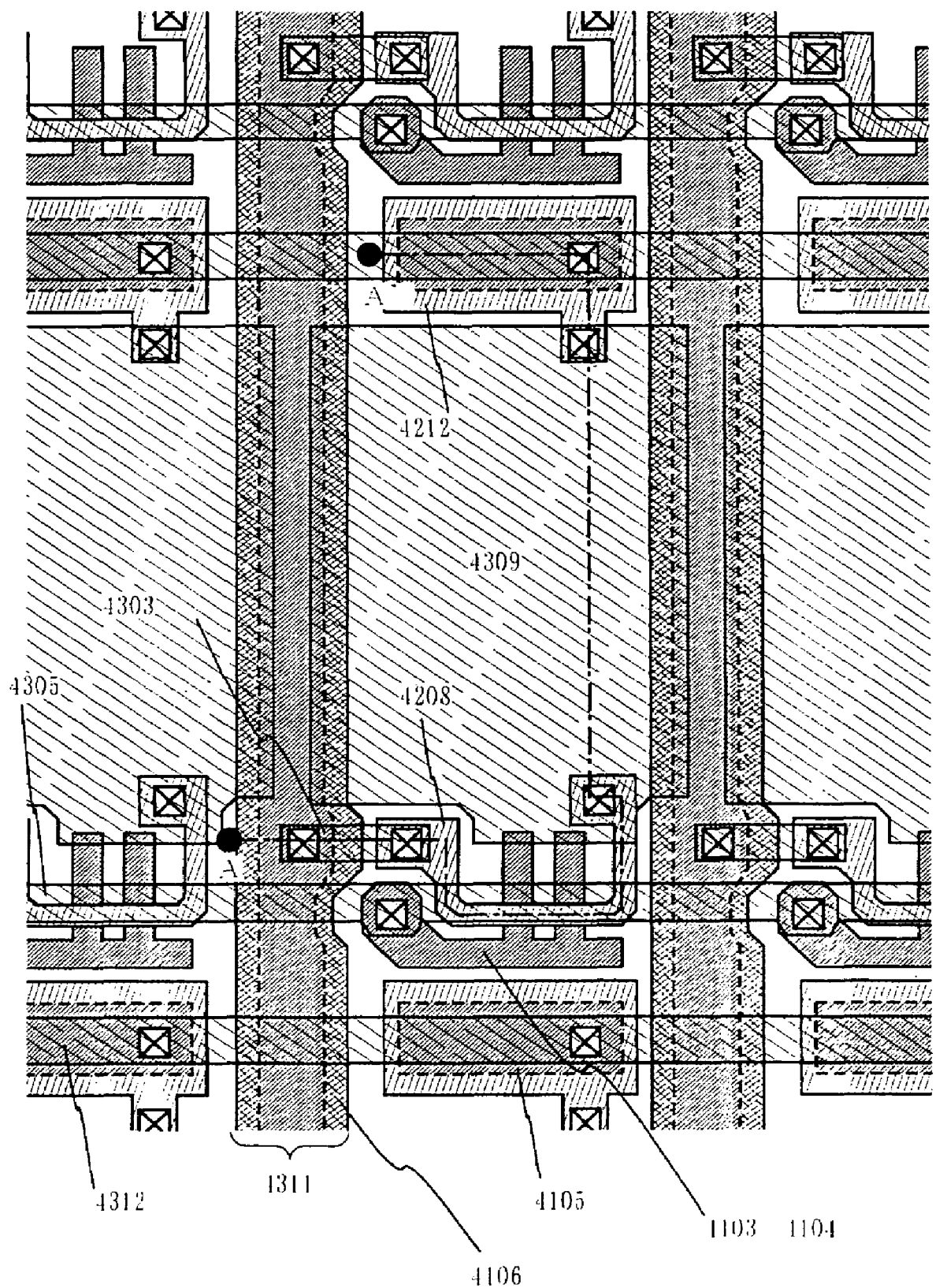
FIG. 32 is a diagram for showing an upper view of a pixel of the transmission type semiconductor device.

Next, after the above-described resist mask 4207 is moved, a first interlayer insulating film 4213 made of a silicon oxide nitride film having a thickness of 150 nm is formed by way of a plasma CVD method in such a manner that this first interlayer insulating film 4213 may cover the source wiring line 4311, the TFT 4312 of the pixel portion, and the holding capacitor 4313 of the pixel portion 4314 (see FIG. 29C).

Next, a second interlayer insulating film 4302 having a thickness of 1.6 μm, which corresponds to an organic insulating material made of acrylic resin is formed on a first interlayer insulating film 4213 made of a silicon oxide nitride film. In this embodiment, the organic insulating material made of the acrylic resin is selected as the second interlayer insulating film. Alternatively, polyimide and the like may be employed as the organic material, and furthermore, an inorganic material may be selected. Thereafter, while a fourth photolithography step is carried out, a resist mask 4301 is formed, and then, a contact hole is formed by executing a dry etching step. This contact hole is employed so as to electrically connect the source wiring line 4311 to the second amorphous semiconductor film 4209. At the same time, another contact hole is formed which is used to electrically connect the holding capacitor 4313 to the second amorphous semiconductor film 4211. Also, another contact hole is formed in a terminal potion 4310, and this contact hole is used to electrically connect the gate wiring line to the terminal portion 4310 (see FIG. 30A).

Subsequently, a transparent electrode film such as ITO (Indium-Tin-Oxide) having a thickness of 110 nm is formed. Thereafter, since both a fifth photolithography step and an etching process step are carried out, a transparent pixel electrode 4309 is formed (see FIG. 30B).

Next, in order to form a metal wiring line, both a sixth photolithography step and an etching process step are carried out. A metal wiring line 4303 is formed so as to electrically connect the source wiring line 4311 to the second amorphous semiconductor film 4209. Also, a metal wiring line 4305 is formed so as to electrically connect the second amorphous semiconductor film 4211 to the transparent pixel electrode 4309. Also, a metal wiring line 4306 is formed so as to electrically connect the transparent pixel electrode 4309 to the holding capacitor 4313. Also, a metal wiring line 4308 is formed so as to electrically connect the gate electrode to the terminal portion 4310. It should also be noted that as the metal wiring material, a stacked layer film made of both a Ti film having a thickness of 50 nm and an Al-Ti alloy film having a thickness of 500 nm may be used (see FIG. 30C).

In the method for manufacturing the semiconductor display device shown in the embodiment 13, the metal wiring lines are formed after the transparent pixel electrode such as ITO is formed. A total number of photolithography steps by which such a semiconductor display device is manufactured as follows is equal to the total number of these photolithography steps for the above-described manufacturing method of the embodiment 13. That is, after the metal wiring lines are formed, the transparent pixel electrode such as ITO is formed. As a result, it is possible to form either the metal wiring lines or the transparent pixel electrode such as ITO in the beginning of the manufacturing step.

Since the above-described photolithography steps are carried out six times, the transmission type semiconductor display device can be manufactured which is constituted by the source wiring line 4311 on which "Cu" is plated, the TFT 4312 of the inverse stagger type pixel portion and the holding capacitor 4313 thereof, and the terminal portion 4310.

It should also be noted that such a TFT which is formed by the activation layer by the amorphous semiconductor film in this embodiment has a low field-effect mobility, namely the mobility of only 1 cm$^2$/V sec could be obtained. As a result, a drive circuit for displaying an image is fabricated by an IC chip, and thus, the drive circuit IC chip is mounted by way of a TAB (Tape Automated Bonding) method, or a COG (Chip On Glass) method.

Also, the module manufactured in the respective embodiments by utilizing the present embodiment may be applied to a display portion of electronic devices shown in the embodiment 12.

Embodiment 14

The embodiment 13 indicates such an example that the transmission type semiconductor display device can be formed by performing the photolithography steps six times. In accordance with this embodiment 14, a reflection type semiconductor display device may be manufactured by executing photolithography steps five times, the method of which is indicated in FIG. 31.

Since manufacturing conditions of this embodiment 14 are obtained at the same steps as the manufacturing condition of FIG. 30A in the embodiment 13, only different manufacturing steps will be explained as follows: It should be understood that portions corresponding to FIG. 30A are indicated by the same reference numerals.

First, after the manufacturing condition of FIG. 30A is obtained in accordance with the embodiment 13, a metal wiring line 4402 is formed by executing both the fifth photolithography step and the etching process step. This metal wiring line 4402 is employed so as to electrically connect the source wiring line 4311 to the second amorphous semiconductor film 4209. At the same time, a pixel electrode 4401 is formed, a metal wiring line 4403 and a metal wiring line 4404 are formed. Furthermore, another metal wiring line 4405 which is electrically connected to the terminal portion is formed (see FIG. 31B).

Since the above-described photolithography steps are carried out five times, the reflection type semiconductor display device can be manufactured which is constituted by the source wiring line 4311 on which the metal film is plated, the inverse stagger type TFT 4312 of the pixel portion 4314 and the holding capacitor 4313 thereof, and the terminal portion 4310.

Also, the module manufactured in the respective embodiments by utilizing the present embodiment may be applied to a display portion of electronic devices shown in the embodiment 12.

Embodiment 15

In the embodiment 13 and the embodiment 14, the plating process step is carried out after the first photolithography step has been performed. In this embodiment 15, a plating process step is carried out after a fourth photolithography step has been performed, which will be described with reference to FIG. 34A to FIG. 36C.

First, a semiconductor display device is manufactured by employing a substrate 4900 having a light transmission characteristic. As a usable substrate, such glass substrates as barium borosilicate glass and alumina borosilicate glass may be employed, which are typically known as #7059 glass and #1737 glass, manufactured by Corning Inc. Such a substrate having a light transmission characteristic known as a quartz substrate and a plastic substrate may be employed as another substrate.

After a conductive layer is formed over an entire surface of the above-explained substrate 4900, a first lithography step is carried out, a resist mask is formed, and an unnecessary portion is removed by way of an etching process operation, so that both wiring lines and electrodes (namely, source wiring line 4902, gate electrodes 4903 and 4904, holding capacitor 4905, and terminal 4901) are formed (see FIG. 34A).

The above-described wiring lines and electrodes may be manufactured from materials of such an element selected from Ti, Ta, W, Mo, Cr, Nd, of an alloy which contains the above-explained elements, or of nitride which contains the above-described elements. Furthermore, plural sets of these elements which are selected from Ti, Ta, W, Wo, Cr, Nd, plural sets of these alloys containing the above-explained elements, or plural sets of nitride containing the above-explained elements may be stacked as the materials of these wiring lines and electrodes.

Next, an insulating film 4906 is formed over an entire surface. While a silicon nitride film is employed as this insulating film, a thickness of this insulating film is selected to be 50 to 200 nm. Preferably, this insulating film having a thickness of 150 nm is formed. It should be understood that the gate insulating film is not limited to the silicon nitride film, but may be manufactured by employing such an insulating film as a silicon oxide film, a silicon oxide nitride film, and a tantalum oxide film (see FIG. 34B).

Next, a first amorphous semiconductor film 4907 having a thickness of 50 to 200 nm, preferably 100 to 150 nm, is formed on an entire surface of the insulating film 4906 by employing the known method such as the plasma CVD method and the sputtering method. An amorphous silicon (a-Si) film is typically formed, while having a film thickness of 100 nm (see FIG. 34B).

Next, a second amorphous semiconductor film 4908 containing one conductivity type (either n-type or p-type) impurity element is formed, while having a thickness of 20 to 80 nm. The second amorphous semiconductor film 4908 containing the impurity element capable of applying one conductivity type (either n-type or p-type) is formed on the entire surface by employing the known method such as the plasma CVD method and the sputtering method. In this embodiment, while a silicon target into which phosphorus has been added is employed, the second amorphous semiconductor film 4908 containing the n-type impurity element was formed (see FIG. 34B).

Next, photoresist masks 4909 and 4910 are formed by way of a second photolithography step, and then, an unnecessary portion thereof is removed by way of an etching process operation so as to form a source wiring line 5111. As the etching method in this case, either a wet etching method or a dry etching method is employed (see FIG. 34C).

In this etching step, while the second amorphous semiconductor film 4908 and the first amorphous semiconductor film 4907 are sequentially etched at a place other than the resist masks 4909 and 4910, both the second amorphous semiconductor film 4913 and the fist amorphous semiconductor film 4911 are formed in a TFT 5112 of the pixel portion 5114. Also, both the second amorphous semiconductor film 4908 and the first amorphous semiconductor film 4907 are formed in a holding capacitor 5113.

Next, after the resist masks 4909 and 4910 have been removed, a third photolithography step is carried out, and a resist mask 5001 is formed, and also an unnecessary portion is removed by way of an etching process operation, so that both a first amorphous semiconductor film 5002, and second amorphous semiconductor films 5003, 5004, 5005 are formed (see FIG. 35A).

Next, after the above-described resist mask 5001 is moved, a first interlayer insulating film 5006 made of a silicon oxide nitride film having a thickness of 150 nm is formed by way of a plasma CVD method in such a manner that this first interlayer insulating film 5006 may cover the source wiring line 5111, the TFT 5112 of the pixel portion 5114, and the holding capacitor 5113 (see FIG. 35B).

Next, a second interlayer insulating film 5008 having a thickness of 1.6 μm, which corresponds to an organic insulating material made of acrylic resin is formed on a first interlayer insulating film 5006 made of a silicon oxide nitride film. In this embodiment, the organic insulating material made of the acrylic resin is selected as the second interlayer insulating film 5008. Alternatively, polyimide and the like may be employed as the organic material, and furthermore, an inorganic material may be selected. Hereafter, while a fourth photolithography step is carried out, a resist mask 5007 is formed, and then, both the first interlayer insulating film and the second interlayer insulating film, which are formed on the source wiring line 5111 and the terminal portion 5110, are removed. Also, a contact hole is formed which is used to electrically connect the holding capacitor 5113 to the second amorphous semiconductor film 5005 (see FIG. 35C).

Figure 36A:
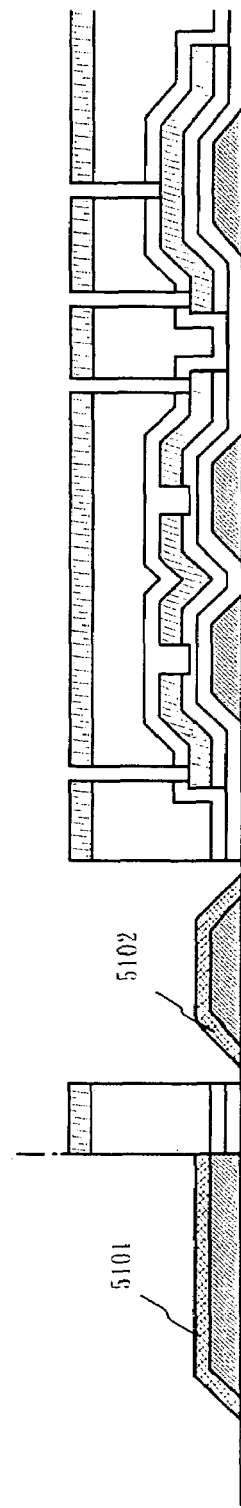
FIGS. 36A-36C are diagrams for indicating a manufacturing step of the transmission type semiconductor device in which the source wiring line is plated by employing "Cu", according to the embodiment of the present invention.
Figure 36B:
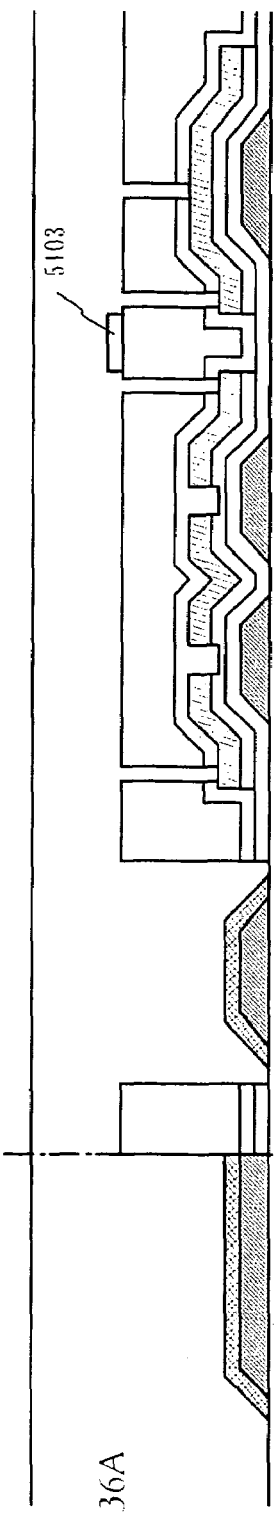
Figure 36C:
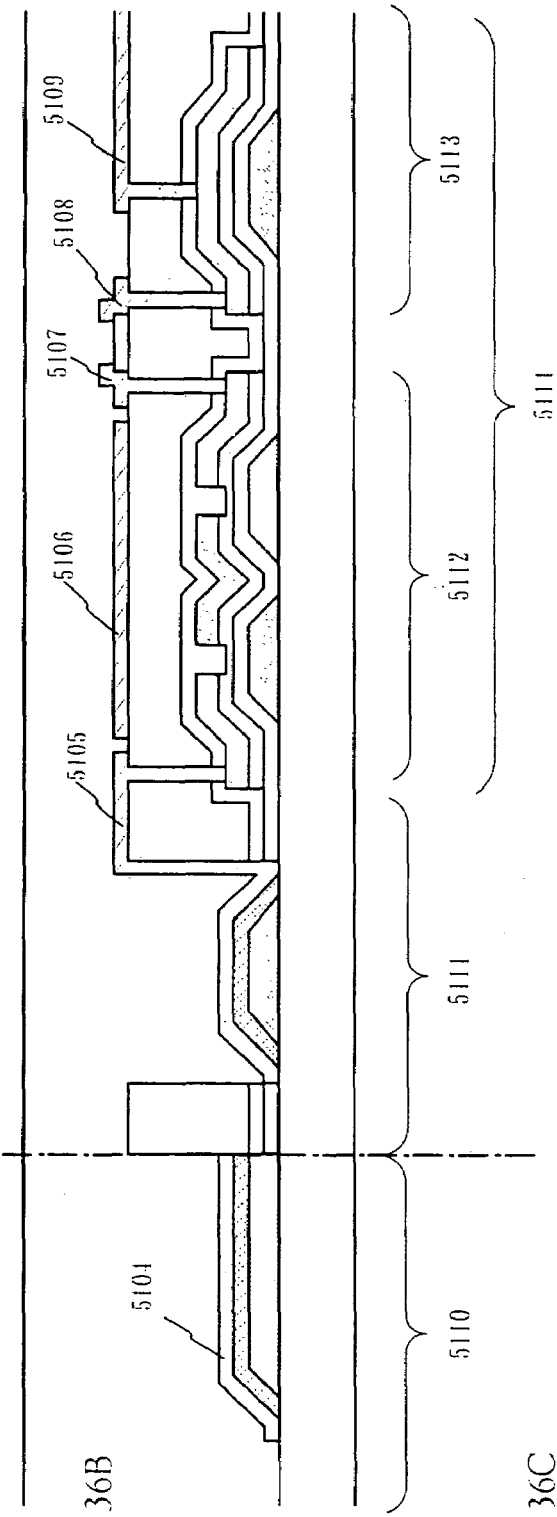

Next, Cu films 5101 and 5102 are formed on the source wiring line 5110 and the terminal portion 5111 by executing a plating process operation (see FIG. 36A). In this embodiment, similar to the embodiment 13, as the metal film, Ag, Au, Cr, Fe, Ni, Pt, or an alloy of these elements may be employed.

Also, similar to the embodiment 13, each of the above-described manufacturing methods is featured by that in the plating process step, the source wiring lines of the pixel portions are connected to each other by using wiring lines so as to become same potentials to each other. Also, the wiring lines which are used to connect these source lines so as to become equi-potential may be cut out by laser light ($CO_2$ laser etc.) after the plating process operation has been accomplished, or may be cut out at the same time when the substrate is cut out after the plating process operation has been completed. Also, a short-circuit ring may be formed by using these wiring patterns.

Subsequently, a transparent electrode film such as ITO (Indium-Tin-Oxide) having a thickness of 110 nm is formed. Thereafter, since both a fifth photolithography step and an etching process step are carried out, a transparent pixel electrode 5103 is formed (see FIG. 36B).

Next, in order to form a metal wiring line, both a sixth photolithography step and an etching process step are carried out. A metal wiring line 5105 is formed so as to electrically connect the source wiring line 5111 to the second amorphous semiconductor film 5003. Also, a metal wiring line 5107 is formed so as to electrically connect the second amorphous semiconductor film 5005 to the transparent pixel electrode 5103. Also, a metal wiring line 5108 is formed so as to electrically connect the transparent pixel electrode 5103 to the holding capacitor 5113. Also, a metal wiring line 5106 and a metal wiring line 5109 are formed. Also, a metal wiring line 5104 is formed so as to electrically connect the gate electrode to the terminal portion 5110. It should also be noted that as the metal wiring material, a stacked layer film made of both a Ti film having a thickness of 50 nm and an Al—Ti alloy film having a thickness of 500 nm may be used (see FIG. 36C).

In the method for manufacturing the semiconductor display device shown in the embodiment 15, the metal wiring lines are formed after the transparent pixel electrode such as ITO is formed. A total number of photolithography steps by which such a semiconductor display device is manufactured as follows is equal to the total number of these photolithography steps for the above-described manufacturing method of the embodiment 15. That is, after the metal wiring lines are formed, the transparent pixel electrode such as ITO is formed. As a result, it is possible to form either the metal wiring lines or the transparent pixel electrode such as ITO in the beginning of the manufacturing step.

Since the above-described photolithography steps are carried out six times, the transmission type semiconductor display device can be manufactured which is constituted by the source wiring line 5111 on which "Cu" is plated, the inverse stagger type TFT 5112 of the pixel portion 5114 and the holding capacitor 5113 thereof, and the terminal portion 5110.

It should also be noted that when the same metal as the metal wiring line is used in the pixel electrode, a reflection type semiconductor device may be formed by executing the photolithography steps five times.

Similar to the embodiment 13, the drive circuit constructed of the IC chip is mounted also in this embodiment.

Also, the module manufactured in the respective embodiments by utilizing the present embodiment may be applied to a display portion of electronic devices shown in the embodiment 12.

Embodiment 16

In the above-described embodiment 13 to embodiment 15, the semiconductor devices correspond to such semiconductor devices that the TFT of the pixel portion is made of the channel-etched type. This embodiment 16 corresponds to such a semiconductor device that a TFT of a pixel portion is made of a channel-stopped type, which will be explained with reference to FIG. 37A to FIG. 39C.

First, a semiconductor display device is manufactured by employing a substrate 5200 having a light transmission characteristic. As a usable substrate, such glass substrates as barium borosilicate glass and alumina borosilicate glass may be employed, which are typically known as #7059 glass and #1737 glass, manufactured by Corning Inc. Such a substrate having a light transmission characteristic known as a quartz substrate and a plastic substrate may be employed as another substrate.

Figure 37A:
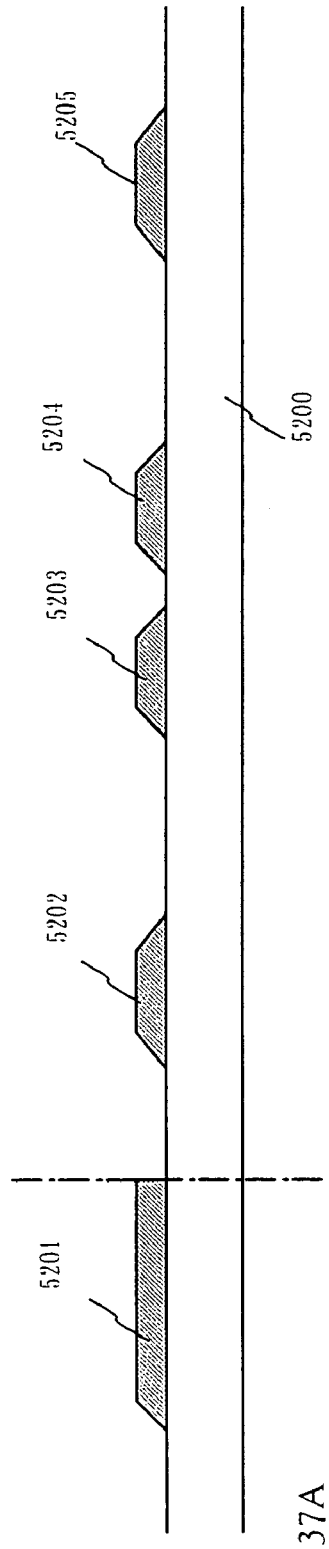
FIGS. 37A-37C are diagrams for indicating a manufacturing step of a transmission type semiconductor device manufactured by a channel stop mode, according to an embodiment of the present invention.

After a conductive layer is formed over an entire surface of the above-explained substrate 5200, a first lithography step is carried out, a resist mask is formed, and an unnecessary portion is removed by way of an etching process operation, so that both wiring lines and electrodes (namely, source wiring line 5202, gate electrodes 5203 and 5204, holding capacitor 5205, and terminal 5201) are formed (see FIG. 37A).

The above-described wiring lines and electrodes may be manufactured from materials of such an element selected from Ti, Ta, W, Mo, Cr, Nd, of an alloy which contains the above-explained elements, or of nitride which contains the above-described elements. Furthermore, plural sets of these elements which are selected from Ti, Ta, W, Wo, Cr, Nd, plural sets of these alloys containing the above-explained elements, or plural sets of nitride containing the above-explained elements may be stacked as the materials of these wiring lines and electrodes.

Figure 37B:
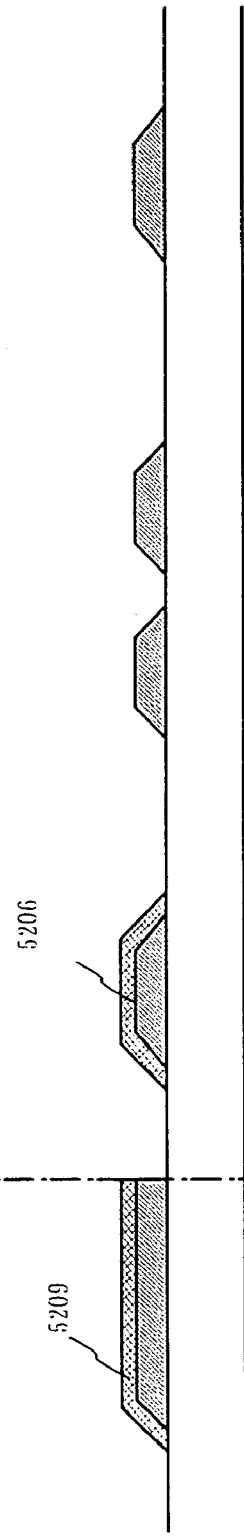
Figure 37C:
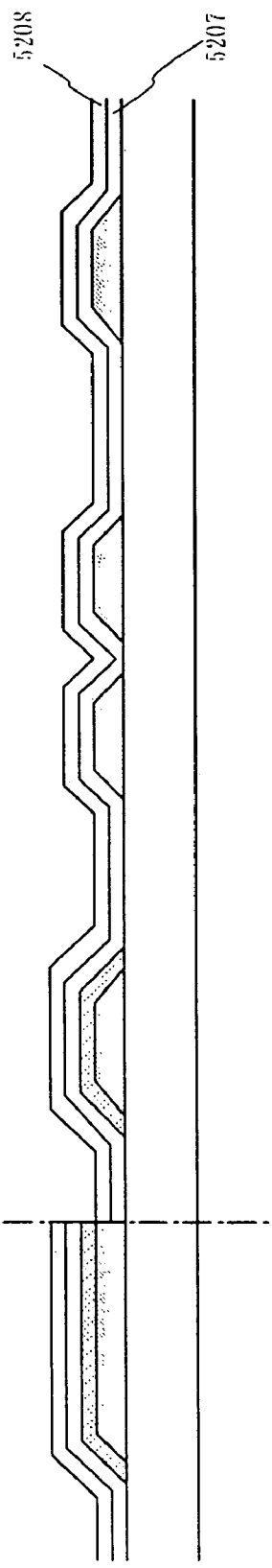

Next, both a Cu film 5206 and another Cu film 5209 are formed on both a source wiring line 5202 and a terminal portion 5201 by executing a plating method (see FIG. 37B). By coating the source line with the copper film 5206, the wiring resistance can be decreased and it is possible to lower the power consumption of the display. This is advantageous when the diagonal size of the pixel portion exceeds 5 inches inasmuch as the power consumption caused by the wiring resistance becomes significant in a larger size display. In particular, this is advantageous when the wirings consist of Ti, Ta, W, Mo, Cr, Nd, an alloy thereof or a nitride of these elements. In this embodiment, Cu is employed as the metal film. Alternatively, Ag, Au, Cr, Fe, Ni, Pt, or an alloy of these elements may be employed as this metal film. In this embodiment, Cu is employed as the metal film. Alternatively, Ag, Au, Cr, Fe, Ni, Pt, or an alloy of these elements may be employed as this metal film.

Also, similar to the embodiment 13, each of the above-described manufacturing methods is featured by that in the plating process step, the source wiring lines of the pixel portions are connected to each other by using wiring lines so as to become same potentials to each other. Also, the wiring lines which are used to connect these source lines so as to become equi-potential may be cut out by laser light ($CO_2$ laser etc.) after the plating process operation has been accomplished, or may be cut out at the same time when the substrate is cut out after the plating process operation has been completed. Also, a short-circuit ring may be formed by using these wiring patterns.

Next, an insulating film 5207 is formed over an entire surface. While a silicon nitride film is employed as this insulating film, a thickness of this insulating film is selected to be 50 to 200 nm. Preferably, this insulating film having a thickness of 150 nm is formed. It should be understood that the gate insulating film is not limited to the silicon nitride film, but may be manufactured by employing such an insulating film as a silicon oxide film, a silicon oxide nitride film, and a tantalum oxide film (see FIG. 37C).

Next, an amorphous semiconductor film 5208 having a thickness of 50 to 200 nm, preferably 100 to 150 nm, is formed on an entire surface of the insulating film 5207 by employing the known method such as the plasma CVD method and the sputtering method. An amorphous silicon (a-Si) film is typically formed, while having a film thickness of 100 nm (see FIG. 37C).

Next, photoresist masks 5301 and 5302 are formed by way of a second photolithography step, and then, an unnecessary portion thereof is removed by way of an etching process operation so as to form a source wiring line 5411. As the etching method in this case, either a wet etching method or a dry etching method is employed (see FIG. 38A).

In this etching step, while the amorphous semiconductor film 5208 is etched at a place other than the resist masks 5301 and 5302, an amorphous semiconductor film 5303 is formed in a TFT 5412 of the pixel portion. Also, the amorphous semiconductor film 5304 is formed in a holding capacitor 5413.

Figure 38A:
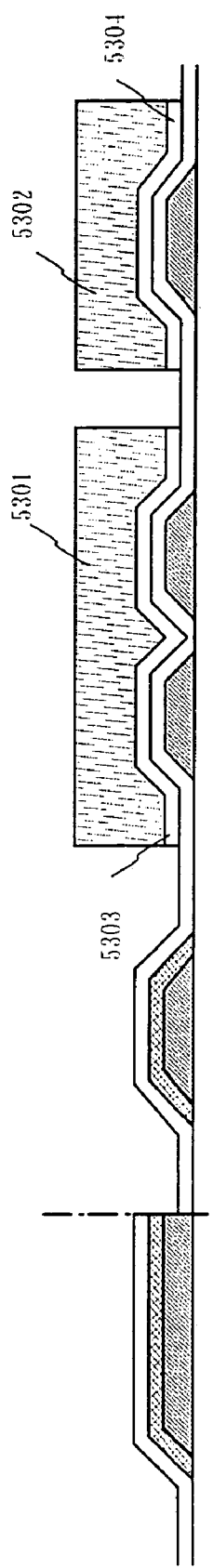
FIGS. 38A-38C are diagrams for showing a manufacturing step of the transmission type semiconductor device manufactured by the channel stop mode, according to the embodiment of the present invention.
Figure 38B:
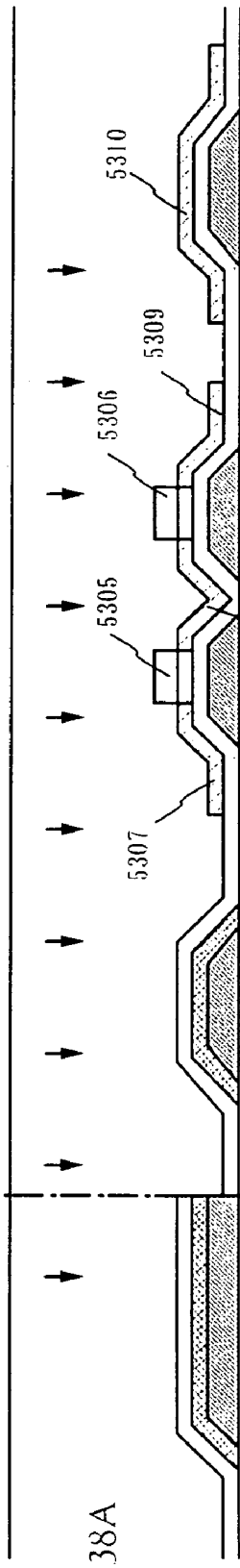

Next, such an insulating film having a thickness of 100 to 200 nm is formed on an amorphous semiconductor layer 5303. This insulating film is made of either silicon oxide or silicon nitride. In FIG. 38A, second insulating layers 5305 and 5306 which constitute channel protection films in a self-alignment manner are formed by way of an exposing process operation, while the light is exposed from the rear surface and the gate electrode is employed as a mask.

Next, such a doping process step is carried out in order to form an LDD (Lightly Doped Drain) region of an n-channel type TFT. As a doping method, either an ion doping method or an ion implanting method is carried out. Phosphorus is added as an n-type impurity, and while the second insulating layers 5305 and 5306 are used as a mask, impurity regions 5307 to 5309 are formed. Donor concentration of this region is selected to be $1 \times 10^{16}$ through $1 \times 10^{17}/cm^3$ (see FIG. 38B).

Figure 38C:
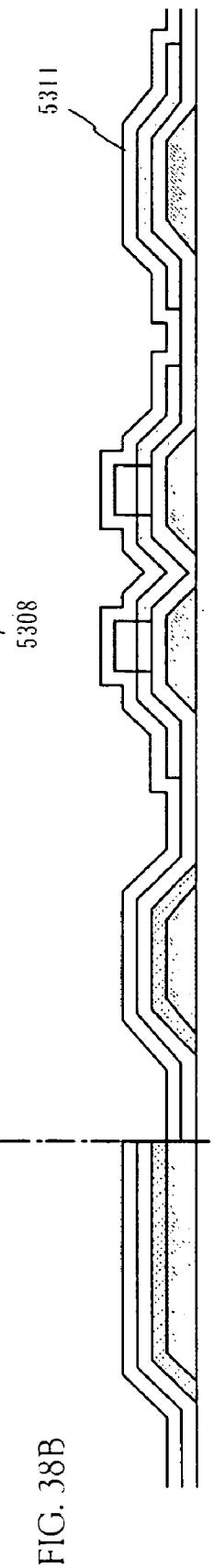
Figure 39A:
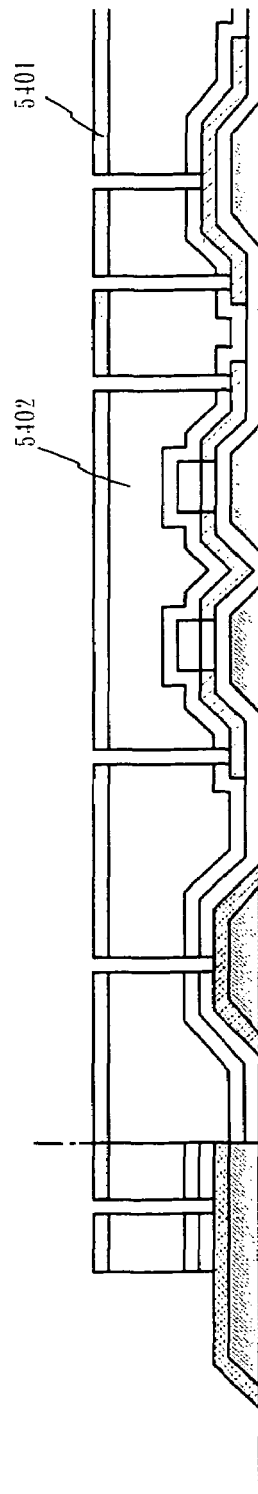
FIGS. 39A-39C are diagrams for showing a manufacturing step of the transmission type semiconductor device manufactured by the channel stop mode, according to the embodiment of the present invention.
Figure 39B:
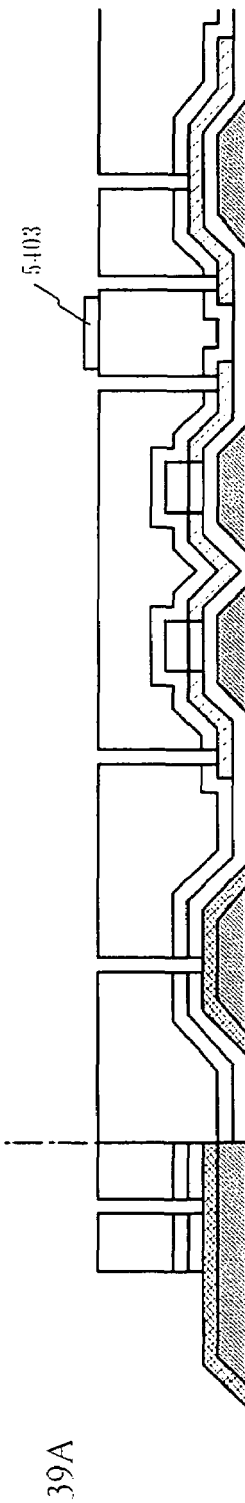
Figure 39C:
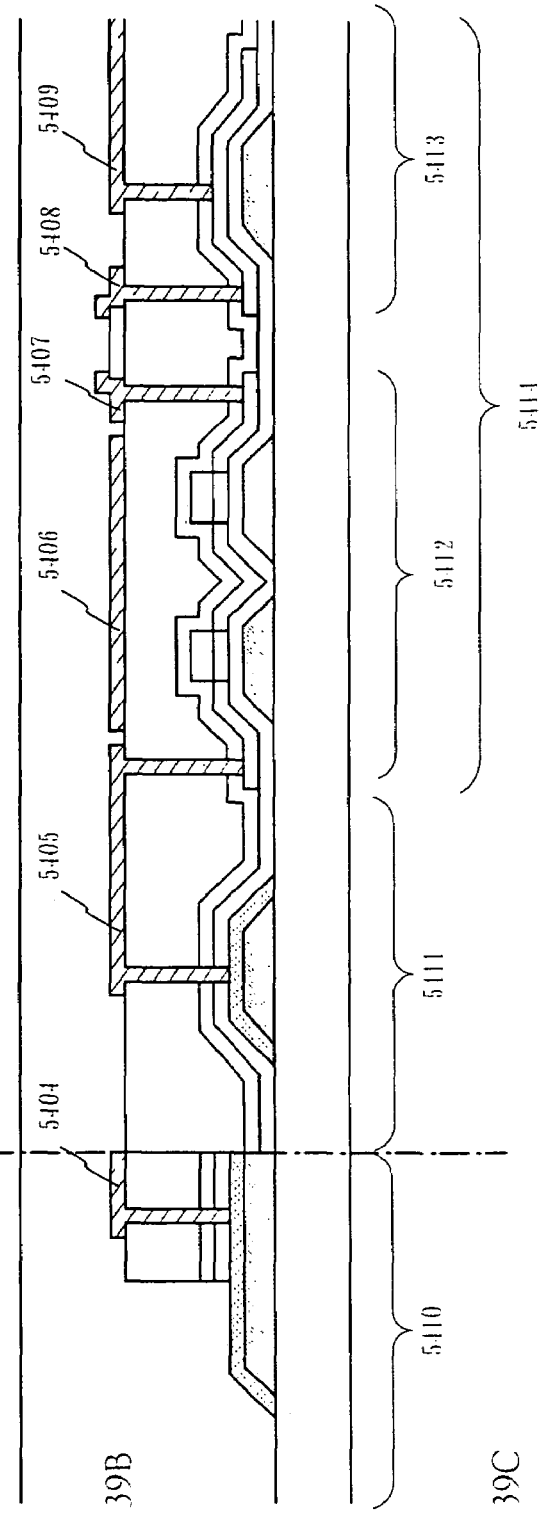

Next, a first interlayer insulating film 5311 made of a silicon oxide nitride film having a thickness of 150 nm is formed by way of a plasma CVD method in such a manner that this first interlayer insulating film 5311 may cover the source wiring line 5411, the TFT 5412 of the pixel portion 5414, and the holding capacitor 5413 (see FIG. 38C).

Next, a second interlayer insulating film 5402 having a thickness of 1.6 μm, which corresponds to an organic insulating material made of acrylic resin is formed on a first interlayer insulating film 5311 made of a silicon oxide nitride film. In this embodiment, the organic insulating material made of the acrylic resin is selected as the second interlayer insulating film. Alternatively, polyimide and the like may be employed as the organic material, and furthermore, an inorganic material may be selected. Thereafter, while a fourth photolithography step is carried out, a resist mask 5401 is formed, and then, a contact hole is formed by executing a dry etching step. This contact hole is employed so as to electrically connect the source wiring line 5411 to the amorphous semiconductor film 5307. At the same time, another contact hole is formed which is used to electrically connect the holding capacitor 5413 to the amorphous semiconductor film 5309. Also, another contact hole is formed in a terminal potion 5410, and this contact hole is used to electrically connect the gate wiring line to the terminal portion 5410 (see FIG. 39A).

Subsequently, a transparent electrode film such as ITO (Indium-Tin-Oxide) having a thickness of 110 nm is formed. Thereafter, since both a fifth photolithography step and an etching process step are carried out, a transparent pixel electrode 5403 is formed (see FIG. 39B).

Next, in order to form a metal wiring line, both a sixth photolithography step and an etching process step are carried out. A metal wiring line 5405 is formed so as to electrically connect the source wiring line 5411 to the amorphous semiconductor film 5307. Also, a metal wiring line 5407 is formed so as to electrically connect the amorphous semiconductor film 5309 to the transparent pixel electrode 5403. Also, a metal wiring line 5408 is formed so as to electrically connect the transparent pixel electrode 5403 to the holding capacitor 5413. Also, a metal wiring line 5406 and a metal wiring line 5409 are formed. Also, a metal wiring line 5404 is formed so as to electrically connect the gate electrode to the terminal portion 5410. It should also be noted that as the metal wiring material, a stacked layer film made of both a Ti film having a thickness of 50 nm and an Al—Ti alloy film having a thickness of 500 nm may be used (see FIG. 39C).

In the method for manufacturing the semiconductor display device shown in the embodiment 16, the metal wiring lines are formed after the transparent pixel electrode such as ITO is formed. A total number of photolithography steps by which such a semiconductor display device is manufactured as follows is equal to the total number of these photolithography steps for the above-described manufacturing method of the embodiment 16. That is, after the metal wiring lines are formed, the transparent pixel electrode such as ITO is formed. As a result, it is possible to form either the metal wiring lines or the transparent pixel electrode such as ITO in the beginning of the manufacturing step.

Since the above-described photolithography steps are carried out six times, the transmission type semiconductor display device can be manufactured which is constituted by the source wiring line 5411 on which "Cu" is plated, the inverse stagger type TFT 5412 of the pixel portion 5414 and the holding capacitor 5413 thereof, and the terminal portion 5410.

It should also be noted that when the same metal as the metal wiring line is used in the pixel electrode, a reflection type semiconductor device may be formed by executing the photolithography steps five times.

Similar to the embodiment 13, the drive circuit constructed of the IC chip is mounted also in this embodiment.

Also, while a liquid crystal module is manufactured by employing the technique shown in this embodiment 16 in accordance with the respective embodiments, and then, the manufactured liquid crystal module may be applied to the display unit of the electronic appliance shown in the embodiment 12.

As previously described in detail, in the semiconductor device which is typically known as the active matrix type liquid crystal display device, even when the area of the pixel portion thereof is increased and the display screen is enlarged, better displays can be realized. Since the resistance value of the source wiring line of the pixel portion is largely reduced, for example, the present invention may be applicable to such a large-sized display screen, for example, a diagonal line of 40 inches and a diagonal line of 50 inches.

While the preferred embodiments have been described with reference to liquid crystal displays, the present invention should not be limited to the liquid crystal displays. The present invention can be applied to an active matrix organic electroluminesence display device (also called organic light emitting display device), for example.

What is claimed is:

1. A method of manufacturing a semiconductor device comprising:

forming at least first and second semiconductor layers over a substrate;

forming a first insulating film over the first and second semiconductor layers;

forming at least first and second gate electrodes, at least one source line for a pixel portion, and an electrode of a terminal portion over the first insulating film;

introducing an N-type impurity to at least the first semiconductor layer with the first gate electrode as a mask to form a first N-type impurity region;

providing a tapered portion to the first and second gate electrodes by etching;

introducing an N-type impurity to at least the first semiconductor layer through the tapered portion of the first gate electrode to form a second N-type impurity region;

plating the source line of the pixel portion and the electrode of the terminal portion with a material including Cu;

forming a second insulating film covering the source line of the pixel portion and the terminal portion; and forming a gate line of the pixel portion and a source line of a driver circuit on the second insulating film.

2. The method according to claim 1 wherein said source line of the pixel portion is connected to a same electric potential as another source line of the pixel portion through a wiring during the plating thereof.

3. The method according to claim 1 wherein said source line of the pixel portion is connected to a same electric potential as another source line of the pixel portion through a wiring during the plating thereof, and the wiring is cut by laser light after the plating.

4. The method according to claim 1 wherein said source line of the pixel portion is connected to a same electric potential as another source line of the pixel portion through a wiring during the plating thereof, and the wiring is cut together with the substrate after the plating.

5. The method according to claim 1 wherein the source line of the pixel portion is formed by a printing method.

6. A method of manufacturing a semiconductor device comprising:

forming at least a semiconductor layer over a substrate;

forming a first insulating film over the semiconductor layer;

forming at least a gate electrode, at least one source line of a pixel portion, and an electrode of a terminal portion over the first insulating film;

introducing an N-type impurity into the semiconductor layer with the gate electrode as a mask to form a first N-type impurity region;

providing a tapered portion to the gate electrode;

introducing an N-type impurity into the semiconductor layer through the tapered portion of the gate electrode to form a second N-type impurity region;

forming a second insulating film on the at least one source line of the pixel portion and the terminal portion; and forming a gate line of the pixel portion and a source line of a driver circuit on the second insulating film, wherein the at least one source line of the pixel portion includes Cu, and wherein the at least one source line of the pixel portion is formed by a printing method.

7. The method according to claim 6 wherein said source line of the pixel portion is connected to a same electric potential as another source line of the pixel portion through a wiring during plating thereof.

8. The method according to claim 6 wherein said source line of the pixel portion is connected to a same electric potential as another source line of the pixel portion through a wiring during plating thereof, and the wiring is cut by laser light after the plating.

9. The method according to claim 6 wherein said source line of the pixel portion is connected to a same electric potential as another source line of the pixel portion through a wiring during plating thereof, and the wiring is cut together with the substrate after the plating.

10. The method according to claim 6 wherein said source line of the pixel portion is connected to a same electric potential as another source line of the pixel portion through a wiring during plating thereof, and the wiring is cut together with the substrate after the plating.

11. The method according to claim 6, wherein the electrode of the terminal portion includes Cu.

12. A method of manufacturing a semiconductor device comprising:

forming at least a semiconductor layer over a substrate;

forming an insulating film over the semiconductor layer;

forming at least a gate electrode, at least one source line and an electrode of a terminal portion over the insulating film;

introducing an impurity into the semiconductor layer with the gate electrode as a mask to form a first impurity region;

providing a tapered portion to the gate electrode; and introducing an impurity into the semiconductor layer through the tapered portion of the gate electrode to form a second impurity region, wherein the at least one source line includes Cu, and wherein the at least one source line is formed by a printing method.

13. The method according to claim 12 wherein said source line is connected to a same electric potential as another source line through a wiring during plating thereof.

14. The method according to claim 12 wherein said source line is connected to a same electric potential as another source line through a wiring during plating thereof, and the wiring is cut by laser light after the plating.

15. The method according to claim 12 wherein said source line is connected to a same electric potential as another source line through a wiring during plating thereof, and the wiring is cut together with the substrate after the plating.

16. The method according to claim 12, wherein the electrode of the terminal portion includes Cu.

17. A method of manufacturing a semiconductor device comprising:

forming at least a semiconductor layer over a substrate;

forming an insulating film over the semiconductor layer;

forming at least a gate electrode, at least one source line, and an electrode of a terminal portion over the insulating film;

introducing an impurity into the semiconductor layer with the gate electrode as a mask to form a first impurity region;

providing a tapered portion to the gate electrode; and introducing an impurity into the semiconductor layer through the tapered portion of the gate electrode to form a second impurity region, wherein the at least one source line comprises a first layer and a second layer on the first layer, the first layer including at least one of Ta, W, Ti, Mo, Al, Cu, Cr, and Nd and the second layer including Cu, and wherein the at least one source line is formed by a printing method.

18. The method according to claim 17 wherein said source line is connected to a same electric potential as another source line through a wiring during plating thereof.

19. The method according to claim 17 wherein said source line is connected to a same electric potential as another source line through a wiring during plating thereof, and the wiring is cut by laser light after the plating.

20. The method according to claim 17, wherein the electrode of the terminal portion comprises a third layer and a fourth layer on the third layer, the third layer including at least one of Ta, W, Ti, Mo, Al, Cu, Cr and Nd, and the fourth layer including Cu.

21. A method of manufacturing a semiconductor device comprising:

forming a gate line over a substrate;

forming an insulating film over the gate line;

forming a source line and an electrode of a terminal portion over the insulating film wherein the source line extends across the gate line and is electrically connected to one of a source and a drain of a thin film transistor; and plating the source line with a material including Cu, wherein the source line is formed by a printing method.

22. The method according to claim 21 wherein said source line is connected to a same electric potential as another source line of a pixel portion through a wiring during the plating thereof.

23. The method according to claim 21 wherein said source line is connected to a same electric potential as another source line of a pixel portion through a wiring during the plating thereof, and the wiring is cut by laser light after the plating.

24. The method according to claim 21 wherein said source line is connected to a same electric potential as another source line through a wiring during plating thereof, and the wiring is cut together with the substrate after the plating.

25. The method according to claim 21 wherein the source line includes at least one of Ta, W, Ti, Mo, Al, Cu, Cr, and Nd.

26. The method according to claim 21, further comprising plating the electrode of the terminal portion with a material including Cu.

* * * * *